United States Patent
Yang et al.

(10) Patent No.: US 12,477,782 B2
(45) Date of Patent: Nov. 18, 2025

(54) THIN FILM TRANSISTOR, METHOD OF MANUFACTURING THE THIN FILM TRANSISTOR, AND DISPLAY APPARATUS INCLUDING THE THIN FILM TRANSISTOR

(71) Applicant: LG Display Co., Ltd., Seoul (KR)

(72) Inventors: JeongSuk Yang, Paju-si (KR); KwangMin Jo, Paju-si (KR); Sohyung Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 18/672,820

(22) Filed: May 23, 2024

(65) Prior Publication Data
US 2024/0313127 A1  Sep. 19, 2024

Related U.S. Application Data

(62) Division of application No. 17/029,889, filed on Sep. 23, 2020, now Pat. No. 12,034,082.

(30) Foreign Application Priority Data

Sep. 24, 2019 (KR) .................. 10-2019-0117409
Dec. 31, 2019 (KR) .................. 10-2019-0179566

(51) Int. Cl.
*H01L 29/786* (2006.01)
*H01L 27/12* (2006.01)
(Continued)

(52) U.S. Cl.
CPC ..... *H10D 30/6757* (2025.01); *H10D 30/0321* (2025.01); *H10D 30/6706* (2025.01);
(Continued)

(58) Field of Classification Search
CPC ............ H10K 59/124; H10K 59/1213; H10D 30/6731; H10D 30/0321; H10D 30/6755;
(Continued)

(56) References Cited

U.S. PATENT DOCUMENTS 6,268,625 B1  7/2001  Lee
7,474,362 B2  1/2009  Park
(Continued)

FOREIGN PATENT DOCUMENTS

CN    104867921 A      8/2015
CN    105321957 A  *   2/2016  ............. G09F 9/301
(Continued)

OTHER PUBLICATIONS

Machine translation, Lee, Chinese Pat. Pub. No. CN-105321957-A, translation date: Jul. 11, 2025, Clarivate Analytics, all pages. (Year: 2025).*

*Primary Examiner* — Victoria K. Hall
(74) *Attorney, Agent, or Firm* — Birch, Stewart, Kolasch & Birch, LLP

(57) ABSTRACT

A display apparatus can include a first thin film transistor including a first active layer including polycrystalline silicon, a first gate electrode overlapping the first active layer with a first gate insulation layer therebetween, and a first source electrode and a first drain electrode connected to the first active layer, a first interlayer insulation layer disposed on the first gate electrode, a second thin film transistor including a second active layer including an oxide semiconductor, a second gate electrode overlapping the second active layer with a second gate insulation layer therebetween, and a second source electrode and a second drain electrode connected to the second active layer, and a second interlayer insulation layer disposed on the first gate electrode, the second gate electrode, and the second gate insulation layer. Also, the second gate insulation layer and the second interlayer insulation layer comprise a dopant for doping the second active layer.

13 Claims, 36 Drawing Sheets

(51) Int. Cl.
  *H01L 29/66* (2006.01)
  *H10D 30/01* (2025.01)
  *H10D 30/67* (2025.01)
  *H10D 86/40* (2025.01)
  *H10D 86/60* (2025.01)
  *H10K 59/121* (2023.01)
  *H10K 59/124* (2023.01)

(52) U.S. Cl.
  CPC ..... *H10D 30/6715* (2025.01); *H10D 30/6755* (2025.01); *H10D 86/423* (2025.01); *H10D 86/60* (2025.01); *H10K 59/1213* (2023.02); *H10K 59/124* (2023.02)

(58) Field of Classification Search
  CPC .. H10D 86/421; H10D 86/423; H10D 86/425; H10D 86/451
  See application file for complete search history.

(56) References Cited

U.S. PATENT DOCUMENTS

| | | | |
|---|---|---|---|
| 8,310,612 B2 | 11/2012 | Cho | |
| 8,692,750 B2 | 4/2014 | Lee | |
| 8,729,613 B2 | 5/2014 | Honda et al. | |
| 9,385,238 B2 | 7/2016 | Yamazaki | |
| 9,412,303 B2 | 8/2016 | Kim et al. | |
| 9,472,682 B2 | 10/2016 | Yamazaki et al. | |
| 10,069,014 B2 | 9/2018 | Yamazaki et al. | |
| 10,236,310 B2 | 3/2019 | Park et al. | |
| 10,361,290 B2 | 7/2019 | Yamazaki et al. | |
| 10,539,844 B2 | 1/2020 | Oh et al. | |
| 10,622,428 B2 | 4/2020 | Oh et al. | |
| 11,171,245 B2 | 11/2021 | Baeck et al. | |
| 12,034,082 B2 * | 7/2024 | Yang | H10D 30/6706 |
| 2002/0068392 A1 | 6/2002 | Les et al. | |
| 2002/0074548 A1 | 6/2002 | Lee et al. | |
| 2002/0137310 A1 | 9/2002 | Joo et al. | |
| 2002/0142528 A1 | 10/2002 | Joo et al. | |
| 2003/0102478 A1 | 6/2003 | Joo et al. | |
| 2007/0069209 A1 | 3/2007 | Jeong et al. | |
| 2007/0243670 A1 | 10/2007 | Chen et al. | |
| 2009/0283763 A1 | 11/2009 | Park et al. | |
| 2011/0058116 A1 | 3/2011 | Yamazaki et al. | |
| 2011/0090207 A1 | 4/2011 | Yamazaki et al. | |
| 2011/0175646 A1 | 7/2011 | Takemura et al. | |
| 2011/0217815 A1 | 9/2011 | Honda et al. | |
| 2015/0041818 A1 | 2/2015 | Tanaka et al. | |
| 2015/0187953 A1 | 7/2015 | Koezuka et al. | |
| 2015/0243720 A1 | 8/2015 | Kwon et al. | |
| 2015/0263141 A1 | 9/2015 | Yamazaki et al. | |
| 2015/0287837 A1 * | 10/2015 | Yamazaki | H10D 30/6706 257/43 |
| 2016/0005873 A1 | 1/2016 | Jintyou et al. | |
| 2016/0365430 A1 | 12/2016 | Zuo et al. | |
| 2017/0084639 A1 | 3/2017 | Kao et al. | |
| 2017/0084642 A1 | 3/2017 | Lin et al. | |
| 2017/0104018 A1 | 4/2017 | Yamazaki et al. | |
| 2017/0200827 A1 | 7/2017 | Oda | |
| 2017/0207253 A1 | 7/2017 | Liu et al. | |
| 2017/0278869 A1 * | 9/2017 | Hiramatsu | H10D 86/441 |
| 2017/0329189 A1 | 11/2017 | Kim et al. | |
| 2018/0012946 A1 * | 1/2018 | Bang | H10D 30/6713 |
| 2018/0076239 A1 * | 3/2018 | Suzumura | H10D 30/673 |
| 2018/0122955 A1 * | 5/2018 | Aichi | H10D 86/0221 |
| 2018/0158954 A1 | 6/2018 | Matsumoto | |
| 2018/0301566 A1 | 10/2018 | Ito | |
| 2018/0366586 A1 * | 12/2018 | Son | H10D 86/60 |
| 2019/0109160 A1 | 4/2019 | Lin et al. | |
| 2019/0189805 A1 | 6/2019 | Jang | |
| 2019/0252418 A1 | 8/2019 | Kao et al. | |
| 2019/0326420 A1 | 10/2019 | Yamazaki et al. | |
| 2020/0006396 A1 | 1/2020 | Sugawara et al. | |
| 2020/0020756 A1 | 1/2020 | Ueda et al. | |
| 2020/0052083 A1 | 2/2020 | Miyamoto | |
| 2020/0185425 A1 | 6/2020 | Hara et al. | |
| 2020/0212221 A1 | 7/2020 | Baeck et al. | |
| 2021/0013238 A1 | 1/2021 | Suzuki et al. | |
| 2021/0336064 A1 | 10/2021 | Gu | |
| 2021/0399106 A1 | 12/2021 | Yamazaki et al. | |
| 2022/0013667 A1 | 1/2022 | Nakada et al. | |
| 2022/0140114 A1 | 5/2022 | Jang et al. | |

FOREIGN PATENT DOCUMENTS

| | | |
|---|---|---|
| CN | 105789217 A | 7/2016 |
| EP | 3 534 208 A1 | 9/2019 |
| KR | 10-2014-0074384 A | 6/2014 |
| KR | 10-2015-0100459 A | 9/2015 |
| KR | 10-2017-0080047 A | 7/2017 |
| KR | 10-2018-0009858 A | 1/2018 |
| KR | 10-2018-0062278 A | 6/2018 |

* cited by examiner

THIN FILM TRANSISTOR, METHOD OF MANUFACTURING THE THIN FILM TRANSISTOR, AND DISPLAY APPARATUS INCLUDING THE THIN FILM TRANSISTOR

CROSS-REFERENCE TO RELATED APPLICATIONS

This application is a Divisional Application of U.S. application Ser. No. 17/029,889, filed on Sep. 23, 2020 (now U.S. Pat. No. 12,034,082 issued on Jul. 9, 2024), which claims the priority benefit of the Korean Patent Application Nos. 10-2019-0117409 filed on Sep. 24, 2019 and 10-2019-0179566 filed on Dec. 31, 2019, where the entire contents of all these applications are hereby expressly incorporated by reference as if fully set forth herein into the present application.

BACKGROUND

Field of the Invention

The present disclosure relates to a thin film transistor, a method of manufacturing the thin film transistor, and a display apparatus including the thin film transistor, and more particularly to a thin film transistor having an excellent switching characteristic based on an offset part thereof, a method of manufacturing the thin film transistor, and a display apparatus including the thin film transistor.

Discussion of the Related Art

Thin film transistors (TFTs) can be manufactured on a glass substrate or a plastic substrate, and thus, are being widely used as switching elements or driving elements of display apparatuses such as liquid crystal display (LCD) apparatuses and organic light emitting display apparatuses.

TFTs can be categorized into amorphous silicon (a-Si) TFTs using amorphous silicon (a-Si) as an active layer, polycrystalline silicon (poly-Si) TFTs using polycrystalline silicon (poly-Si) as an active layer, and oxide semiconductor TFTs using an oxide semiconductor as an active layer, based on a material of each active layer.

An active layer can be formed by depositing amorphous silicon for a short time, and thus, the a-Si TFTs are short in manufacturing process time thereof and are low in manufacturing cost thereof. On the other hand, since the driving performance of a current is reduced due to low mobility and the shift of a threshold voltage occurs, there is a limitation in applying the a-Si TFTs to active matrix organic light emitting diodes (AMOLEDs) and the like.

The poly-Si TFTs are manufactured by depositing and crystallizing a-Si. The poly-Si TFTs have high electron mobility, good stability, a thin thickness, and high power efficiency, and moreover, can realize a high resolution. Examples of the poly-Si TFTs include low temperature polysilicon (LTPS) TFTs and polysilicon TFTs. However, since a process of manufacturing the poly-Si TFTs needs a process of crystallizing a-Si, the number of manufacturing processes increase to cause an increase in the manufacturing cost, and a-Si needs to be crystallized at a high process temperature. Therefore, it can be difficult to apply the poly-Si TFTs to large-area display apparatuses. Also, due to a polycrystalline characteristic, it can be difficult to secure the uniformity of the poly-Si TFTs.

The oxide semiconductor TFTs have high mobility and are large in resistance variation based on a content of oxygen, and thus, can easily obtain desired physical properties. Also, in a process of manufacturing the oxide semiconductor TFTs, oxide included in an active layer can be formed at a relatively low temperature, and thus, the manufacturing cost is low. In terms of a characteristic of oxide, an oxide semiconductor is transparent, and thus, is easy to implement a transparent display apparatus. However, the stability and electron mobility of the oxide semiconductor TFTs are lower than those of the poly-Si TFTs.

The oxide semiconductor TFTs can be manufactured in a back channel etch (BCE) structure or an etch stopper (ES) structure, which is a bottom gate type, or can be manufactured in a coplanar structure which is a top gate type. In oxide semiconductor TFTs having the coplanar structure, it is very significant to control a conductivity-providing region formed from an oxide semiconductor, and the mobility of the oxide semiconductor TFTs can vary based on a sheet resistance of the conductivity-providing region. Therefore, it is required to manage a process condition for forming the conductivity-providing region, and it is needed to minimize an influence of insulation layers, disposed on or under an oxide semiconductor layer, on the conductivity-providing region.

SUMMARY OF THE DISCLOSURE

Accordingly, the present disclosure is directed to providing a thin film transistor, a method of manufacturing the thin film transistor, and a display apparatus including the thin film transistor that substantially obviate one or more problems due to limitations and disadvantages of the related art.

An aspect of the present disclosure is directed to providing a thin film transistor which includes a conductivity-providing part formed through doping without patterning a gate insulation layer.

Another aspect of the present disclosure is directed to providing a thin film transistor which, by using an active layer including an offset part, secures the electrical stability of a channel part and a conductivity-providing part and minimizes an influence of an insulation layer on the active layer.

Another aspect of the present disclosure is directed to providing a thin film transistor which secures an effective channel width on the basis of an offset part.

Another aspect of the present disclosure is directed to providing technology for adjusting a size of a photoresist pattern to form an offset part between a conductivity-providing part and a channel part of a semiconductor layer.

Another aspect of the present disclosure is directed to providing a display apparatus including the thin film transistor.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a thin film transistor including an active layer on a substrate, a gate electrode disposed apart from the active layer to at least partially overlap the active layer, and a gate insulation layer between the active layer and the gate electrode. The gate insulation layer can cover a whole (e.g., entire) top surface of the active layer facing the gate electrode, the active layer can include a channel part overlapping the gate electrode, a conductivity-providing part which does not overlap the gate electrode, and an offset part between the channel part and the conductivity-providing part. The offset part may not overlap the gate electrode, and the conductivity-providing part can be doped with a dopant.

In another aspect of the present disclosure, there is provided a thin film transistor substrate including a base substrate and a first thin film transistor and a second thin film transistor on the base substrate. The first thin film transistor can include a first active layer on the base substrate and a first gate electrode disposed apart from the first active layer to at least partially overlap the first active layer The second thin film transistor can include a second active layer on the base substrate, a gate electrode disposed apart from the second active layer to at least partially overlap the second active layer, and a gate insulation layer between the second active layer and the second gate electrode. The gate insulation layer can cover a whole (e.g., entire) top surface of the second active layer facing the second gate electrode. In addition, the second active layer can include a channel part overlapping the second gate electrode, a conductivity-providing part which does not overlap the second gate electrode, and an offset part between the channel part and the conductivity-providing part. The offset part does not overlap the second gate electrode, the conductivity-providing part is doped with a dopant, and the first active layer and the second active layer can be disposed on different layers.

In another aspect of the present disclosure, there is provided a method of manufacturing a thin film transistor, the method including forming an active layer on a substrate, forming a gate insulation layer on the active layer, forming a gate electrode on the gate insulation layer to at least partially overlap the active layer, and doping a dopant on the active layer. The gate insulation layer can cover a whole (e.g., entire) top surface of the active layer facing the gate electrode. The forming of the gate electrode can include forming a gate-electrode material layer on the gate insulation layer, forming a photoresist pattern on the gate-electrode material layer, and etching the gate-electrode material layer by using the photoresist pattern as a mask. An area of the photoresist pattern can be greater than an area of the gate electrode, the gate electrode is disposed in a region defined by the photoresist pattern in a plan view. Accordingly, the doping of the dopant on the active layer can use the photoresist pattern as a mask.

In another aspect of the present disclosure, there is provided a display apparatus including a substrate, a pixel driving circuit on the substrate, and a light emitting device connected to the pixel driving circuit. The pixel driving circuit can include a thin film transistor, the thin film transistor can include an active layer on the substrate, a gate electrode disposed apart from the active layer to at least partially overlap the active layer, and a gate insulation layer between the active layer and the gate electrode. The gate insulation layer can cover a whole (e.g., entire) top surface of the active layer facing the gate electrode. The active layer can include a channel part overlapping the gate electrode, a conductivity-providing part which does not overlap the gate electrode, and an offset part between the channel part and the conductivity-providing part. The offset part may not overlap the gate electrode, and the conductivity-providing part can be doped with a dopant.

In another aspect of the present disclosure, there is provided a display apparatus including a first thin film transistor including a first active layer including polycrystalline silicon, a first gate electrode overlapping the first active layer with a first gate insulation layer therebetween, and a first source electrode and a first drain electrode each connected to the first active layer, a first interlayer insulation layer disposed on the first gate electrode, a second thin film transistor including a second active layer including an oxide semiconductor, a second gate electrode overlapping the second active layer with a second gate insulation layer therebetween, and a second source electrode and a second drain electrode each connected to the second active layer, and a second interlayer insulation layer disposed on the first gate electrode, the second gate electrode, and the second gate insulation layer. The second gate insulation layer and the second interlayer insulation layer can include a dopant for doping the second active layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
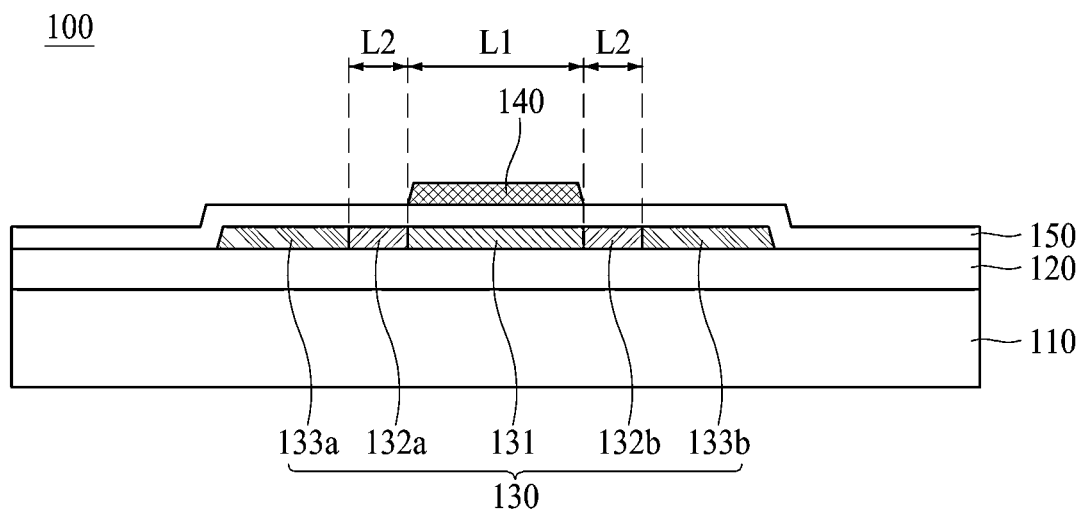
FIG. 1 is a cross-sectional view of a thin film transistor (TFT) according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

Spatially relative terms "below", "beneath", "lower", "above", and "upper" can be used herein for easily describing a relationship between one device or elements and other devices or elements as illustrated in the drawings. It should be understood that spatially relative terms are intended to encompass different orientations of the device in addition to the orientation depicted in the drawings. For example, if a device in the drawings is turned over, elements described as being on the "below" or "beneath" sides of other elements can be placed on "above" sides of the other elements. The exemplary term "lower" can encompass both orientations of "lower" and "upper". Likewise, the exemplary term "above" or "upper" can encompass both orientations of above and below.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Reference will now be made in detail to the exemplary embodiments of the present disclosure, examples of which are illustrated in the accompanying drawings. Wherever possible, the same reference numbers will be used throughout the drawings to refer to the same or like parts.

In embodiments of the present disclosure, for convenience of description, a source electrode and a drain electrode can be differentiated from each other, and the source electrode and the drain electrode can be used as the same meaning. The source electrode can be the drain electrode, and the drain electrode can be the source electrode. Also, a source electrode in an embodiment can be a drain electrode in another embodiment, and a drain electrode in an embodiment can be a source electrode in another embodiment.

In some embodiments of the present disclosure, for convenience of description, a source region and a source electrode can be differentiated from each other and a drain region and a drain electrode can be differentiated from each other, but embodiments of the present disclosure are not limited thereto. A source region can be a source electrode, and a drain region can be a drain electrode. Also, a source region can be a drain electrode, and a drain region can be a source electrode.

FIG. 1 is a cross-sectional view of a thin film transistor (TFT) 100 according to an embodiment of the present disclosure.

The TFT 100 according to an embodiment of the present disclosure can include an active layer 130 on a substrate 110, a gate electrode 140 disposed apart from the active layer 130 to at least partially overlap the active layer 130, and a gate insulation layer 150 between the active layer 130 and the gate electrode 140. The gate insulation layer 150 can cover a whole top surface of the active layer 130 facing the gate electrode 140.

The active layer 130 can include a channel part 131 overlapping the gate electrode 140, a plurality of conductivity-providing parts 133a and 133b which do not overlap the gate electrode 140, and a plurality of offset parts (for example, first and second offset parts) 132a and 132b between the channel part 131 and the conductivity-providing parts 133a and 133b. According to an embodiment of the present disclosure, the offset parts 132a and 132b may not overlap the gate electrode 140, and the conductivity-providing parts 133a and 133b can be doped with a dopant.

Hereinafter, the TFT 100 according to an embodiment of the present disclosure will be described in more detail with reference to FIG. 1.

Referring to FIG. 1, the active layer 130 can be disposed on the substrate 110.

The substrate 110 can use glass or plastic. The plastic can use transparent plastic (for example, polyimide) having a flexible characteristic. In a case where polyimide is used as the substrate 110, heat-resistant polyimide for enduring a high temperature can be used based on that a high temperature deposition process is performed on the substrate 110.

A buffer layer 120 can be disposed on the substrate 110. The buffer layer 120 can include at least one of silicon oxide and silicon nitride. The buffer layer 120 can protect the active layer 130 and can have a planarization characteristic to planarize an upper portion of the substrate 110. The buffer layer 120 can be omitted.

According to an embodiment of the present disclosure, the active layer 130 can include an oxide semiconductor material. The active layer 130 can be an oxide semiconductor layer.

The active layer 130 can include, for example, at least one of oxide semiconductor materials such as IZO (InZnO), IGO (InGaO), ITO (InSnO), IGZO (InGaZnO), IGZTO (InGaZnSnO), ITZO (InSnZnO), IGTO (InGaSnO), GO (GaO), GZTO (GaZnSnO), and GZO (GaZnO). However, an embodiment of the present disclosure is not limited thereto, and the active layer 130 can include another oxide semiconductor material.

The active layer 130 can include the channel part 131 and the conductivity-providing parts 133a and 133b. Also, the active layer 130 can include the offset parts 132a and 132b disposed between the channel part 131 and the conductivity-providing parts 133a and 133b.

The gate insulation layer 150 can be disposed on the active layer 130. The gate insulation layer 150 can have insulating properties and can include at least one of silicon oxide, silicon nitride, and metal-based oxide. The gate insulation layer 150 can have a single-layer structure, or can have a multi-layer structure.

The gate insulation layer 150 can cover the whole top surface of the active layer 130. In FIG. 1, a surface disposed in a direction toward the gate electrode 140 among surfaces of the active layer 130 can be referred to as a top surface.

According to an embodiment of the present disclosure, as illustrated in FIG. 1, the gate insulation layer 150 may not be patterned and can be formed to cover a whole surface of the substrate 110 including the active layer 130.

However, an embodiment of the present disclosure is not limited thereto, and a contact hole can be formed in the gate insulation layer 150. In a case where the contact hole is formed in the gate insulation layer 150, a portion of the active layer 130 can be exposed from the gate insulation layer 150 by the contact hole. An embodiment of the present disclosure, the gate insulation layer 150 can cover the whole top surface of the active layer 130 except a contact hole region. Also, an embodiment of the present disclosure, the gate insulation layer 150 can cover the whole top surface of the active layer 130 except a region, contacting a conductive element, of the active layer 130. Here, the conductive element can denote elements which contact or are connected to the active layer 130 and include a conductive material, and the conductive element can include a wiring line, an electrode, a pad, a terminal, etc. For example, the conductive element can include a source electrode 161 and a drain electrode 162 (see FIG. 2) each connected to the active layer 130.

An embodiment of the present disclosure, the gate insulation layer 150 can be disposed to cover at least top surfaces of the channel part 131 and the offset parts 132a and 132b of the active layer 130.

An embodiment of the present disclosure, a portion of the active layer 130 can have conductivity on the basis of a doping process using a dopant, and in this case, the dopant can pass through the gate insulation layer 150 and can be doped on the active layer 130. Therefore, the active layer 130 can be doped even without being exposed from the gate insulation layer 150. Accordingly, an embodiment of the present disclosure, the gate insulation layer 150 may not be patterned.

The gate electrode 140 can be disposed on the gate insulation layer 150. The gate electrode 140 can include at least one of aluminum (Al)-based metal such as Al or an Al alloy, silver (Ag)-based metal such as Ag or a Ag alloy, copper (Cu)-based metal such as Cu or a Cu alloy, molybdenum (Mo)-based metal such as Mo or a Mo alloy, chromium (Cr), tantalum (Ta), neodymium (Nd), and titanium (Ti). The gate electrode 140 can have a multi-layer structure including at least two conductive layers having different properties.

The gate electrode 140 can overlap the channel part 131 of the active layer 130. A portion of the active layer 130 overlapping the gate electrode 140 can be the channel part 131.

The conductivity-providing parts 133a and 133b may not overlap the gate electrode 140. One of the conductivity-providing parts 133a and 133b can be a source region 133a, and the other can be a drain region 133b. Depending on the case, the source region 133a can act as a source electrode, and the drain region 133b can act as a drain electrode. The conductivity-providing parts 133a and 133b can each act as a wiring line.

According to an embodiment of the present disclosure, the conductivity-providing parts 133a and 133b can be formed by selectively providing conductivity to the active layer 130. For example, the conductivity-providing parts 133a and 133b can be formed by a doping process using a dopant. According to an embodiment of the present disclosure, the conductivity-providing parts 133a and 133b can be in a state which is doped with the dopant.

The dopant can include at least one of boron (B), phosphorous (P), fluorine (F), and hydrogen (H). At least one of a boron (B) ion, a phosphorous (P) ion, and a fluorine (F) ion can be used for doping. A hydrogen (H) ion can be used for doping.

The conductivity-providing parts 133a and 133b can have a dopant concentration which is higher than that of the channel part 131 and can have resistivity which is lower than that of the channel part 131. The conductivity-providing parts 133a and 133b can have electrical conductivity which is higher than that of each of the offset parts 132a and 132b and can have electrical conductivity similar to that of a conductor.

According to an embodiment of the present disclosure, the offset parts 132a and 132b can be disposed between the channel part and the conductivity-providing parts 133a and 133b and may not overlap the gate electrode 140.

Although dopants are not directly implanted into the offset parts 132a and 132b in a process of manufacturing the TFT 100 (see FIG. 7), the dopants can be diffused to the offset parts 132a and 132b in a process of implanting the dopants into the conductivity-providing parts 133a and 133b. Accordingly, some dopants can be doped on the offset parts 132a and 132b.

According to an embodiment of the present disclosure, a resistivity of each of the offset parts 132a and 132b can be lower than that of the channel part 131 and can be higher than that of each of the conductivity-providing parts 133a and 133b. The offset parts 132a and 132b having such a resistivity characteristic can perform a buffering function between the conductivity-providing parts 133a and 133b and the channel part 131.

In a case where the channel part 131 is directly connected to the conductivity-providing parts 133a and 133b, when the TFT 100 is in a turn-off (OFF) state, a leakage current can occur. On the other hand, when the offset parts 132a and 132b having a resistivity greater than that of each of the conductivity-providing parts 133a and 133b are disposed between the conductivity-providing parts 133a and 133b and the channel part 131, the occurrence of a leakage current between the channel part 131 and the conductivity-providing parts 133a and 133b can be prevented in a state where the TFT 100 is turned off.

As described above, when the offset parts 132a and 132b are disposed between the conductivity-providing parts 133a and 133b and the channel part 131, the electrical stability of the channel part 131 and the conductivity-providing parts 133a and 133b can be enhanced.

Even when the TFT 100 is turned on based on a gate voltage applied to the gate electrode 140, the conductivity of the offset parts 132a and 132b which are not largely affected by an electric field generated in the gate electrode 140 may not increase. Therefore, when the TFT 100 is turned on, the resistivity of the offset parts 132a and 132b can be higher than that of the channel part 131 and that of each of the conductivity-providing parts 133a and 133b. Accordingly, a shift of a threshold voltage of the TFT 100 can be prevented or reduced by the offset parts 132a and 132b.

According to an embodiment of the present disclosure, a width L2 of each of the offset parts 132a and 132b can be set to a range which prevents a leakage current of the TFT 100 and a shift of the threshold voltage of the TFT 100 without hindering driving of the TFT 100.

According to an embodiment of the present disclosure, a width of the first offset part 132a can be the same as or different from that of the second offset part 132b. In an embodiment of the present disclosure, for convenience, a width of the first offset part 132a and a width of the first offset part 132a may not be differentiated from each other and can each be referred to as L2.

According to an embodiment of the present disclosure, when a width of the channel part 131 is L1 and a width of each of the offset parts 132a and 132b is L2, the TFT 100 can satisfy the following Equation 1.

$$L1 \times L2 \times 1/\eta 1 \geq 1 \quad \text{[Equation 1]}$$

where $\eta 1 = 0.5 \ \mu m^2$

When the width L1 of the channel part 131 and the width L2 of each of the offset parts 132a and 132b satisfy Equation 1, the offset parts 132a and 132b can prevent a leakage current of the TFT 100 and a shift of the threshold voltage of the TFT 100 without hindering driving of the TFT 100.

According to another embodiment of the present disclosure, in Equation 1, $\eta 1 = 1.5 \ \mu m^2$. Alternatively, $\eta 1$ can satisfy a relationship of "$0.5 \ \mu m^2 \leq \eta 1 \leq 1.5 \ \mu m^2$".

According to an embodiment of the present disclosure, the width L2 of each of the offset parts 132a and 132b can be 0.25 µm or more. When the width L2 of each of the offset parts 132a and 132b is less than 0.3 µm, an effect of preventing the leakage current of the TFT 100 and an effect of preventing the shift of the threshold voltage of the TFT 100 may not be sufficient. According to another embodiment of the present disclosure, the width L2 of each of the offset parts 132a and 132b can be 0.3 µm or more. In more detail, the width L2 of each of the offset parts 132a and 132b can be 0.5 µm or more.

According to an embodiment of the present disclosure, the width L2 of each of the offset parts 132a and 132b can be maintained to be 2.5 µm. When the width L2 of each of the offset parts 132a and 132b is more than 2.5 µm, a driving characteristic of the TFT 100 can be reduced, and it can be unfavorable to miniaturize each TFT.

According to an embodiment of the present disclosure, the offset parts 132a and 132b can be disposed between the channel part 131 and the conductivity-providing parts 133a and 133b, and thus, even when the width L1 of the channel part 131 is narrow, the channel part 131 can effectively act as a channel. Accordingly, the TFT 100 can be miniaturized.

According to an embodiment of the present disclosure, the width L1 of the channel part 131 can be 2 µm or more. According to an embodiment of the present disclosure, the offset parts 132a and 132b can be disposed between the channel part 131 and the conductivity-providing parts 133a and 133b, and thus, even when the width L1 of the channel part 131 is about 2 µm, the TFT 100 can effectively perform a switching function. For example, the channel part 131 can have a width of 2 µm to 20 µm. Alternatively, the channel part 131 can have a width of 2 µm to 40 µm.

Moreover, according to an embodiment of the present disclosure, the width L1 of the channel part 131 can be 3 µm or more, and for example, can be 4 µm or more. For example, the channel part 131 can have a width of 3 µm to 20 µm, have a width of 3 µm to 10 µm, have a width of 3 µm to 8 µm, or have a width of 4 µm to 6 µm.

According to an embodiment of the present disclosure, the buffer layer 120 can be disposed between the substrate 110 and the active layer 130, and a dopant can be doped on the buffer layer 120.

A dopant concentration of each of the conductivity-providing parts 133a and 133b, a dopant concentration of the gate insulation layer 150, and a dopant concentration of the buffer layer 120 can be adjusted by adjusting an acceleration voltage applied to the dopant in a doping process.

The acceleration voltage applied to the dopant can increase to sufficiently dope a dopant on the conductivity-providing parts 133a and 133b. In this case, the dopant can pass through the conductivity-providing parts 133a and 133b and can be doped on the buffer layer 120. When a concentration of the dopant doped on the buffer layer 120 increases, the dopant concentration of the buffer layer 120 can be higher than that of each of the conductivity-providing parts 133a and 133b.

Figure 2:
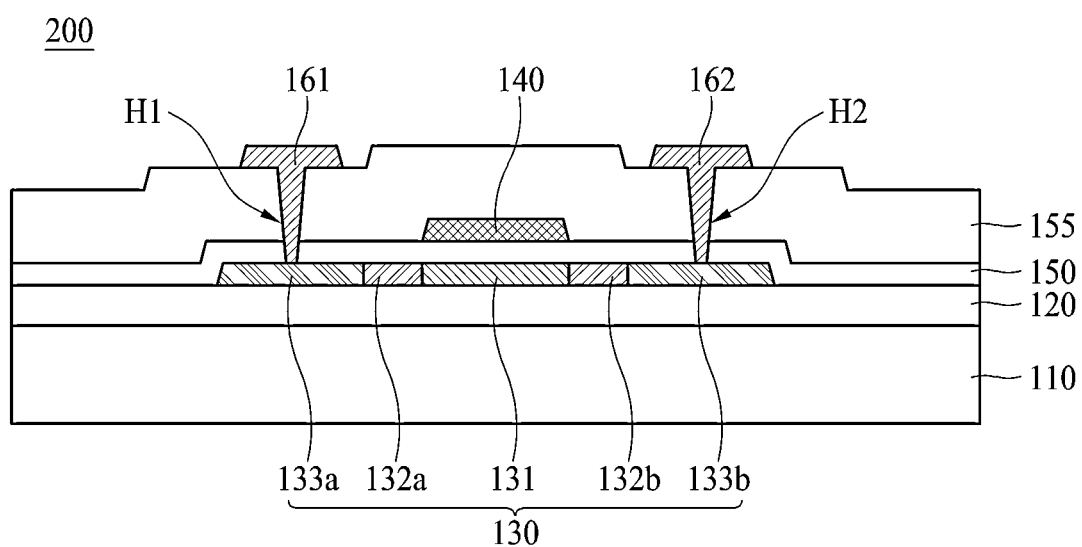
FIG. 2 is a cross-sectional view of a TFT according to another embodiment of the present disclosure.

FIG. 2 is a cross-sectional view of a TFT 200 according to another embodiment of the present disclosure.

Comparing with the TFT 100 illustrated in FIG. 1, the TFT 200 illustrated in FIG. 2 can further include an interlayer insulation layer 155, a source electrode 161, and a drain electrode 162.

The interlayer insulation layer 155 can be disposed on the gate electrode 140 and the gate insulation layer 150 and can include an insulating material.

The source electrode 161 and the drain electrode 162 can be disposed on the interlayer insulation layer 155. The source electrode 161 and the drain electrode 162 can be apart from each other and can be connected to the active layer 130.

Referring to FIG. 2, the source electrode 161 can be connected to a first conductivity-providing part 133a through a contact hole H1, and the drain electrode 162 can be connected to a second conductivity-providing part 133b through a contact hole H2. The first conductivity-providing part 133a connected to the source electrode 161 can be referred to as a source connection part, and the second conductivity-providing part 133b connected to the drain electrode 162 can be referred to as a drain connection part.

Referring to FIG. 2, the contact holes H1 and H2 can pass through the interlayer insulation layer 155 and the gate insulation layer 150. A portion of the active layer 130 can be exposed from the gate insulation layer 150 by the contact holes H1 and H2. For example, a portion of the first conductivity-providing part 133a and a portion of the second conductivity-providing part 133b can be exposed from the gate insulation layer 150 by the contact holes H1 and H2.

Figure 3:
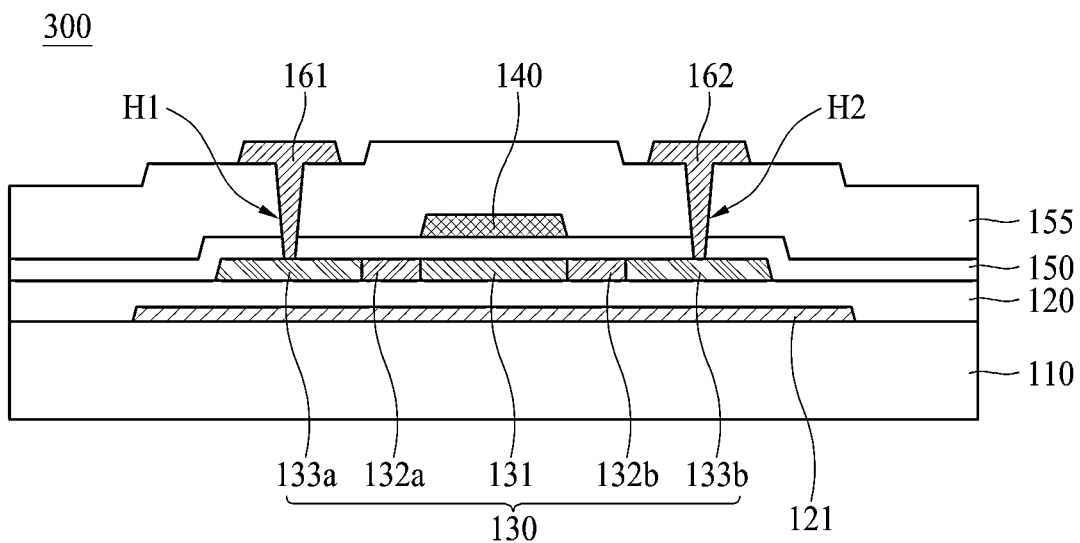
FIG. 3 is a cross-sectional view of a TFT according to another embodiment of the present disclosure.

FIG. 3 is a cross-sectional view of a TFT 300 according to another embodiment of the present disclosure.

Referring to FIG. 3, the TFT 300 according to another embodiment of the present disclosure can include a light blocking layer 121 disposed on a substrate 110. The light blocking layer 121 can be disposed to overlap an active layer 130 and can block light incident on the substrate 110, thereby protecting the active layer 130. For example, the light blocking layer 121 can be disposed to overlap the channel part 131 of the active layer 130.

Figure 4:
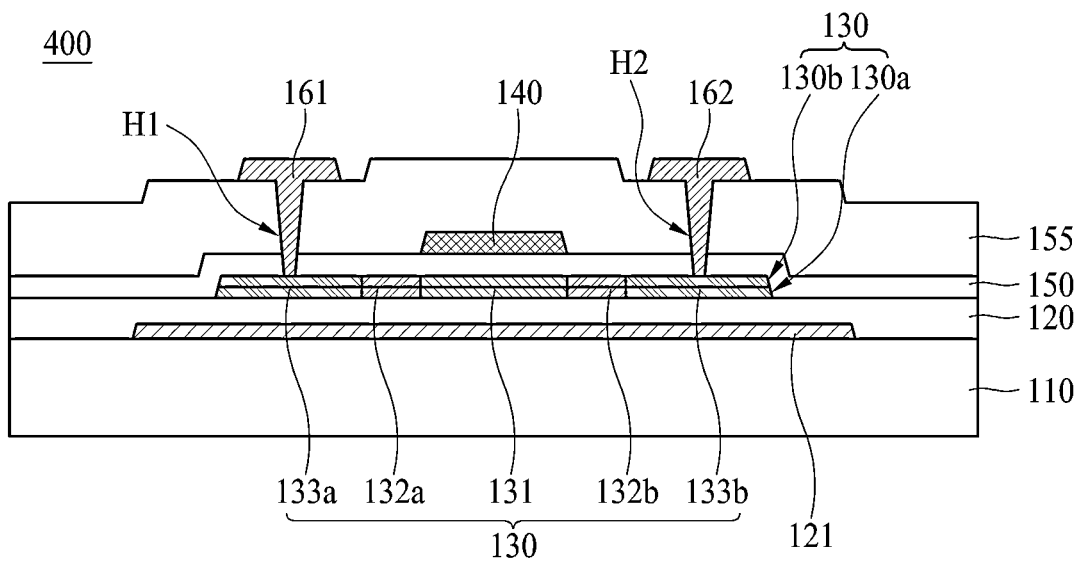
FIG. 4 is a cross-sectional view of a TFT according to another embodiment of the present disclosure.

FIG. 4 is a cross-sectional view of a TFT 400 according to another embodiment of the present disclosure.

Referring to FIG. 4, an active layer 130 can have a multi-layer structure. The active layer 130 of the TFT 400 according to the embodiment of FIG. 4 can include a first oxide semiconductor layer 130a on a substrate 110 and a second oxide semiconductor layer 130b on the first oxide semiconductor layer 130a. Each of the first oxide semiconductor layer 130a and the second oxide semiconductor layer 130b can include an oxide semiconductor material. The first oxide semiconductor layer 130a and the second oxide semiconductor layer 130b can include the same oxide semiconductor material or can include different oxide semiconductor materials.

The first oxide semiconductor layer 130a can support the second oxide semiconductor layer 130b. Therefore, the first oxide semiconductor layer 130a can be referred to as a supporting layer. A main channel can be formed on the second oxide semiconductor layer 130b. Accordingly, the second oxide semiconductor layer 130b can be referred to as a channel layer. However, an embodiment of the present disclosure is not limited thereto, and a channel can be formed in the first oxide semiconductor layer 130a.

As illustrated in FIG. 4, a structure of a semiconductor layer including the first oxide semiconductor layer 130a and the second oxide semiconductor layer 130b can be referred to as a bi-layer structure.

The first oxide semiconductor layer 130a acting as a supporting layer can have good film stability and mechanical characteristic. The first oxide semiconductor layer 130a can include gallium (Ga), for film stability. Ga can form stable bonding with oxygen, and Ga oxide can have good film stability.

The first oxide semiconductor layer 130a can include, for example, at least one of oxide semiconductor materials such as IGZO (InGaZnO), IGO (InGaO), IGTO (InGaSnO), IGZTO (InGaZnSnO), GZTO (GaZnSnO), GZO (GaZnO), and GO(GaO).

The second oxide semiconductor layer 130b acting as a channel layer can include, for example, at least one of oxide semiconductor materials such as IZO (InZnO), IGO (InGaO), ITO (InSnO), IGZO (InGaZnO), IGZTO (InGaZnSnO), GZTO (GaZnSnO), and ITZO (InSnZnO). However, another embodiment of the present disclosure is not limited thereto, and the second oxide semiconductor layer 130b can include another oxide semiconductor material.

Figure 5:
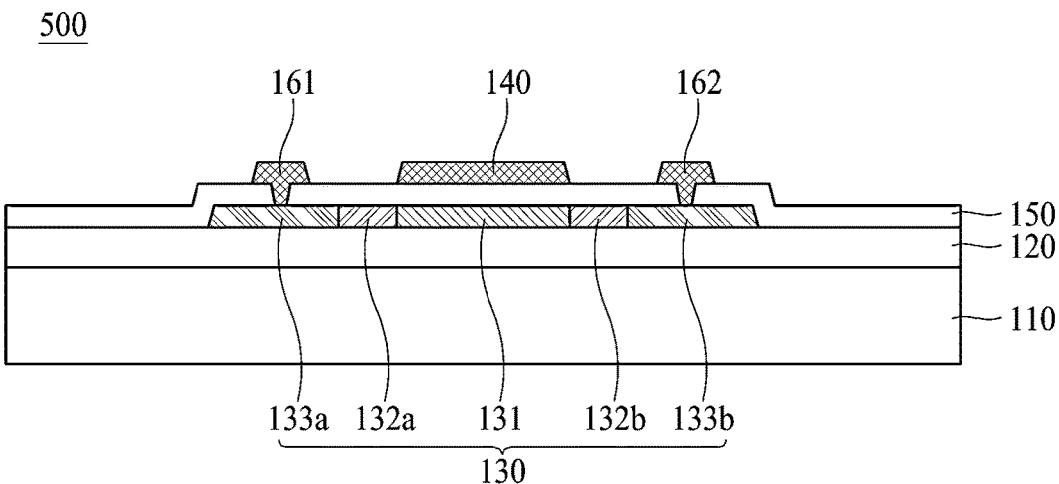
FIG. 5 is a cross-sectional view of a TFT according to another embodiment of the present disclosure.

FIG. 5 is a cross-sectional view of a TFT 500 according to another embodiment of the present disclosure.

The TFT 500 according to another embodiment of the present disclosure can include an active layer 130 on a substrate 110, a gate electrode 140 disposed apart from the active layer 130 to overlap the active layer 130 in at least a portion thereof, a gate insulation layer 150 between the active layer 130 and the gate electrode 140, a source electrode 161 on the gate insulation layer 150, and a drain electrode 162 disposed apart the source electrode 161 on the gate insulation layer 150.

Referring to FIG. 5, the gate insulation layer 150 can cover a whole top surface of the active layer 130. The source electrode 161 and the drain electrode 162 can be formed on the gate insulation layer 150. In this case, the source electrode 161 and the drain electrode 162 can be disposed on the same layer as the gate electrode 140 and can include the same material as that of the gate electrode 140. Each of the source electrode 161 and the drain electrode 162 can be connected to the active layer 130 by a contact hole which is formed in the gate insulation layer 150.

Figure 6:
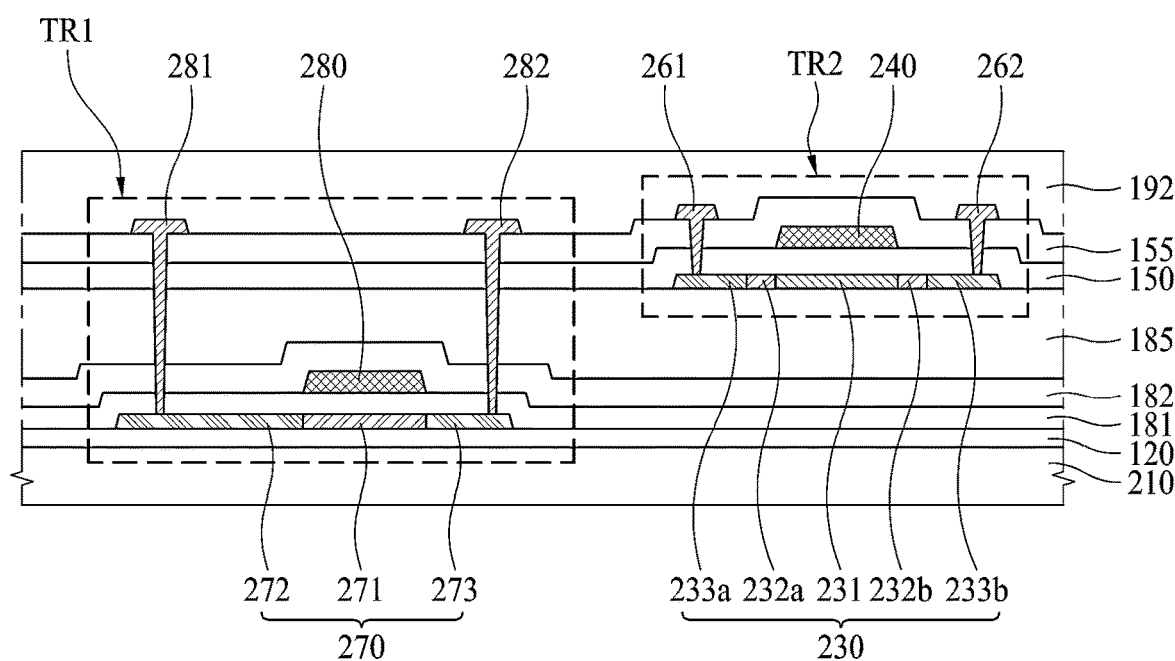
FIG. 6 is a cross-sectional view of a TFT substrate according to another embodiment of the present disclosure.

FIG. 6 is a cross-sectional view of a TFT substrate 600 according to another embodiment of the present disclosure.

The TFT substrate 600 according to another embodiment of the present disclosure can include a base substrate 210, a first TFT TR1 on the base substrate 210, and a second TFT TR2 on the base substrate 210.

The first TFT TR1 can include a first active layer 270 on the base substrate 210 and a first gate electrode 280 which is disposed apart from the first active layer 270 to at least partially overlap the first active layer 270. Also, the first TFT TR1 can include a gate insulation layer 181 between the first active layer 270 and the first gate electrode 280.

The gate insulation layer 181 between the first active layer 270 and the first gate electrode 280 can be referred to as a first gate insulation layer.

The first TFT TR1 can further include a first source electrode 281 and a first drain electrode 282. The first source electrode 281 and the first drain electrode 282 can be disposed apart from each other and can be connected to the first active layer 270.

According to another embodiment of the present disclosure, the first active layer 270 can be formed of a silicon semiconductor layer and can include a channel part 271 and a plurality of conductivity-providing parts 272 and 273.

The second TFT TR2 can include a second active layer 230 on the base substrate 210 and a second gate electrode 240 which is disposed apart from the second active layer 230 to at least partially overlap the second active layer 230. The second active layer 230 can be an oxide semiconductor layer.

In the TFT substrate 600 according to another embodiment of the present disclosure, the second TFT TR2 can have the same configuration as that of each of the TFTs 100 to 500 respectively illustrated in FIGS. 1 to 5.

In the TFT substrate 600 according to another embodiment of the present disclosure, the first active layer 270 and the second active layer 230 can be disposed on different layers. Referring to FIG. 6, the first active layer 270 can be disposed closer to the base substrate 210 than the second active layer 230. However, another embodiment of the present disclosure is not limited thereto, and the second active layer 230 can be disposed closer to the base substrate 210 than the first active layer 270. Also, the first active layer 270 can be formed of an oxide semiconductor layer, and the second active layer 230 can be formed of a silicon semiconductor layer.

Referring to FIG. 6, a passivation layer 182 can be disposed on the first gate electrode 280, and a middle layer 185 can be disposed on the passivation layer 182.

Referring to FIG. 6, the second active layer 230 of the second TFT TR2 can be disposed on the middle layer 185. The middle layer 185 can be a single layer which is a nitride silicon layer or an oxide silicon layer. Alternatively, the middle layer 185 can be formed of a multilayer where a nitride silicon layer and an oxide silicon layer are stacked.

The gate insulation layer 150 can be disposed on the second active layer 230, and the second gate electrode 240 can be disposed on the gate insulation layer 150. The gate insulation layer 150 between the second active layer 230 and the second gate electrode 240 can be referred to as a second gate insulation layer.

The gate insulation layer 150 can cover a whole top surface of the first active layer 230 facing the second gate electrode 240. The gate insulation layer 150 can be disposed on, for example, a whole surface of the base substrate 210 including the second active layer 230.

The second active layer 230 can include a channel part 231, a plurality of conductivity-providing parts 233a and 233b, and a plurality of offset parts 232a and 232b between the channel part 231 and the conductivity-providing parts 233a and 233b.

The channel part 231 of the second active layer 230 can overlap the second gate electrode 240. The conductivity-providing parts 233a and 233b of the active layer 230 may not overlap the second gate electrode 240. The offset parts 232a and 232b may not overlap the second gate electrode 240.

The conductivity-providing parts 233a and 233b can be doped with a dopant.

The second TFT TR2 can include a second source electrode 261 and a second drain electrode 262 on an interlayer insulation layer 155. The interlayer insulation layer 155 can be disposed on the second gate electrode 240 and the gate insulation layer 150 and can include an insulating material. The second source electrode 261 and the second drain electrode 262 can be disposed apart from each other on the interlayer insulation layer 155 and can be connected to the second active layer 230. A planarization layer 192 can be disposed on the first source electrode 281, the first drain electrode 282, the second source electrode 261, and the second drain electrode 262, and the interlayer insulation layer 155.

In FIG. 6, a configuration where the first source electrode 281, the first drain electrode 282, the second source electrode 261, and the second drain electrode 262 is illustrated. However, another embodiment of the present disclosure is not limited thereto. For example, the first drain electrode 282, the second source electrode 261, and the second drain electrode 262 can be respectively disposed on different layers.

Moreover, positions of the first gate electrode 280 and the second gate electrode 240 are not limited by FIG. 6. When the first active layer 270 and the second active layer 230 are disposed on different layers, the first gate electrode 280 and the second gate electrode 240 can be disposed at positions which differ from positions of FIG. 6.

Figure 7:
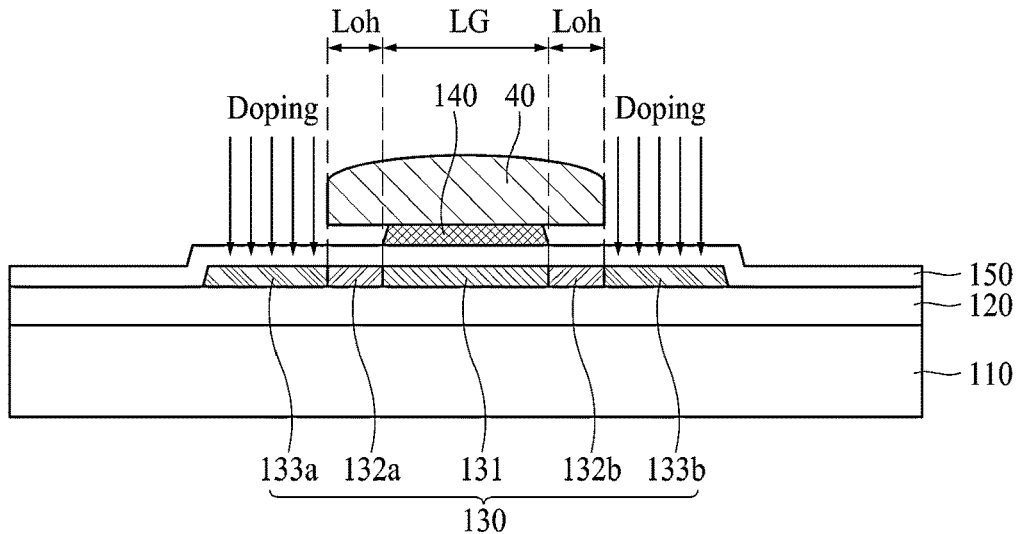
FIG. 7 is a diagram describing a doping method according to an embodiment of the present disclosure.

FIG. 7 is a diagram describing a doping method according to an embodiment of the present disclosure.

According to an embodiment of the present disclosure, a plurality of conductivity-providing parts 133a and 133b can be formed by selectively providing conductivity to an active layer 130 through doping.

A dopant can be used for doping. The dopant can include at least one of boron (B), phosphorous (P), fluorine (F), and hydrogen (H). For example, at least one of boron (B), phosphorous (P), and fluorine (F) can be used as the dopant, or a hydrogen (H) can be used as the dopant. The dopant can be doped in an ion state.

According to an embodiment of the present disclosure, doping may not be performed on a channel part 131 of the active layer 130. In order to prevent the channel part 131 from being doped, the dopant may not be implanted into the channel part 131 by protecting or masking the channel part 131 against the dopant in a doping process.

As illustrated in FIG. 7, in the doping process, a photoresist pattern 40 remaining on a gate electrode 140 can act as a mask for protecting the channel part 131.

Referring to FIG. 7, with respect to a cross-sectional view, the photoresist pattern 40 can have a width which is greater than that of the gate electrode 140. With respect to the cross-sectional view, the gate electrode 140 can wholly overlap the photoresist pattern 40.

With respect to a plan view, the photoresist pattern 40 can have an area which is greater than that of the gate electrode 140. For example, the gate electrode 140 can be disposed in a region defined by the photoresist pattern 40 with respect to a plane.

According to an embodiment of the present disclosure, a gate-electrode material layer for gate electrode can be formed on the gate insulation layer 150, a photoresist material can be coated on the gate-electrode material layer, and the photoresist pattern 40 can be formed by exposing and developing a photoresist material.

Subsequently, the gate electrode 140 can be formed by etching the gate-electrode material layer by using the photoresist pattern 40 as a mask. At this time, the gate-electrode material layer can be etched up to an inner portion with respect to an edge of the photoresist pattern 40, thereby forming the gate electrode 140 having an area which is less than that of the photoresist pattern 40.

As illustrated in FIG. 7, a region, which does not overlap the photoresist pattern 40, of the active layer 130 can be doped with a dopant by a doping process which uses, as a mask, the photoresist pattern 40 on the gate electrode 140. As a result, a plurality of conductivity-providing parts 133a and 133b can be formed.

A dopant may not be doped on the channel part 131 protected by the photoresist pattern 40. As a result, the channel part 131 can maintain a semiconductor characteristic.

The conductivity-providing parts 133a and 133b, provided with conductivity through the doping process using the dopant, can have a dopant concentration which is higher than that of the channel part 131 and can have resistivity which is lower than that of the channel part 131.

Referring to FIG. 7, a plurality of offset parts (for example, first and second offset parts) 132a and 132b can be protected by the photoresist pattern 40. Therefore, a dopant can be prevented from being directly implanted into the offset parts 132a and 132b. However, dopants doped on the conductivity-providing parts 133a and 133b can be diffused to the offset parts 132a and 132b. Accordingly, an effect where a dopant is partially doped on the offset parts 132a and 132b can be obtained.

In FIG. 7, when a width of the gate electrode 140 is LG and a width of the photoresist pattern 140 protruding from the gate electrode 140 is Loh, doping can be performed under a condition which satisfies the following Equation 2.

$$LG \times Loh \times 1/\eta 2 \geq 1 \qquad \text{[Equation 2]}$$

where $\eta 2 = 0.5 \ \mu m^2$.

Each of the first offset part 132a and the second offset part 132b can have a width corresponding to a protrusion width Loh. When the width LG of the gate electrode 140 and the width Loh of the photoresist pattern 140 protruding from the gate electrode 140 satisfies Equation 2, the offset parts 132a and 132b satisfying Equation 2 can be formed.

According to another embodiment of the present disclosure, in Equation 2, $\eta 2 = 1.5 \ \mu m^2$. Alternatively, $\eta 2$ can satisfy a relationship of "$0.5 \ \mu m^2 \leq \eta 2 \leq 1.5 \ \mu m^2$".

Figure 8:
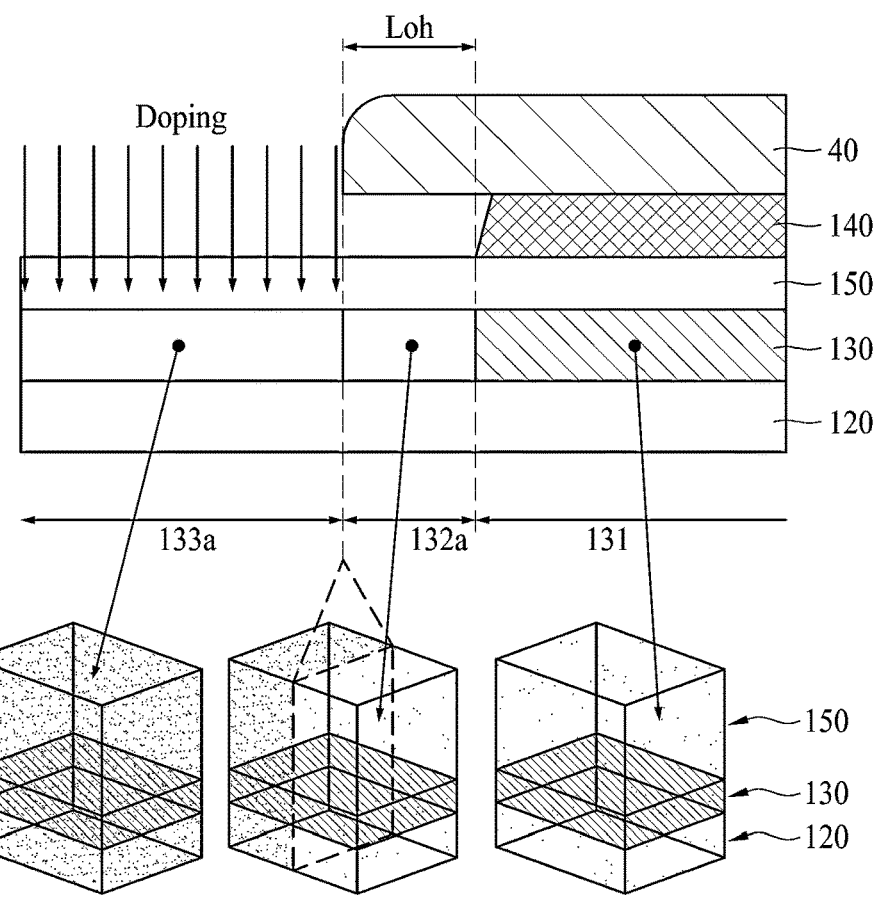
FIG. 8 is a diagram showing a region-based dopant distribution of an active layer according an embodiment of the present disclosure.

FIG. 8 is a diagram showing a region-based dopant distribution of an active layer according an embodiment of the present disclosure.

In FIG. 8, a dot illustrates a dopant. Referring to FIG. 8, a concentration of dopants can be highest in a plurality of conductivity-providing parts 133a and 133b. A plurality of offset parts 132a and 132b can have a dopant concentration which is lower than that of each of the conductivity-providing parts 133a and 133b. There can be a possibility that a small amount of dopants are diffused to a channel part 131 which is not directly doped with a dopant. The channel part 131 can hardly include a dopant, or can have a very low concentration of dopants.

Figure 9:
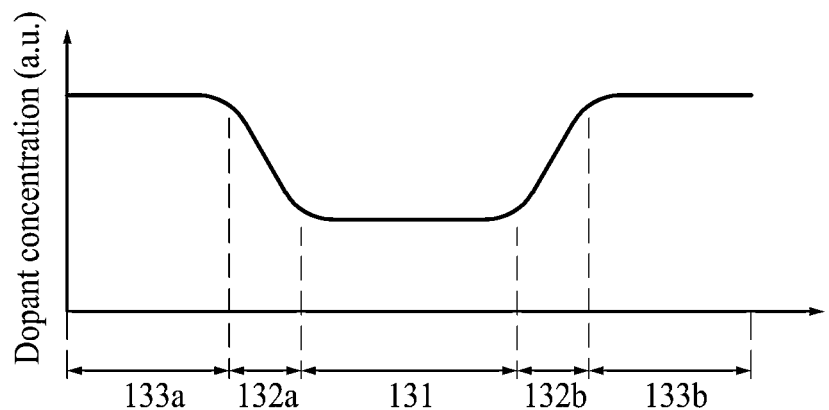
FIG. 9 is a diagram showing a concentration of a region-based dopant of an active layer according to an embodiment of the present disclosure.

FIG. 9 is a diagram showing a concentration of a region-based dopant of an active layer according to an embodiment of the present disclosure.

Referring to FIG. 9, a plurality of offset parts (for example, first and second offset parts) 132a and 132b can have a concentration gradient of dopants increasing in a direction from a channel part 131 to a plurality of conductivity-providing parts (for example, first and second conductivity-providing parts) 133a and 133b. For example, the first offset part 132a can have a concentration gradient of dopants increasing in a direction from the channel part 131 to the first conductivity-providing part 133a, and the second offset part 132b can have a concentration gradient of dopants increasing in a direction from the channel part 131 to the second conductivity-providing part 133b.

Figure 10:
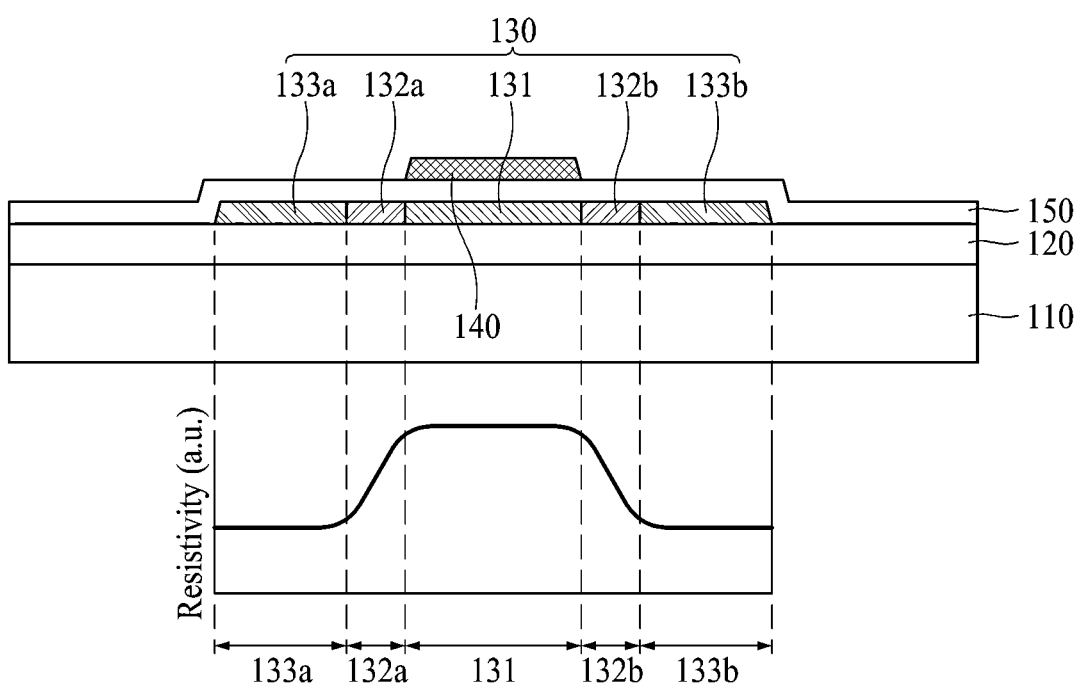
FIG. 10 is a diagram showing the degree of a region-based resistivity of an active layer according to an embodiment of the present disclosure.

FIG. 10 is a diagram showing the degree of a region-based resistivity of an active layer 130 according to an embodiment of the present disclosure.

Referring to FIG. 10, a resistivity of each of a plurality of offset parts 132a and 132b can be lower than that of a channel part 131 and can be higher than that of each of a plurality of conductivity-providing parts 133a and 133b. The offset parts 132a and 132b can have a concentration gradient of dopants increasing in a direction from the channel part 131 to the conductivity-providing parts 133a and 133b.

Therefore, the offset parts 132a and 132b can perform an electrical buffering function between the conductivity-providing parts 133a and 133b and the channel part 131 which is not provided with conductivity.

For example, since the offset parts 132a and 132b are disposed between the channel part 131 and the conductivity-providing parts 133a and 133b, a leakage current can be prevented from flowing between the channel part 131 and the conductivity-providing parts 133a and 133b in a turn-off (OFF) state of a TFT 100. As described above, the offset parts 132a and 132b can prevent a leakage current from occurring in the TFT 100 when the TFT 100 is in a turn-off (OFF) state.

Figure 11:
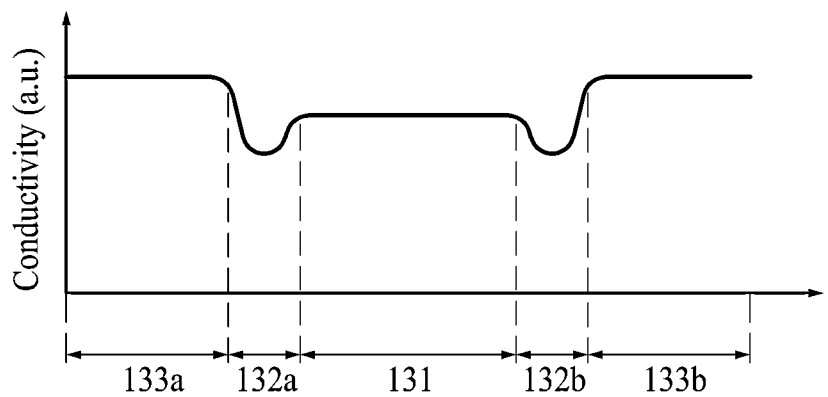
FIG. 11 is a diagram showing a region-based electrical conductivity distribution of a semiconductor layer, in a turn-on (ON) state of a TFT according to an embodiment of the present disclosure.

FIG. 11 is a diagram showing a region-based electrical conductivity distribution of a semiconductor layer, in a turn-on (ON) state of a TFT 100 according to an embodiment of the present disclosure.

Referring to FIG. 11, when the TFT 100 is turned on based on a gate voltage applied to a gate electrode 140, the electrical conductivity of each of a plurality of offset parts 132a and 132b which are not largely affected by an electric field generated in the gate electrode 140 may not largely increase. Therefore, when the TFT 100 is turned on, the conductivity of each of the offset parts 132a and 132b can be lower than that of a channel part 131 and that of each of a plurality of conductivity-providing parts 133a and 133b. Accordingly, the offset parts 132a and 132b can prevent the occurrence of a shift of a threshold voltage of the TFT 100. Accordingly, the electrical stability of the TFT 100 can be enhanced.

Figure 12:
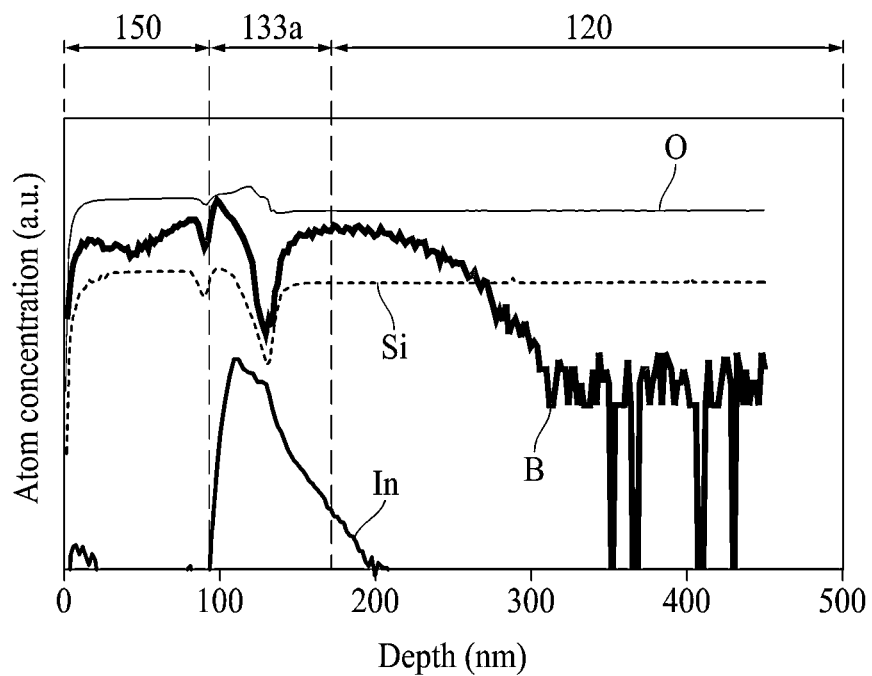
FIG. 12 is a diagram showing a concentration of an element based on a depth, in a region overlapping a conductivity-providing part according to an embodiment of the present disclosure.

FIG. 12 is a diagram showing a concentration (atom concentration) of an element based on a depth, in a region overlapping a conductivity-providing part according to an embodiment of the present disclosure. The concentration of the element based on a depth has been checked by time of flight secondary ion mass spectrometry (TOF-SIMS).

More specifically, FIG. 12 shows a concentration of oxygen (O), silicon (Si), indium (In), and boron (B) in a gate insulation layer 150, a first conductivity-providing part 133a, and a buffer layer 120. Oxygen (O) can be used to form the gate insulation layer 150, an active layer 130, and the buffer layer 120. Silicon (Si) can be used to form the gate insulation layer 150 and the buffer layer 120. Indium (In) can be used to form the active layer 130. Boron (B) can be an element which is added as a dopant through doping.

Referring to FIG. 12, it can be seen that boron (B), which is a dopant, has a maximum concentration in the first conductivity-providing part 133a.

Figure 13:
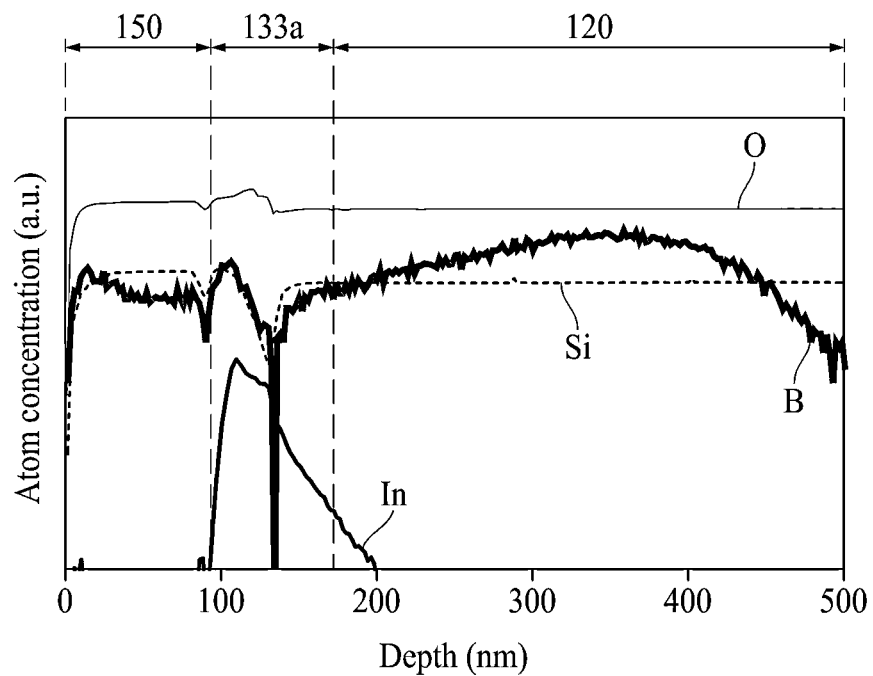
FIG. 13 is a diagram showing a concentration of an element based on a depth, in a region overlapping a conductivity-providing part according to an embodiment of the present disclosure.

FIG. 13 is a diagram showing a concentration (atom concentration) of an element based on a depth, in a region overlapping a conductivity-providing part according to an embodiment of the present disclosure.

Referring to FIG. 13, it can be seen that boron (B), which is a dopant, has a maximum concentration in a buffer layer 120.

Further, in a region overlapping the conductivity-providing parts 133a and 133b, a dopant concentration of the buffer layer 120 can be higher than that of a gate insulation layer 150 and that of each of the conductivity-providing parts 133a and 133b.

A dopant concentration of the gate insulation layer 150, a dopant concentration of each of the conductivity-providing parts 133a and 133b, and a dopant concentration of the buffer layer 120 can be adjusted by adjusting an acceleration voltage applied to a dopant in a doping process.

When the acceleration voltage applied to the dopant increases to sufficiently dope a dopant on the conductivity-providing parts 133a and 133b, the dopant can be doped on the conductivity-providing parts 133a and 133b, and moreover, can be doped on the buffer layer 120. When the acceleration voltage for doping increases up to an undesired level, the active layer 130 can be damaged. Accordingly, according to an embodiment of the present disclosure, the acceleration voltage can be adjusted so that a dopant concentration in the conductivity-providing parts 133a and 133b is the maximum or a dopant concentration in an upper portion of the buffer layer 120 is the maximum.

According to an embodiment of the present disclosure, when a dopant concentration in the conductivity-providing parts 133a and 133b is the maximum or a dopant concentration in the buffer layer 120 is the maximum, doping can be efficiently performed on the conductivity-providing parts 133a and 133b. Also, when a dopant concentration in the conductivity-providing parts 133a and 133b is the maximum or a dopant concentration in the buffer layer 120 is the maximum, it can be considered that the TFT 100 operates efficiently.

Figure 14A:
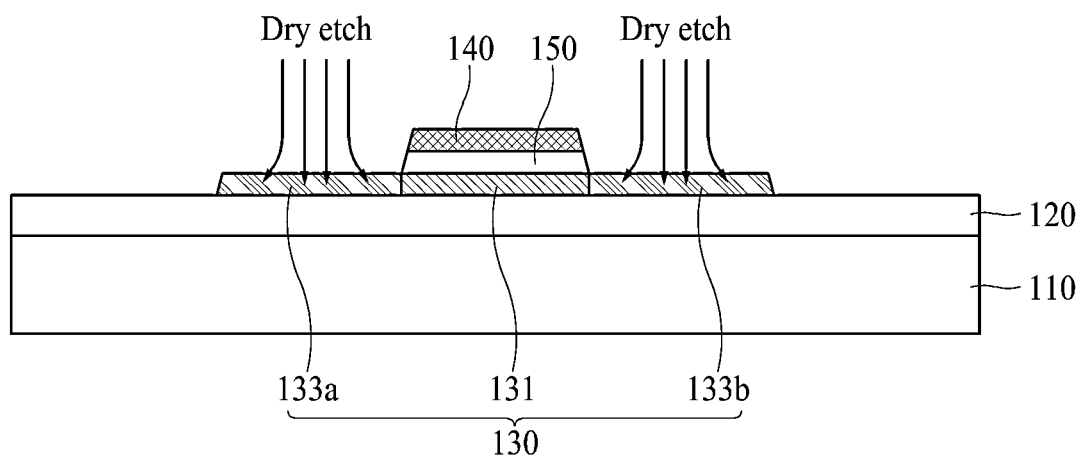
FIGS. 14A and 14B are diagrams of a conductivity-providing method according to a comparative example.
Figure 14B:
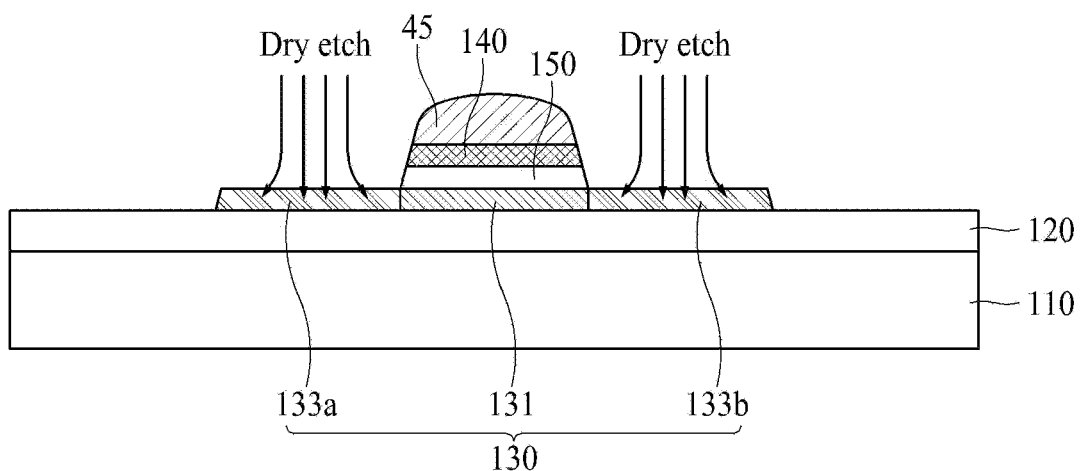

FIGS. 14A and 14B are diagrams of a conductivity-providing method according to a comparative example.

Referring to FIG. 14A, a gate electrode 140 can be formed, and then, conductivity can be provided by using the gate electrode 140 as a mask. For example, conductivity can be provided through dry etching. According to the comparative example, a gate insulation layer 150 can be patterned in a process of forming the gate electrode 140, and a gate insulation layer disposed on a region, which is to be provided with conductivity, of an active layer 130 can be removed. Therefore, an etching gas applied to a dry etching process can directly contact a surface of the active layer 130, and thus, conductivity can be provided to a selective portion of the active layer 130. In FIGS. 14A and 14B, dry etching is illustrated as an example of the conductivity-providing method, but conductivity can be provided through doping based on ion implantation.

Referring to FIG. 14B, in a state where a photoresist pattern 45 remains on a gate electrode 140, conductivity can be provided by using the photoresist pattern 45 as a mask. However, referring to FIG. 14B, the photoresist pattern 45 can have the same plane as the gate electrode 140, and the photoresist pattern 45 may not protrude to the outside of a region of the gate electrode 140. In FIG. 14B, a protrusion width Loh of the photoresist pattern 45 protruding to the outside of the gate electrode 140 can be "0".

According to the method illustrated in FIG. 14A or 14B, in a process of forming a plurality of conductivity-providing parts 133a and 133b by providing conductivity to a selective portion of the active layer 130, conductivity can be partially provided to a channel part 131. For example, conductivity can be provided to a region of the channel part 131 adjacent to the conductivity-providing parts 133a and 133b. However, when the conductivity-providing method according to the comparative example is applied, it may not be easy to determine a width by which conductivity is provided to an edge of the channel part 131.

In a conductivity-providing process, a conductivity-provided width or distance of the channel part 131 can be referred to as a conductivity-providing penetration depth $\Delta L$.

Figure 15:
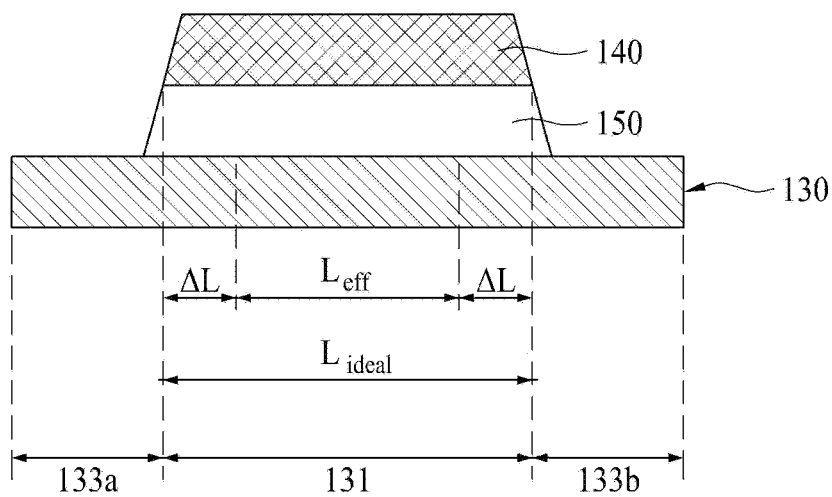
FIG. 15 is a schematic diagram describing a conductivity-providing penetration depth ΔL according to a comparative example.

FIG. 15 is a schematic diagram describing a conductivity-providing penetration depth $\Delta L$ according to a comparative example.

Referring to FIG. 15, a width of a channel part 131 overlapping a gate electrode 140 among an active layer 130 can be referred to by $L_{ideal}$. $L_{ideal}$ of FIG. 15 can be an ideal width of the channel part 131.

In a process of providing conductivity to a selective portion of the active layer 130, conductivity can be provided to a portion of the channel part 131, and a conductivity-provided region may not act as a channel. A width of a conductivity-provided portion of the channel part 131 can be referred to by ΔL. Also, a width of a region, which is not provided with conductivity and effectively acts as a channel, of the channel part 131 can be referred to as an effective channel width $L_{eff}$. When the conductivity-providing penetration depth ΔL increases, the effective channel width $L_{eff}$ can decrease.

In order for a TFT to perform switching, the effective channel width $L_{eff}$ should be maintained to be a certain value or more. However, when the conductivity-provided degree of the edge of the channel part 131 is not determined, it can be difficult to design a width of the channel part 131. When the conductivity-provided degree of the edge of the channel part 131 is not determined, a width of the channel part 131 should be designed to be wide, for securing the effective channel width $L_{eff}$. In this case, a size of a TFT can increase, and it can be difficult to miniaturize and highly integrate a device.

According to an embodiment of the present disclosure, a plurality of offset parts 132a and 132b can be disposed between the channel part 131 and the conductivity-providing parts 133a and 133b and can perform a buffering function between the channel part 131 and the conductivity-providing parts 133a and 133b, and thus, the most of the channel part 131 can effectively act as a channel. As described above, according to an embodiment of the present disclosure, the effective channel width $L_{eff}$ can be effectively secured, and thus, it can be easy to determine and design a width of the channel part 131.

According to an embodiment of the present disclosure, in regard to the effective channel width $L_{eff}$, a width L2 of each of the offset parts 132a and 132b can vary based on a width L1 of the channel part 131, and for example, the width L2 of each of the offset parts 132a and 132b can be determined based on Equation 1.

Figure 16:
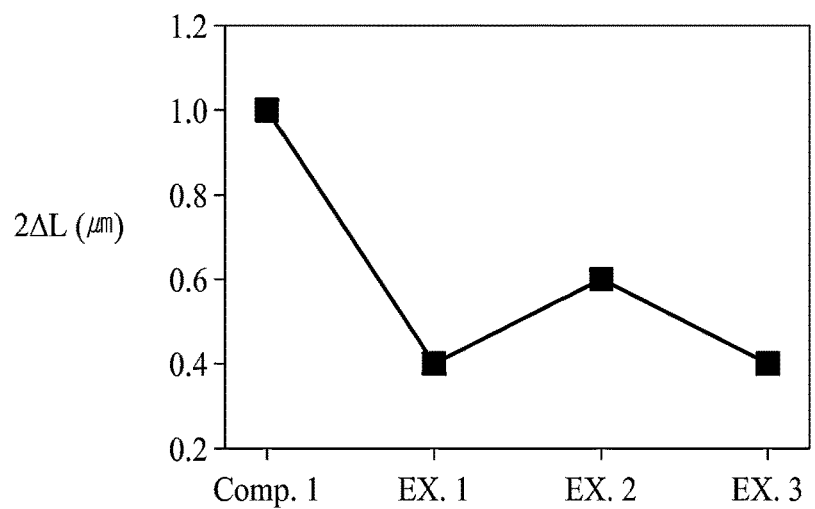
FIG. 16 is a graph of a total conductivity-providing penetration depth 2ΔL of a TFT according to a comparative example and an embodiment of the present disclosure.

FIG. 16 is a graph of a total conductivity-providing penetration depth 2ΔL of a TFT according to a comparative example and an embodiment of the present disclosure.

With respect to a cross-sectional view, there is a conductivity-providing penetration depth ΔL at both sides of a channel part 131, and thus, a total conductivity-providing penetration depth 2ΔL is calculated as "2×ΔL".

In FIG. 16, a comparative example 1 (Comp. 1) relates to a TFT where conductivity is provided to a portion of an active layer 130 by using the method illustrated in FIG. 14A.

In FIG. 16, an embodiment 1 (EX. 1) relates to a TFT which is manufactured by doping a boron (B) ion by using the method illustrated in FIG. 7, an embodiment 2 (EX. 2) relates to a TFT which is manufactured by doping a phosphorous (P) ion by using the method illustrated in FIG. 7, and an embodiment 3 (EX. 3) relates to a TFT which is manufactured by doping a fluorine (F) ion by using the method illustrated in FIG. 7.

In the TFT according to the comparative example 1 (Comp. 1), a total conductivity-providing penetration depth 2ΔL is about 1.0 μm, and a portion, corresponding to 1.0 μm, of the channel part 131 does not act as a channel. Due to this, the loss of the channel part 131 region is large.

On the other hand, according to the embodiments 1, 2, and 3 (EX. 1, EX. 2, and EX. 3), a total conductivity-providing penetration depth 2ΔL is less than about 0.6 μm, and the loss of the channel part 131 region is less than 1. In the embodiments 1, 2, and 3, the loss of the channel part 131 region is reduced due to a plurality of offset parts 132a and 132b.

FIGS. 17A to 17E are threshold voltage graphs of a TFT according to a comparative example and an embodiment of the present disclosure.

Figure 17A:
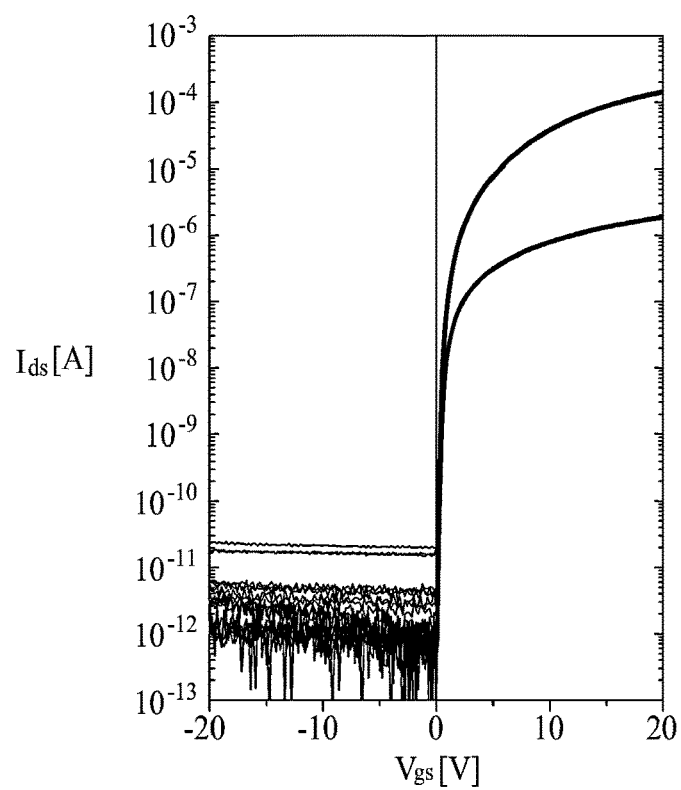
FIGS. 17A to 17E are threshold voltage graphs of a TFT according to a comparative example and an embodiment of the present disclosure.
Figure 17B:
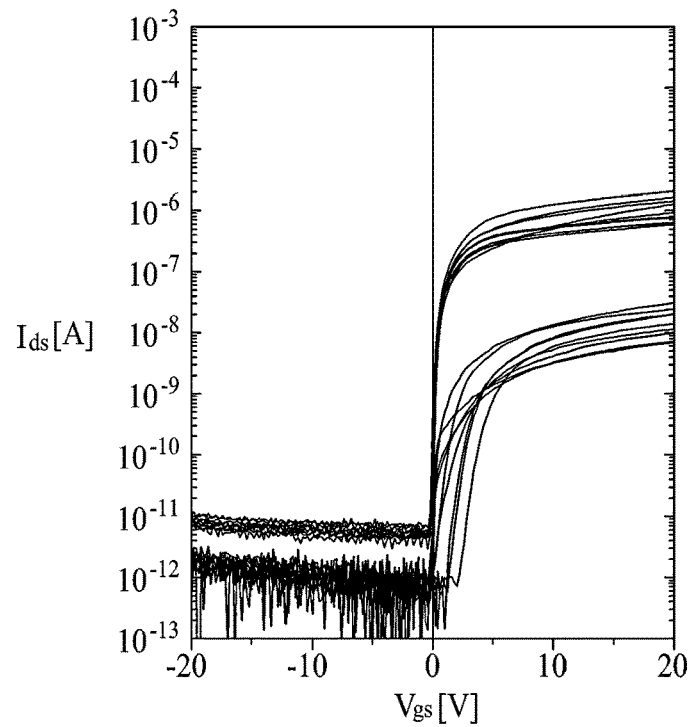
Figure 17C:
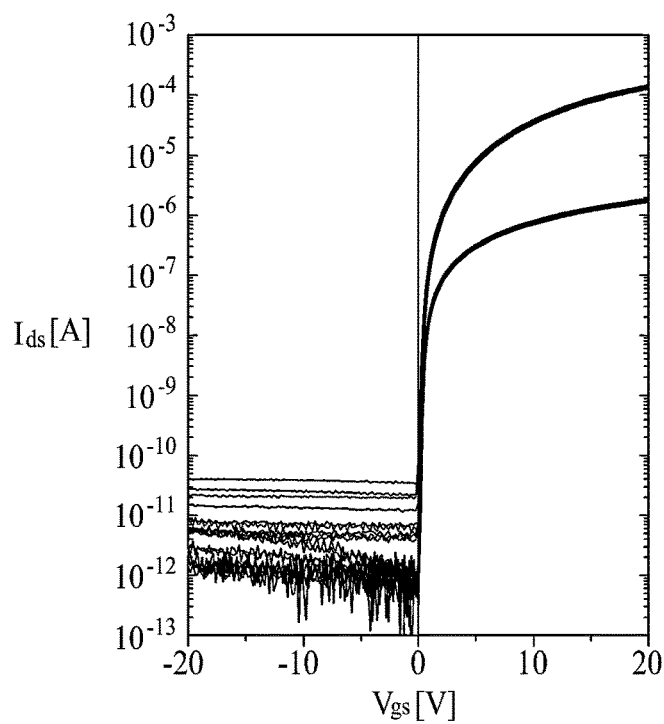
Figure 17D:
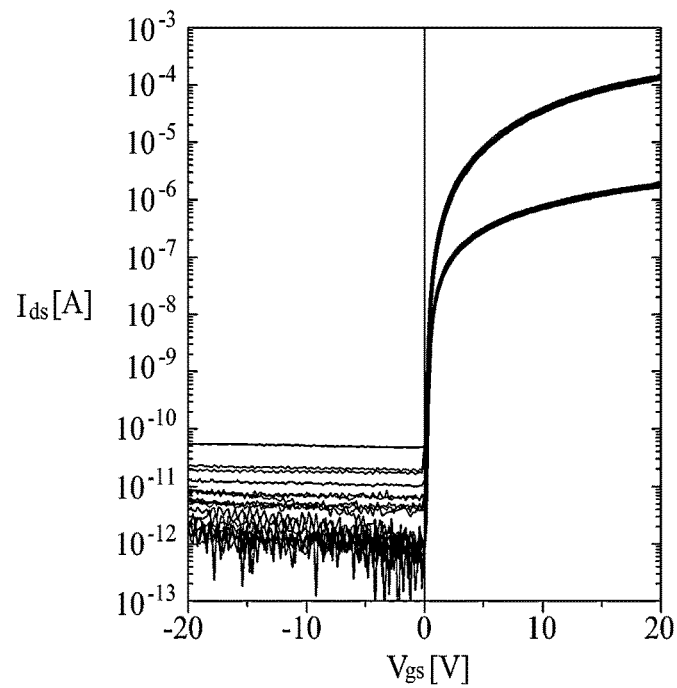
Figure 17E:
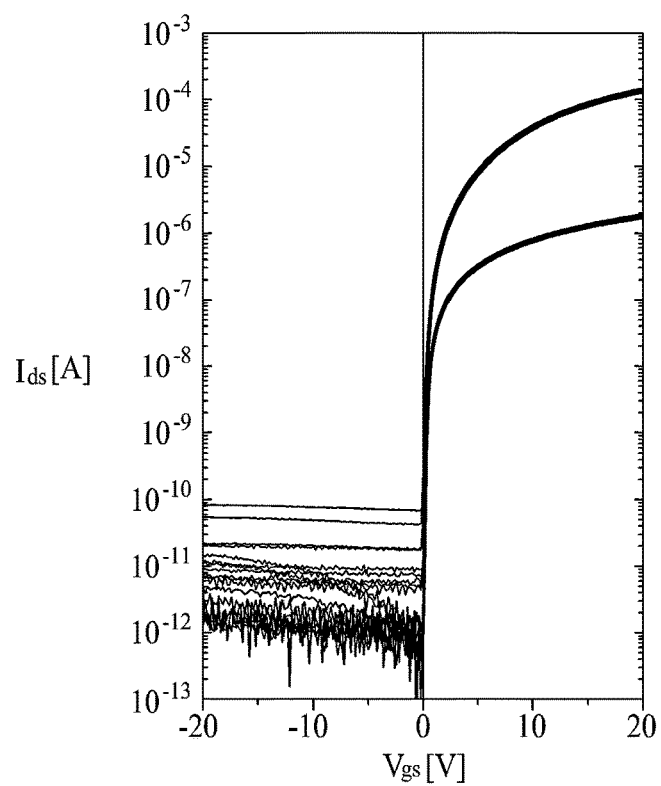

FIG. 17A shows a threshold voltage of a TFT according to a comparative example 1, FIG. 17B shows a threshold voltage of a TFT according to a comparative example 2, FIG. 17C shows a threshold voltage of a TFT according to an embodiment 1, FIG. 17D shows a threshold voltage of a TFT according to an embodiment 2, and FIG. 17E shows a threshold voltage of a TFT according to an embodiment 3. Ids in the drawings represents drain-source current of the TFT, $V_{gs}$ in the drawings represents gate-source voltage of the TFT.

The comparative example 2 relates to a TFT which has a structure of the gate insulation layer 150 as in FIG. 1 but does not include the offset parts 132a and 132b because an ion is not doped.

In the TFTs of the comparative examples 1 and 2 and the embodiments 1 to 3, an active layer uses IGZO as an oxide semiconductor.

In regard to the TFTs of the comparative examples 1 and 2 and the embodiments 1 to 3, an initial threshold voltage, mobility, a resistance of an offset region, positive bias temperature stress (PBTS), and negative bias temperature stress (NBTS) have been measured. A measurement result is shown in FIGS. 17A to 17E and Table 1.

TABLE 1

| Division | Initial threshold voltage | Mobility ($cm^2/vs$) | Conductivity-providing resistance (kΩ/sq) | PBTS (30 V, 1 h, 60° C.) | NBTS (−30 V, 1 h, 60° C.) |
| --- | --- | --- | --- | --- | --- |
| Comparative example 1 | 1.00 (0.88~1.09) | 23.08 (21.87~24.29) | 1.88 | 0.28 | −0.17 |
| Comparative example 2 | Unmeasurable | 0.29 (0.21~0.38) | Unmeasurable | Unmeasurable | Unmeasurable |
| Embodiment 1 | 0.90 (0.81~1.00) | 22.62 (20.94~24.18) | 2.86 | 0.4 | −0.07 |
| Embodiment 2 | 0.92 (0.82~1.02) | 22.35 (20.53~24.54) | 2.94 | 0.36 | −0.08 |
| Embodiment 3 | 0.85 (0.74~0.95) | 22.72 (21.14~24.23) | 4.78 | 0.41 | −0.08 |

Referring to Table 1 and FIGS. 17C, 17D, and 17E, each of the TFTs according to the embodiments 1 to 3 has a threshold voltage characteristic similar to that of the TFT (FIG. 17A) of the comparative example 1 manufactured based on a method of the related art. On the other hand, it can be checked that a threshold voltage characteristic of the TFT according to the comparative example 2 is very poor.

Moreover, referring to Table 1, it can be seen that each of the TFTs according to the embodiments 1 to 3 has mobility similar to that of the TFT of the comparative example 1.

In Table 1, the conductivity-providing resistance denotes a resistance of each of the conductivity-providing parts 133a and 133b. In the comparative example 2, it is impossible to measure a conductivity-providing resistance.

In Table 1, the PBTS denotes stress, applied to a TFT under a condition where a positive (+) bias voltage is applied at a certain temperature, and generally has a positive (+) value. When the PBTS increases, a stress of each of the active layer 130 and the TFT can increase, and thus, a threshold voltage variation ΔVth can increase.

NBTS (Negative Bias Temperature Stress) denotes stress, applied to a TFT under a condition where a negative (−) bias voltage is applied at a certain temperature, and generally has a negative (−) value. When an absolute value of the NBTS increases, a stress of each of the active layer 130 and the TFT with respect to temperature can increase, and thus, a threshold voltage variation ΔVth can increase and reliability can decrease.

Referring to Table 1, it can be seen that, under a condition where a voltage of 30 V is applied for one hour at a temperature of 60° C., the PBTS of each of the TFTs according to the embodiments 1 to 3 is greater than that of the TFT of the comparative example 1, and under a condition where a voltage of -30 V is applied for one hour at a temperature of 60° C., the absolute value of the NBTS of each of the TFTs according to the embodiments 1 to 3 is less than that of the TFT of the comparative example 1.

Figure 18:
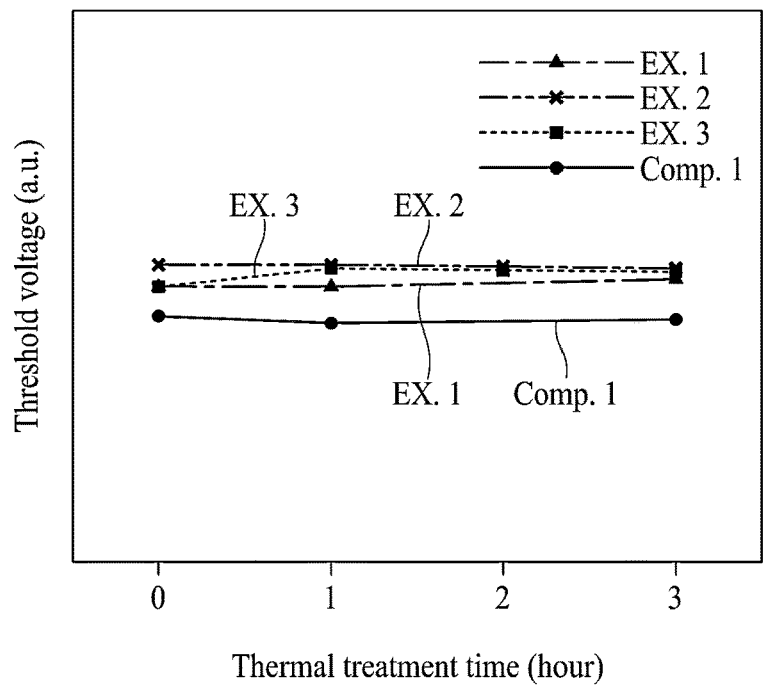
FIG. 18 is a threshold voltage graph of a TFT with respect to a thermal treatment time, according to a comparative example and an embodiment of the present disclosure.

FIG. 18 is a threshold voltage graph of a TFT with respect to a thermal treatment time, according to a comparative example and an embodiment of the present disclosure.

FIG. 18 shows a threshold voltage variation of a TFT with respect to a thermal treatment time, in a case where thermal treatment is performed on TFTs of a comparative example 1 (Comp. 1), an embodiment 1 (EX. 1), an embodiment 2 (EX. 2), and an embodiment 2 (EX. 3) at a temperature of 230° C.

In a case where thermal treatment is performed on a TFT for a long time, an electrical characteristic of the active layer 130 can vary based on an influence of an insulation layer and/or the like disposed near the active layer 130. In this case, the reliability of a TFT can be reduced.

For example, in a case where thermal treatment is performed on a TFT for a long time, the conductivity of the conductivity-providing parts 133a and 133b can be lost (a conductivity-provided case can be restored to non-conductivity). In this case, the performance of the TFT can be reduced and can be non-uniform, causing a reduction in reliability.

However, referring to FIG. 18, it can be seen that a threshold voltage does not largely vary despite thermal treatment performed on the TFTs of the embodiments 1 to 3 of the present disclosure.

Figure 19:
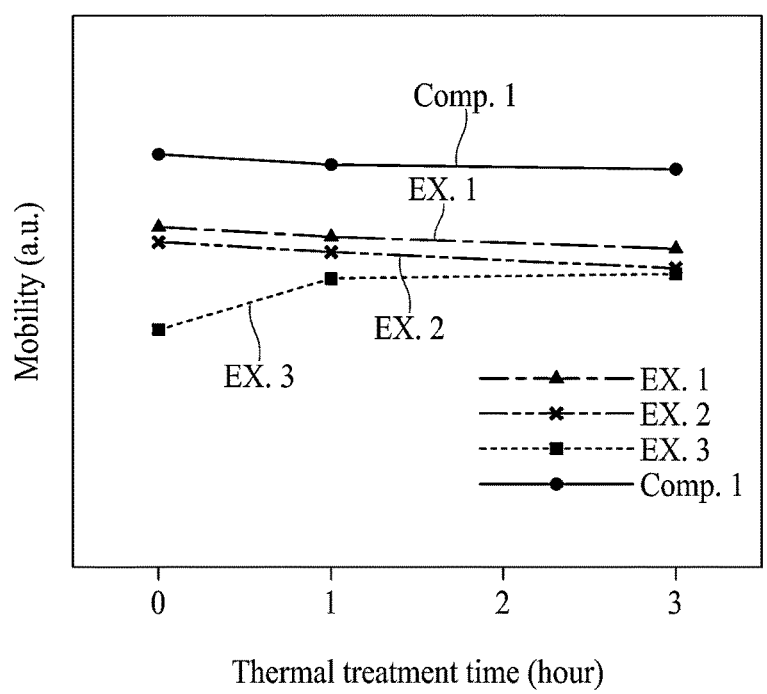
FIG. 19 is a mobility graph of a TFT with respect to a thermal treatment time, according to a comparative example and an embodiment of the present disclosure.

FIG. 19 is a mobility graph of a TFT with respect to a thermal treatment time, according to a comparative example and an embodiment of the present disclosure.

FIG. 19 shows a mobility variation of a TFT with respect to a thermal treatment time, in a case where thermal treatment is performed on TFTs of a comparative example 1 (Comp. 1), an embodiment 1 (EX. 1), an embodiment 2 (EX. 2), and an embodiment 2 (EX. 3) at a temperature of 230° C.

Referring to FIG. 19, it can be seen that mobility is not largely reduced despite thermal treatment performed on the TFTs of the embodiments 1 to 3 of the present disclosure.

Referring to FIGS. 18 and 19, it can be seen that performance is not largely reduced despite thermal treatment performed on the TFTs of the embodiments 1 to 3 of the present disclosure.

Figure 20:
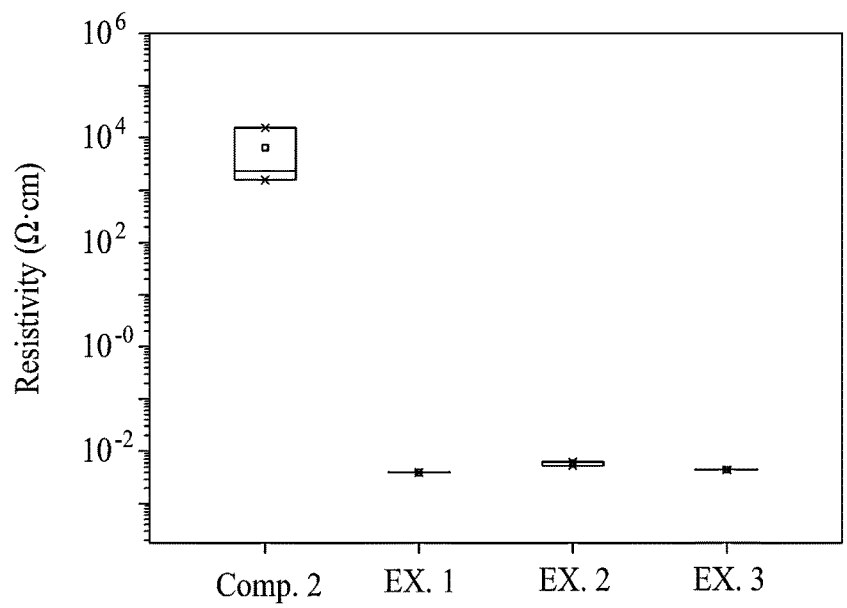
FIG. 20 is a resistivity measurement graph of a TFT according to a comparative example and an embodiment of the present disclosure.

FIG. 20 is a resistivity measurement graph of a TFT according to a comparative example and an embodiment of the present disclosure.

In FIG. 20, values respectively referred to by EX. 1, EX. 2, and EX. 3 represent a resistivity of the conductivity-providing parts 133a and 133b of a TFT of an embodiment 1 of the present disclosure, a resistivity of the conductivity-providing parts 133a and 133b of a TFT of an embodiment 2 of the present disclosure, and a resistivity of the conductivity-providing parts 133a and 133b of a TFT of an embodiment 3 of the present disclosure, respectively. In FIG. 20, a value referred to by Comp. 2 represent a resistivity of a region corresponding to each of the conductivity-providing parts 133a and 133b of the TFT of the embodiment 1 of the present disclosure, in a TFT according to a comparative example 2.

As illustrated in FIG. 20, the TFTs of the embodiment 1 (EX. 1), the embodiment 2 (EX. 2), and the embodiment 3 (EX. 3) of the present disclosure have resistivity which is lower than that of a TFT of a comparative example 2 (Comp. 2). The TFTs according to the embodiments 1 to 3 of the present disclosure can have, for example, resistivity of about $10^{-2}$ to $10^{-3}$ Ω·cm.

Figure 21:
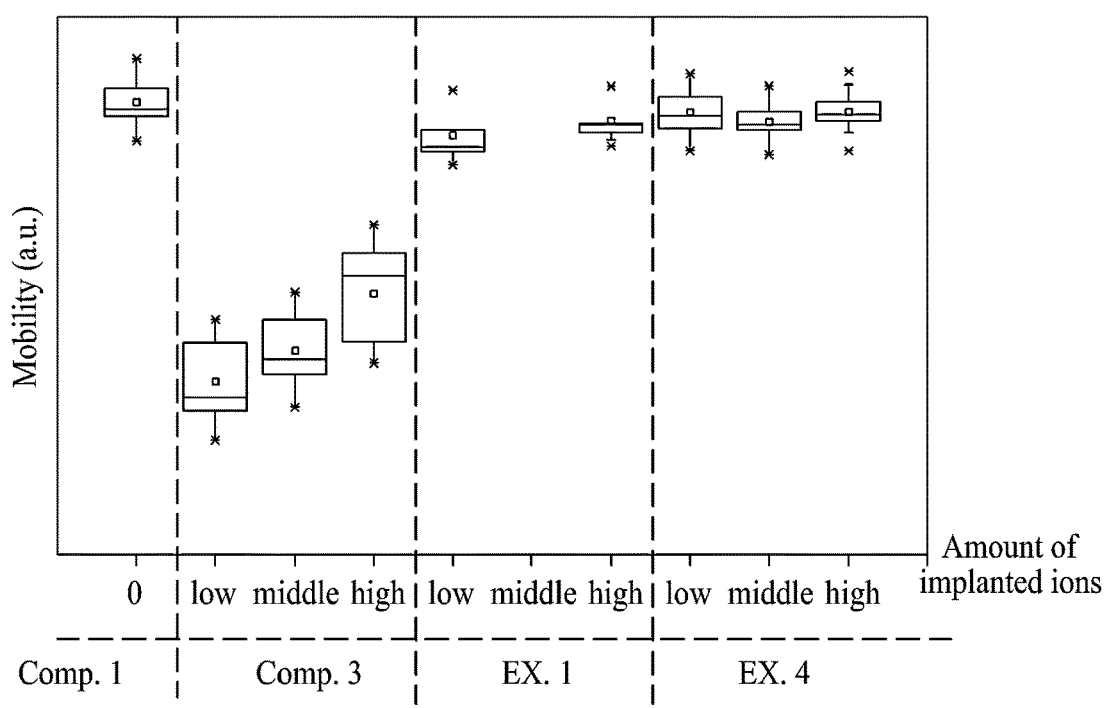
FIG. 21 is a mobility graph with respect to the amount of implanted ions of an active layer according to a comparative example and an embodiment of the present disclosure.

FIG. 21 is a mobility graph with respect to the amount of implanted ions of an active layer according to a comparative example and an embodiment of the present disclosure.

In FIG. 21, a comparative example 1 (Comp. 1) represents mobility with respect to a TFT of the comparative example 1 where conductivity is provided to a portion of the active layer 130 through dry etching without ion implantation.

In FIG. 21, a comparative example 3 (Comp. 3) relates to a TFT which has the same structure as an embodiment 1 (EX. 1) and where a concentration of boron (B) ions, which are dopants, is the maximum in the gate insulation layer 150. In FIG. 21, an embodiment 4 (EX. 4) relates to a TFT which has the same structure as the embodiment 1 (EX. 1) and where a concentration of boron (B) ions, which are dopants, is the maximum in the buffer layer 120. In FIG. 21, low concentration doping, middle concentration doping, and high concentration doping have been performed at the same concentration on the comparative example 3 (Comp. 3), the embodiment 1 (EX. 1), and the embodiment 4 (EX. 4). A middle concentration doping result of the embodiment 1 (EX. 1) is not disclosed in FIG. 21.

Referring to FIG. 21, according to the embodiment 1 (EX. 1) and the embodiment 4 (EX. 4), it can be seen that a mobility difference is not large when the amount of implanted ions is changed from a low concentration to a high concentration. Also, it can be seen that the TFTs of the embodiment 1 (EX. 1) and the embodiment 4 (EX. 4) have mobility similar to that of the TFT according to the comparative example 1 (Comp. 1) even when the amount of implanted ions is a low concentration.

On the other hand, according to the comparative example 3 (Comp. 3), it can be seen that mobility increases when the amount of implanted ions increases from a low concentration to a high concentration. Also, it can be seen that the TFT of the comparative example 3 (Comp. 3) has mobility which is lower than that of the TFT of the comparative example 1 (Comp. 1) or the embodiment 1 (EX. 1) and the embodiment 4 (Ex. 4) even when the amount of implanted ions is a high concentration.

The active layer 130 can be damaged when the amount of implanted ions increases so that the TFT of the comparative example 3 (Comp. 3) has mobility equal to that of each of the TFTs of the embodiment 1 (EX. 1) and the embodiment 4 (EX. 4).

On the other hand, the TFTs according to the embodiment 1 (EX. 1) and the embodiment 4 (EX. 4) of the present disclosure can have good mobility even when the amount of implanted ions is a low concentration, and doping based on ion implantation can be performed within a range for preventing the damage of the active layer 130.

Figure 22A:
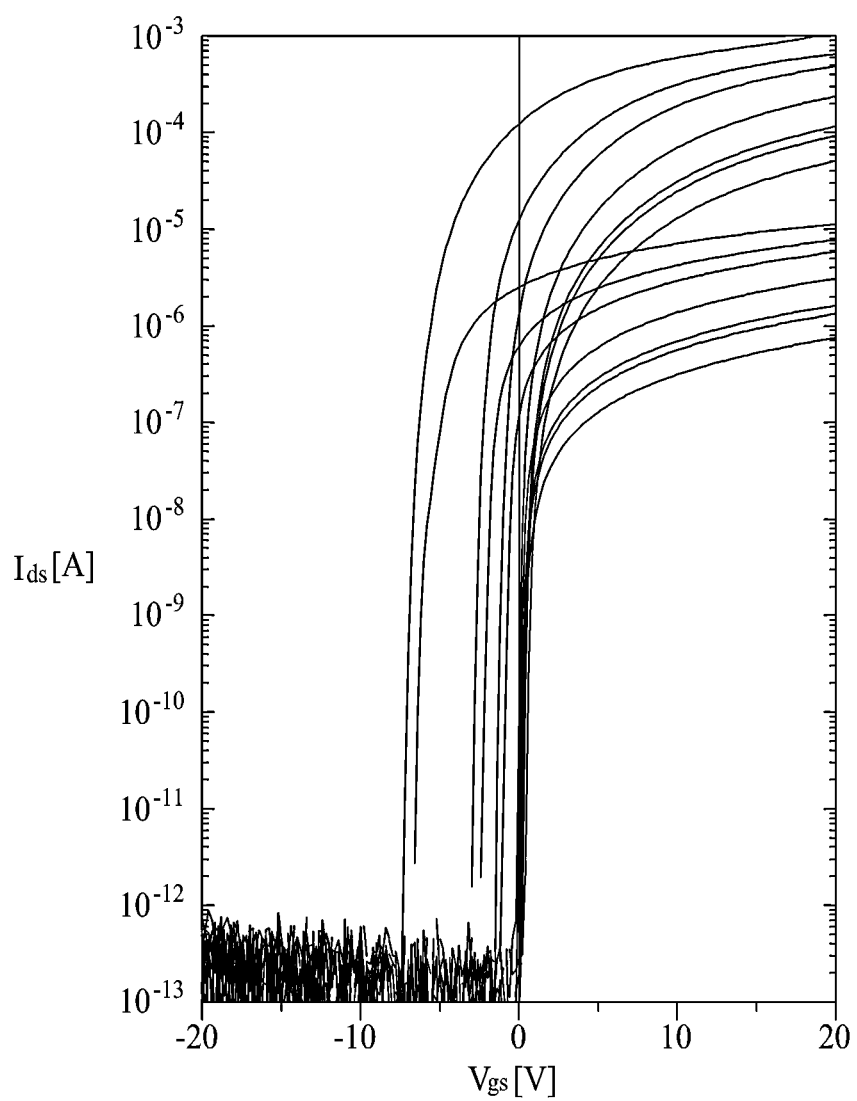
FIGS. 22A to 22C are threshold voltage graphs of a TFT with respect to a width of a channel part, according to a comparative example and an embodiment of the present disclosure.
Figure 22B:
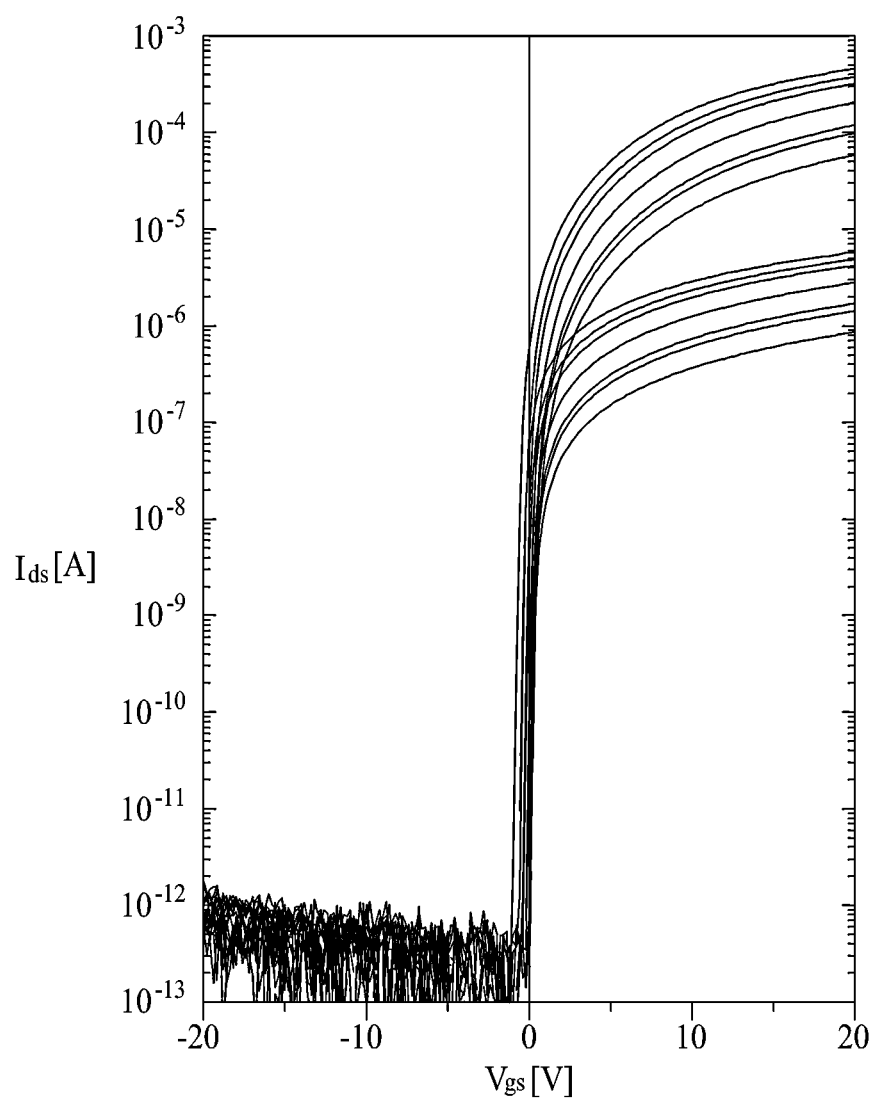
Figure 22C:
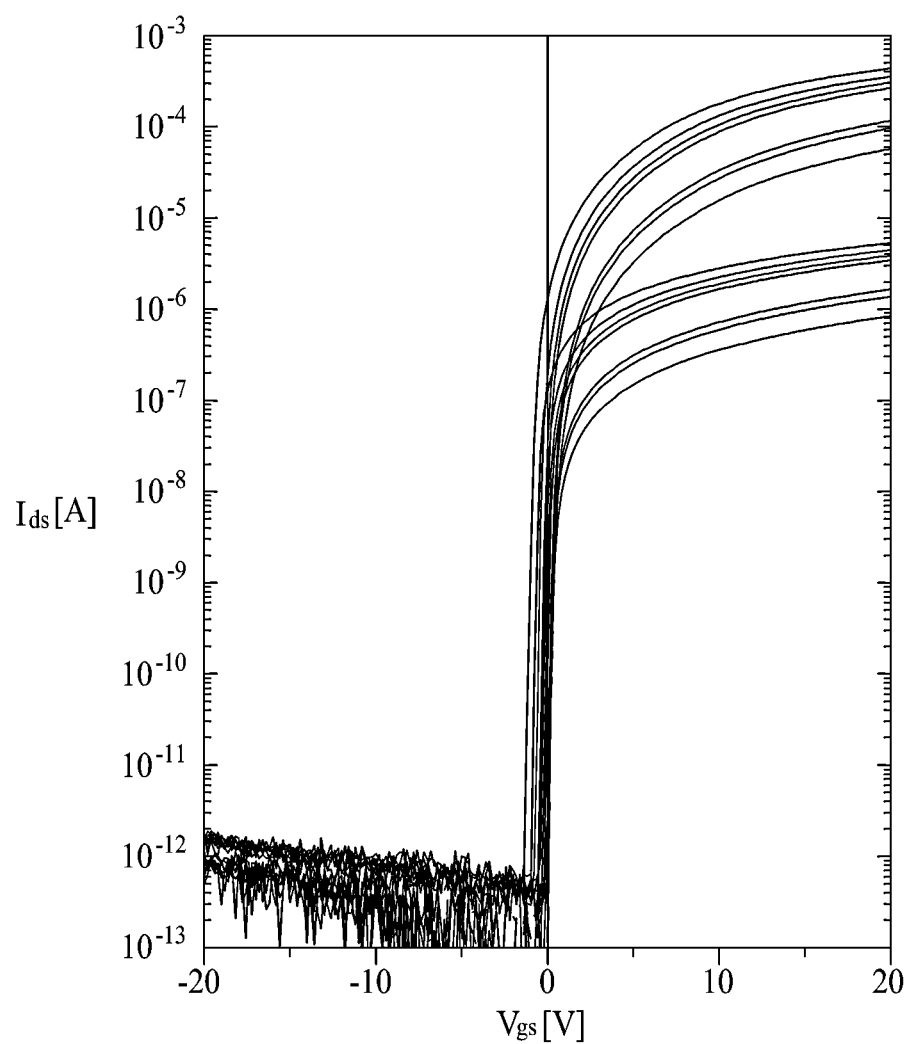

FIGS. 22A to 22C are threshold voltage graphs of a TFT with respect to a width of a channel part 131, according to a comparative example and an embodiment of the present disclosure.

FIG. 22A is a threshold voltage graph showing cases where a width of a channel part 131 is 3 μm to 20 μm (3 μm, 3.5 μm, 4 μm, 6 μm, 10 μm, 12 μm, and 20 μm), in a TFT according to a comparative example 4 where ion doping is performed by using a gate electrode 140 as a mask without a photoresist pattern 40 (a protrusion width Loh=0 μm).

FIG. 22B is a threshold voltage graph showing cases where a width of a channel part 131 is 3 μm to 20 μm (3 μm, 3.5 μm, 4 μm, 6 μm, 10 μm, 12 μm, and 20 μm), in a TFT according to an embodiment 1 where ion doping is performed by using a photoresist pattern 40 as a mask and a protrusion width Loh (see FIG. 7), by which the photoresist pattern 40 protrudes to the outside of a gate electrode 140, is 0.5 μm.

FIG. 22C is a threshold voltage graph showing cases where a width of a channel part 131 is 3 μm to 20 μm (3 μm, 3.5 μm, 4 μm, 6 μm, 10 μm, 12 μm, and 20 μm), in a TFT according to an embodiment 5 where ion doping is performed by using a photoresist pattern 40 as a mask and a protrusion width Loh (see FIG. 7), by which the photoresist pattern 40 protrudes to the outside of a gate electrode 140, is 0.7 μm.

Figure 23:
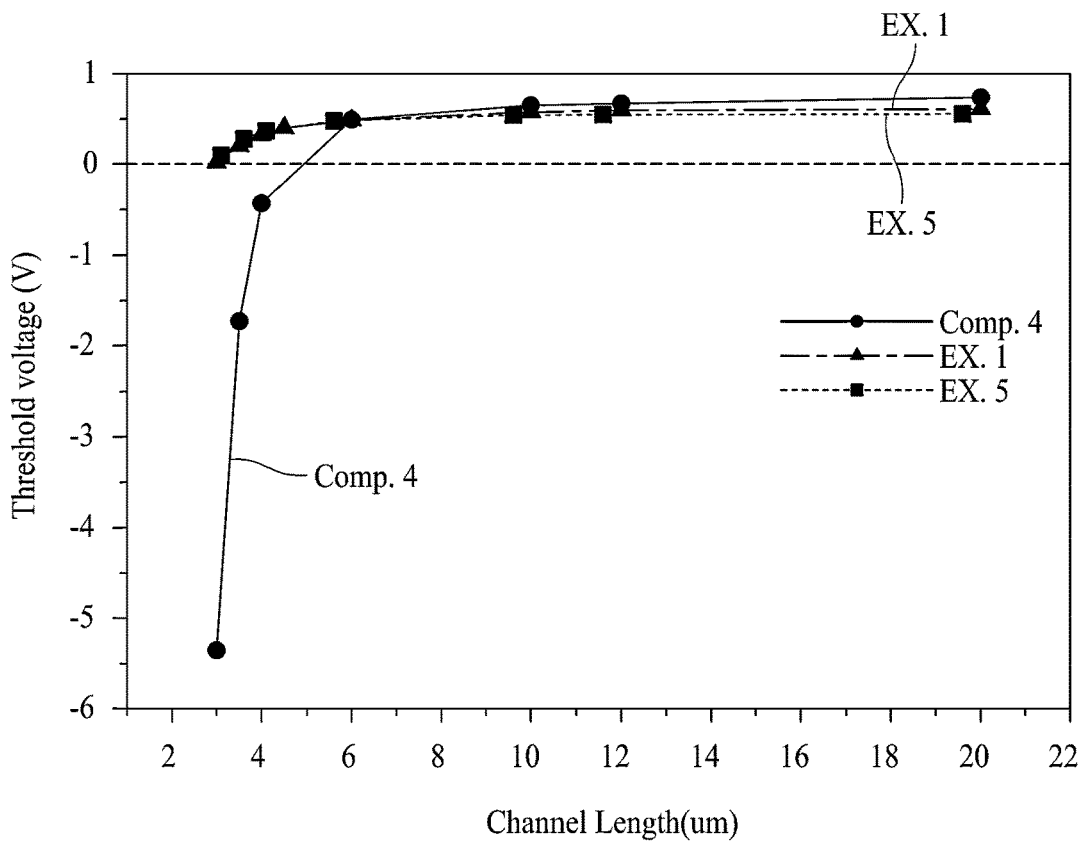
FIG. 23 is a graph showing a threshold voltage value of a TFT with respect to a width of a channel part, according to a comparative example and an embodiment of the present disclosure.

FIG. 23 is a graph showing a threshold voltage value of a TFT with respect to a width (or length) of a channel part 131, according to a comparative example and an embodiment of the present disclosure.

Referring to FIGS. 22A and 23, in a TFT according to a comparative example 4, it can be seen that a threshold voltage varies when a width of a channel part 131 varies. Particularly, referring to FIG. 23, in the TFT according to the comparative example 4 (Comp. 4), it can be seen that a threshold voltage value is largely changed when the width of the channel part 131 is 4 μm or less, and a threshold voltage value is maintained to be constant when the width of the channel part 131 is 6 μm or more.

Moreover, referring to FIGS. 22B, 22C, and 23, in TFTs according to an embodiment 1 (EX. 1) and an embodiment 5 (EX. 5) of the present disclosure, it can be seen that, when a width of a channel part 131 varies, a source-drain current Ids varies but a threshold voltage is hardly changed. Also, it can be seen that the TFTs according to the embodiment 1 and the embodiment 5 of the present disclosure have an excellent threshold voltage characteristic even when the width of the channel part 131 is 3 μm and is very narrow.

Figure 24:
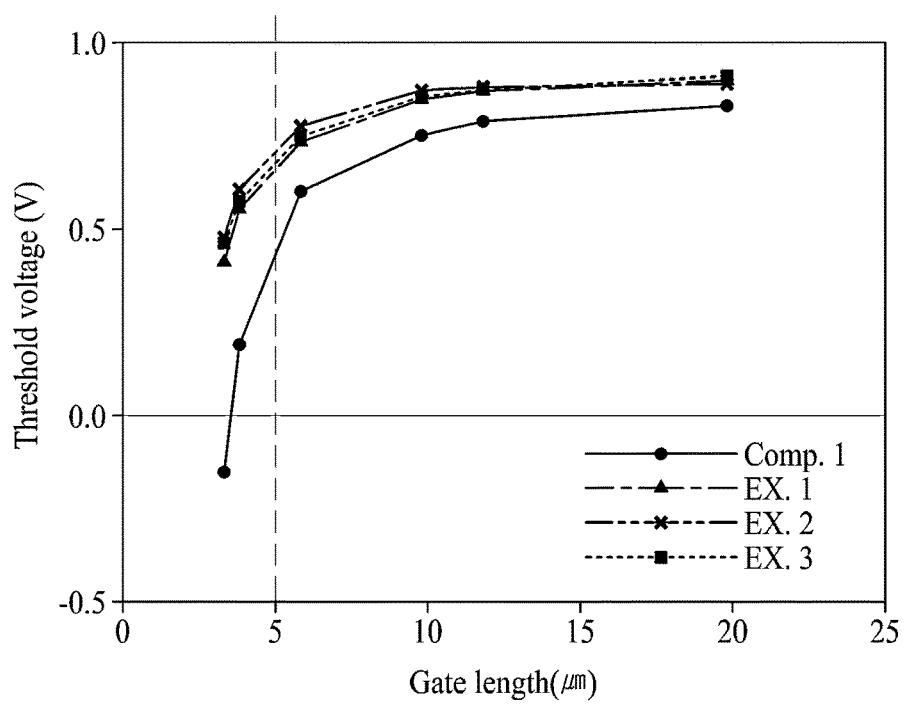
FIG. 24 is a threshold voltage graph with respect to a width of a gate electrode, according to a comparative example and an embodiment of the present disclosure.

FIG. 24 is a threshold voltage graph with respect to a width (or length) of a gate electrode 140, according to a comparative example and an embodiment of the present disclosure.

According to an embodiment of the present disclosure, a width of the gate electrode 140 corresponds to a width of a channel part 131.

Referring to FIG. 24, in a TFT according to a comparative example 1 (Comp. 1), it can be seen that a threshold voltage varies when the width of the gate electrode 140 varies. Particularly, referring to FIG. 23, in the TFT according to the comparative example 1, it can be seen that a threshold voltage value is very largely changed when the width of the gate electrode 140 is 5 μm or less.

Moreover, referring to FIG. 24, in TFTs according to embodiments 1, 2, and 3 (EX. 1, EX. 2, and EX. 3) of the present disclosure, it can be seen that a variation of a threshold voltage is not large when the width of the gate electrode 140 varies.

Figure 25:
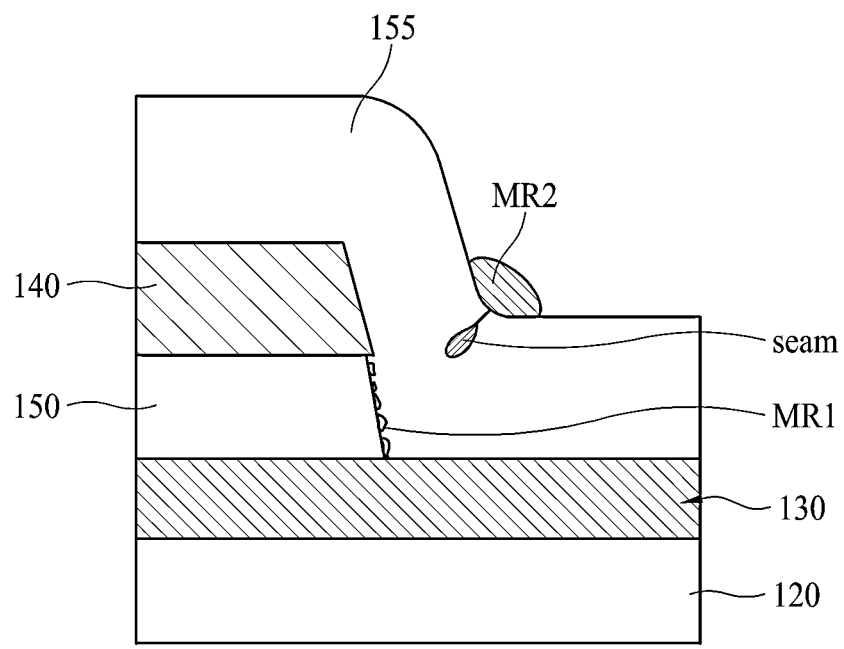
FIG. 25 is a diagram showing the occurrence of a seam and a metal residual layer near a gate electrode according to an embodiment of the present disclosure.
Figure 26:
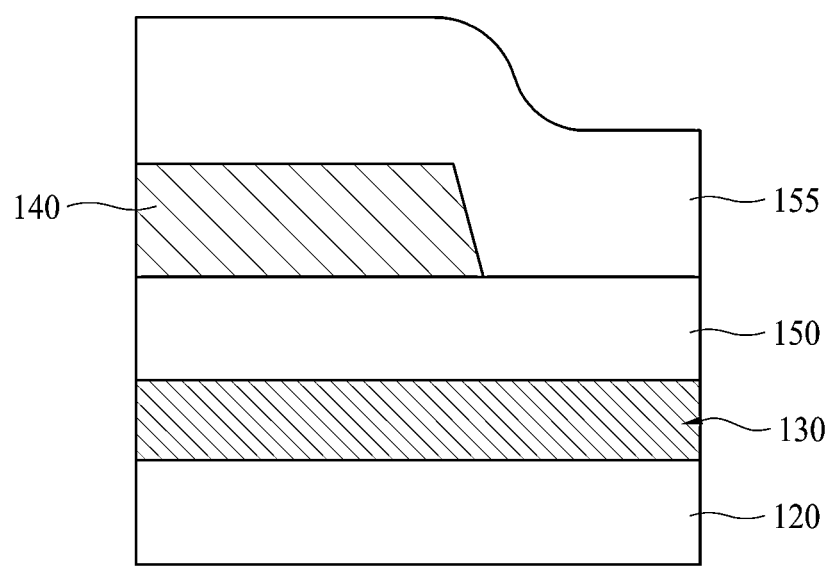
FIG. 26 is a diagram showing a configuration where a seam or a metal residual layer does not occur near a gate electrode according to an embodiment of the present disclosure.

FIG. 25 is a diagram showing the occurrence of a seam and a metal residual layer near a gate electrode according to an embodiment of the present disclosure. FIG. 26 is a diagram showing a configuration where a seam or a metal residual layer does not occur near a gate electrode according to an embodiment of the present disclosure.

More specifically, FIG. 25 illustrates a case where a gate insulation layer 150 is etched along with a gate electrode 140.

As in FIG. 25, in a case where the gate insulation layer 150 is etched along with the gate electrode 140, a step height between the gate electrode 140 and an active layer 130 can increase. When the step height between the gate electrode 140 and the active layer 130 increases, a defect such as a seam can occur in an interlayer insulation layer 155 disposed on the gate electrode 140 as illustrated in FIG. 25, and due to this, insulating properties between the gate electrode 140 and another electrode or a wiring line can be reduced, causing a short circuit.

Moreover, as in FIG. 25, in a case where the gate insulation layer 150 is etched along with the gate electrode 140, a metal residual material MR1 occurring in an etching process performed on the gate electrode 140 can remain on an edge of the gate insulation layer 150, causing a reduction in insulating properties between the gate electrode 140 and the active layer 130.

Moreover, as in FIG. 25, in a case where the step height between the gate electrode 140 and the active layer 130 increases, a step height can occur in the interlayer insulation layer 155, and a metal residual material MR2 (for example, a metal residual material for forming a source electrode or a drain electrode) can remain on the step height, causing a degradation in performance of a TFT.

On the other hand, as in FIG. 26, in a case where a gate insulation layer 150 is not patterned, insulating properties between a gate electrode 140 and an active layer 130 can be enhanced, and moreover, a step height between the gate electrode 140 and the active layer 130 can be reduced. In a case where the step height between the gate electrode 140 and the active layer 130 is reduced, a possibility that a defect such as a seam occurs in an interlayer insulation layer 155 can be reduced. As illustrated in FIG. 26, when a step height of the interlayer insulation layer 155 is reduced, a possibility that a metal residual material MR2 remains on a stepped portion can be reduced.

Referring to FIG. 26, since the gate insulation layer 150 is not etched, there can be no possibility that a metal residual material MR1 occurring in an etching process performed on the gate electrode 140 remains on an edge of the gate insulation layer 150.

FIGS. 27A to 27G are process views of a method of manufacturing a TFT, according to an embodiment of the present disclosure.

Figure 27A:
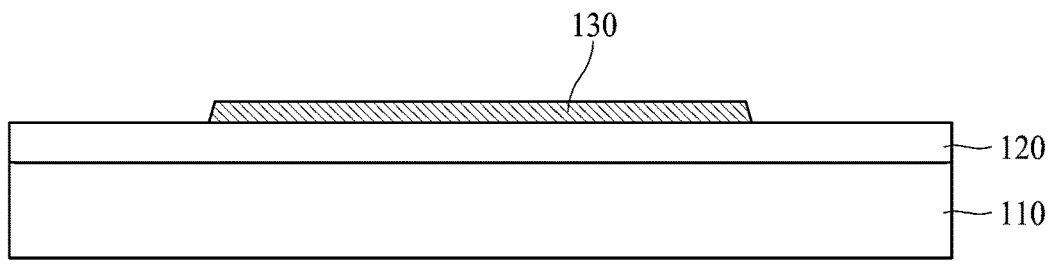
FIGS. 27A to 27G are process views of a method of manufacturing a TFT, according to an embodiment of the present disclosure.

Referring to FIG. 27A, a buffer layer 120 can be formed on a substrate 110, and an active layer 130 can be formed on the buffer layer 120. The active layer 130 can include an oxide semiconductor material. In more detail, the active layer 130 can be an oxide semiconductor layer.

Figure 27B:
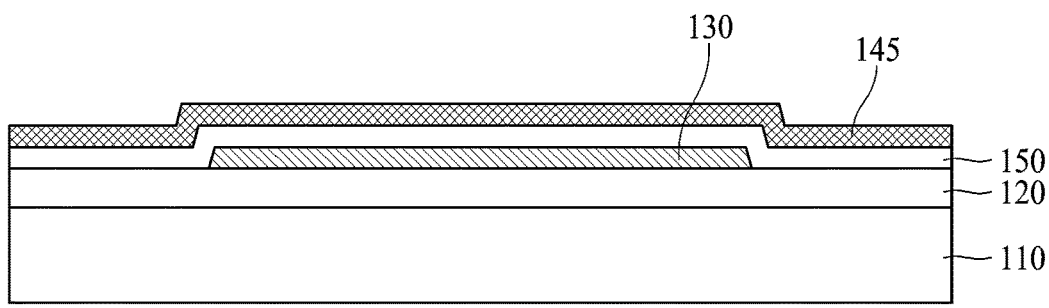

Referring to FIG. 27B, a gate insulation layer 150 can be formed on the active layer 130, and a gate-electrode material layer 145 can be formed on the gate insulation layer 150. The gate-electrode material layer 145 can include metal.

Figure 27C:
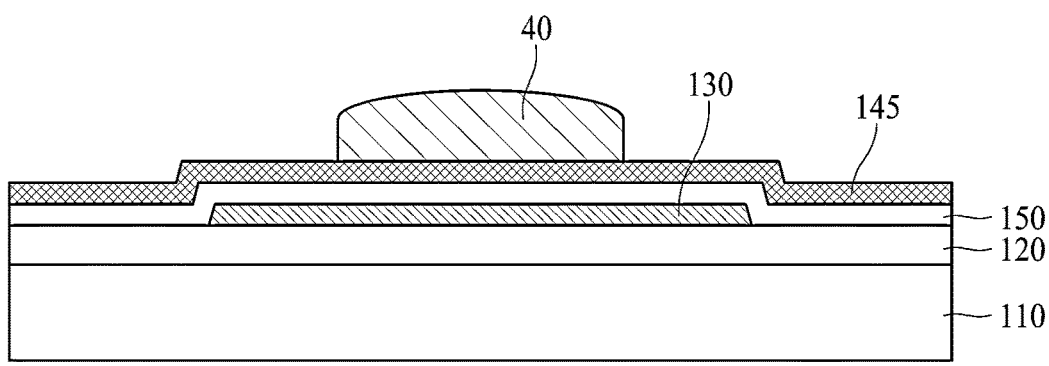

Referring to FIG. 27C, a photoresist pattern 40 can be formed on the gate-electrode material layer 145.

The photoresist pattern 40 can be formed by coating, exposing, and developing a photoresist on a whole top surface of the gate-electrode material layer 145.

Figure 27D:
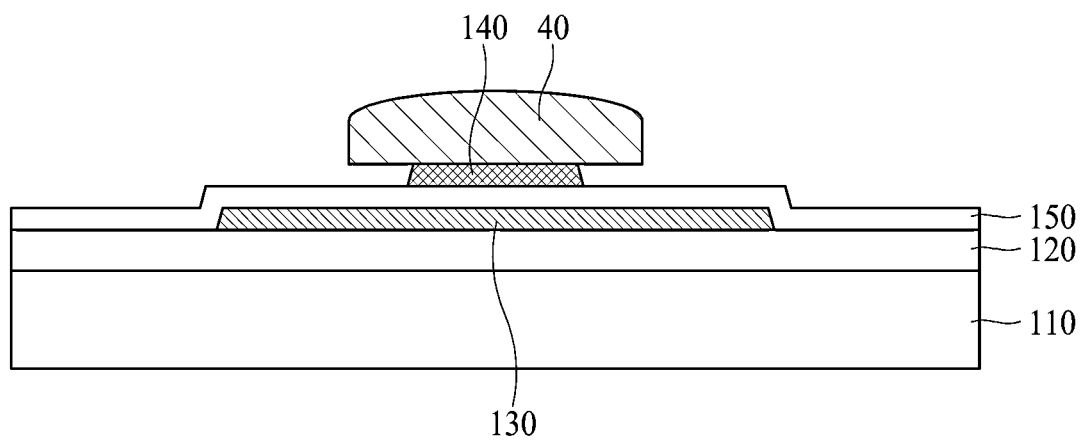

Referring to FIG. 27D, the gate-electrode material layer 145 can be etched by using the photoresist pattern 40 as a mask. As a result, the gate electrode 140 can be formed.

As illustrated in FIG. 27D, an area of the photoresist pattern 40 can be greater than that of the gate electrode 140 in a plan view. Due to over-etching of the gate-electrode material layer 145, the gate electrode 140 having an area less than that of the photoresist pattern 40 can be formed. The gate electrode 140 can be disposed in a region defined by the photoresist pattern 40 in a plan view. The gate insulation layer 150 can cover a whole top surface of the active layer 130.

A width of the photoresist pattern 40 can be determined based on Equation 2.

For example, when a width of the gate electrode 140 is LG and a width of the photoresist pattern 140 protruding from the gate electrode 140 is Loh (see FIG. 7), the width of the photoresist pattern 140 can be designed to satisfy the following Equation 2.

$$LG \times Loh \times 1/\eta 2 \geq 1 \qquad \text{[Equation 2]}$$

where $\eta 2 = 0.5~\mu m^2$.

As illustrated in FIGS. 27B to 27D, a process of forming the gate electrode 140 can include a process of forming the gate-electrode material layer 145 on the gate insulation layer 150 (FIG. 27B), a process of forming the photoresist pattern 40 on the gate-electrode material layer 145 (FIG. 27C), and a process of etching the gate-electrode material layer 145 by using the photoresist pattern 40 as a mask (FIG. 27D).

Figure 27E:
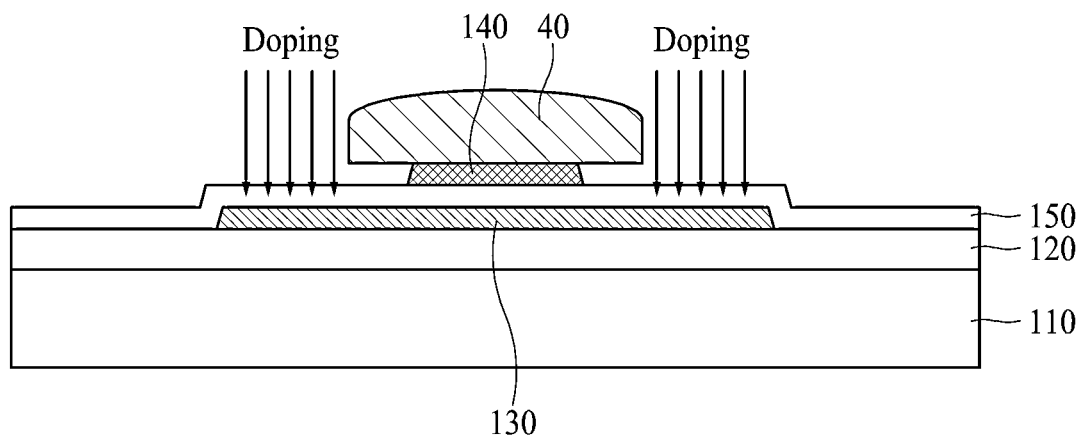

Referring to FIG. 27E, a dopant can be doped on the active layer 130.

The dopant can include at least one of boron (B), phosphorous (P), fluorine (F), and hydrogen (H).

In a dopant doping process, the photoresist pattern 40 can act as a mask. Referring to FIG. 27E, a region, which is not protected by the photoresist pattern 40, of the active layer 130 can be selectively doped.

Figure 27F:
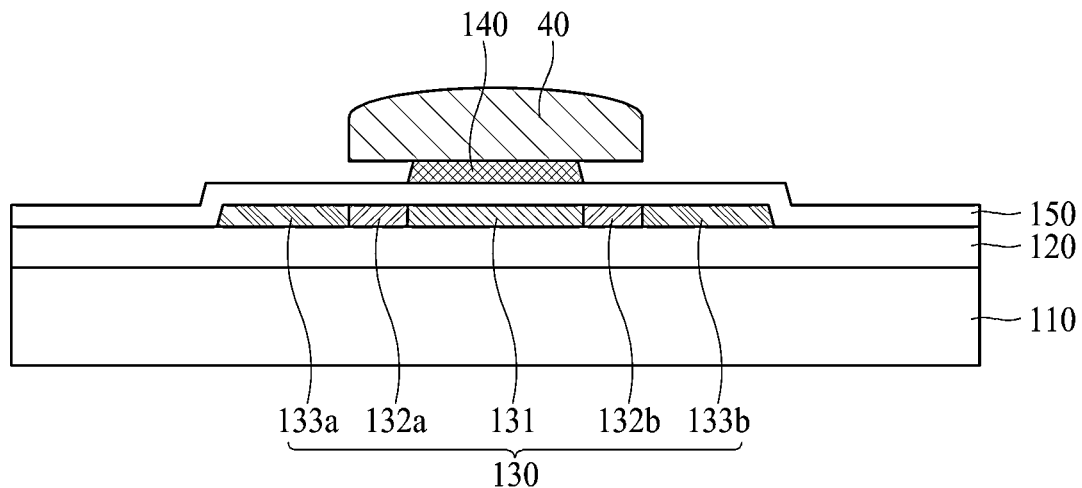

Referring to FIG. 27F, a plurality of conductivity-providing parts 133a and 133b can be formed by doping.

According to an embodiment of the present disclosure, the buffer layer 120 can be doped with a dopant through a doping process.

A dopant concentration of the active layer 130 can be higher than a dopant concentration of the gate insulation layer 150 and a dopant concentration of the buffer layer 120. Here, the dopant concentration of the active layer 130 can denote a dopant concentration of each of the conductivity-providing parts 133a and 133b.

Moreover, the dopant concentration of the buffer layer 120 can be higher than the dopant concentration of the active layer 130 and the dopant concentration of the gate insulation layer 150.

Figure 27G:
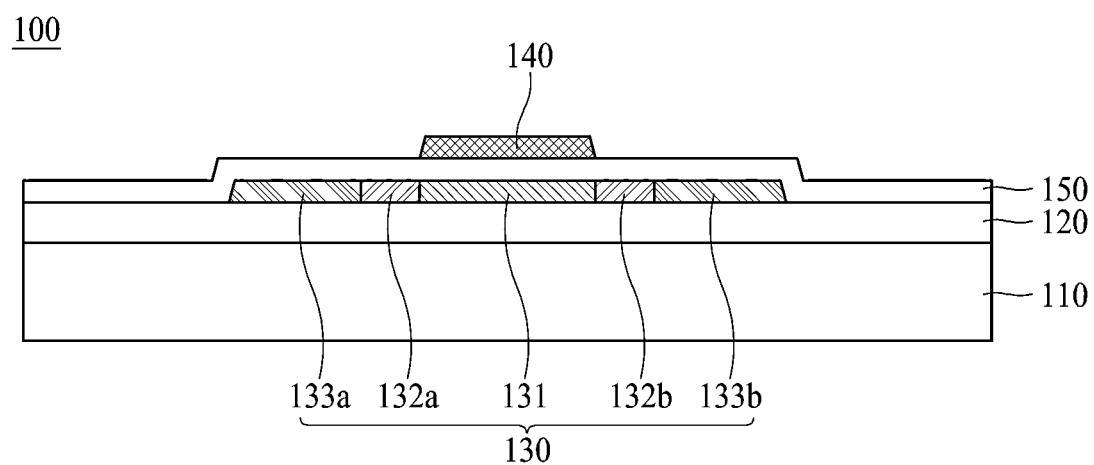

Referring to FIG. 27G, a TFT 100 can be formed by removing the photoresist pattern 40.

Further, the active layer 130 can include a channel part 131 overlapping the gate electrode 140, the plurality of conductivity-providing parts 133a and 133b which do not overlap the gate electrode 140, and a plurality of offset parts 132a and 132b between the channel part 131 and the conductivity-providing parts 133a and 133b.

The channel part 131 and the offset parts 132a and 132b can each be a region which overlapped the photoresist pattern 40.

FIGS. 28A to 28G are process views of a method of manufacturing a TFT, according to another embodiment of the present disclosure.

Figure 28A:
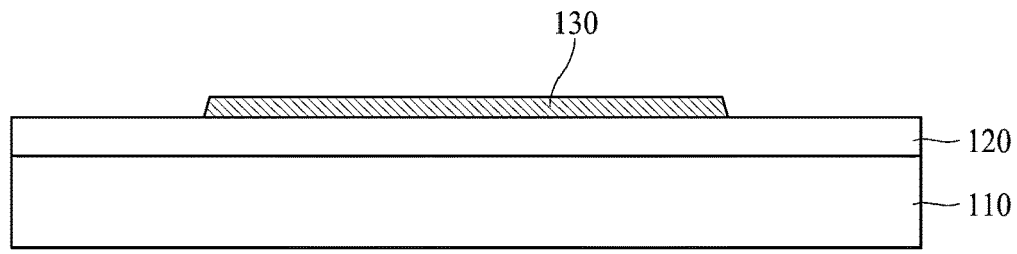
FIGS. 28A to 28G are process views of a method of manufacturing a TFT, according to another embodiment of the present disclosure.

Referring to FIG. 28A, a buffer layer 120 can be formed on a substrate 110, and an active layer 130 can be formed on the buffer layer 120. The active layer 130 can include an oxide semiconductor material. In more detail, the active layer 130 can be an oxide semiconductor layer.

Figure 28B:
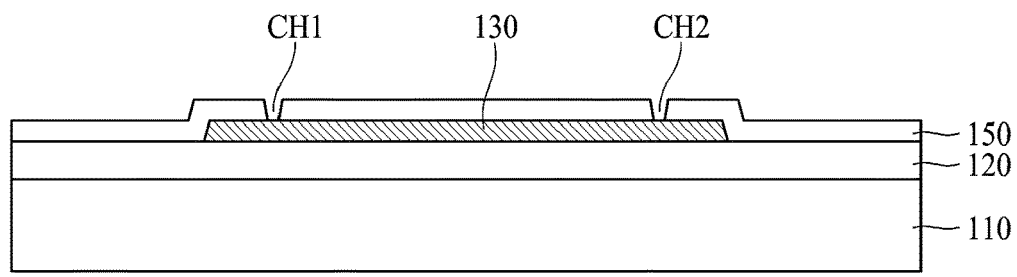

Referring to FIG. 28B, a gate insulation layer 150 can be formed on the active layer 130. Also, a plurality of contact holes CH1 and CH2 can be formed in the gate insulation layer 150.

Figure 28C:
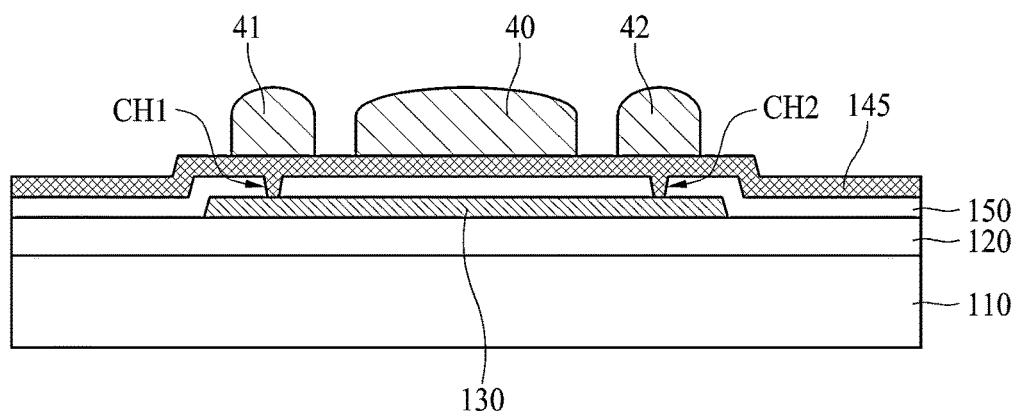

Referring to FIG. 28C, a gate-electrode material layer 145 can be formed on the gate insulation layer 150, and a plurality of photoresist patterns 40, 41, and 42 can be formed on the gate-electrode material layer 145.

The gate-electrode material layer 145 can be filled into the contact holes CH1 and CH2.

Figure 28D:
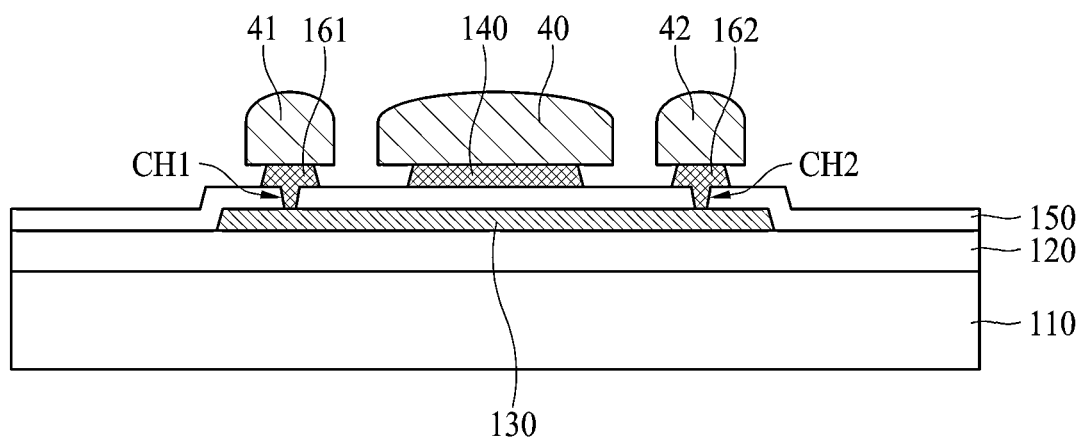

Referring to FIG. 28D, the gate-electrode material layer 145 can be etched by using the photoresist patterns 40, 41, and 42 as a mask. Therefore, a gate electrode 140, a source electrode 161, and a drain electrode 162 can be formed. Referring to FIG. 28D, the gate electrode 140, the source electrode 161, and the drain electrode 162 can be disposed on the same layer and can include the same material.

Figure 28E:
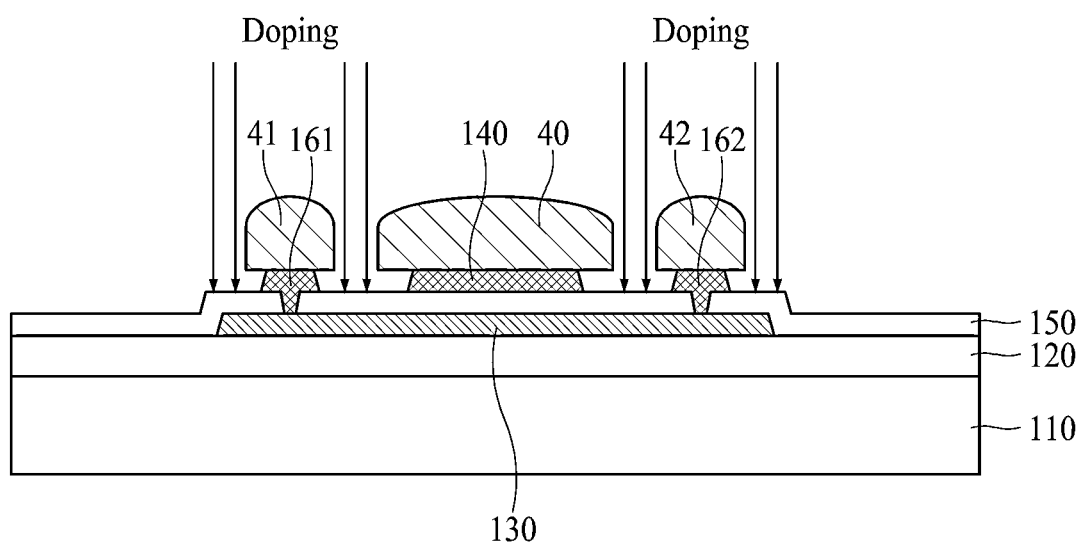

Referring to FIG. 28E, a dopant can be doped on the active layer 130.

The dopant can include at least one of boron (B), phosphorous (P), fluorine (F), and hydrogen (H). Doping can be performed through ion implantation based on at least one of boron (B), phosphorous (P), fluorine (F), and hydrogen (H).

In a dopant doping process, the photoresist patterns 40, 41, and 42 can act as a mask. Referring to FIG. 28E, a region, which is not protected by the photoresist patterns 40, 41, and 42, of the active layer 130 can be selectively doped.

Figure 28F:
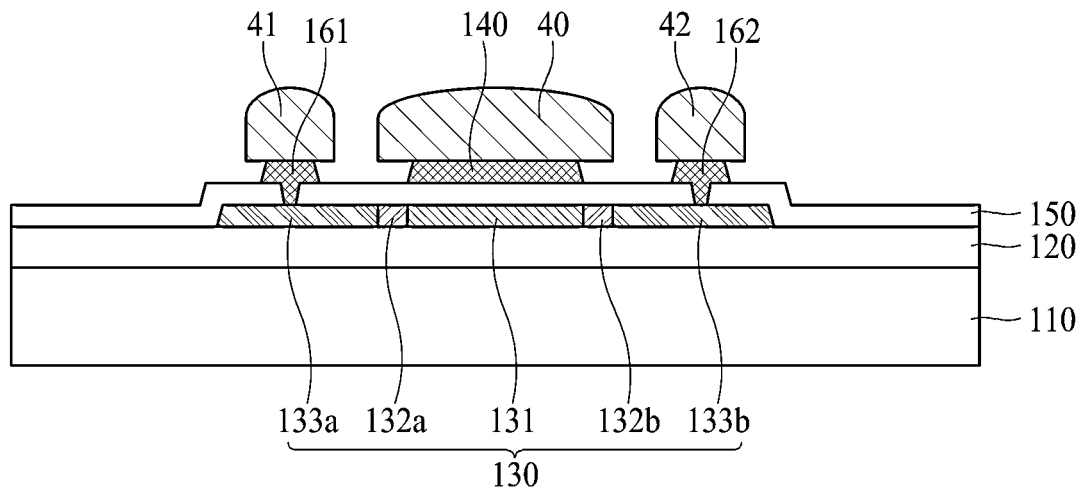

Referring to FIG. 28F, a plurality of conductivity-providing parts 133a and 133b can be formed by doping.

Figure 28G:
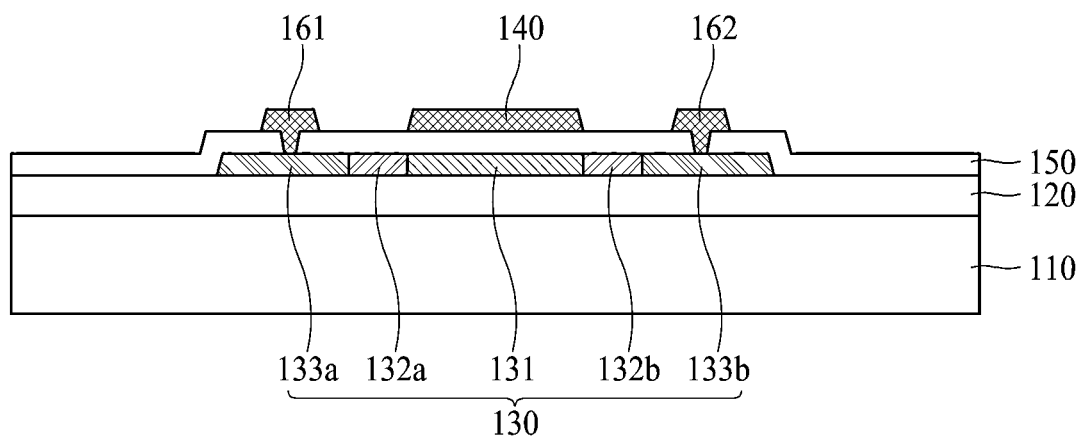

Referring to FIG. 28G, a TFT can be formed by removing the photoresist pattern 40.

Figure 29:
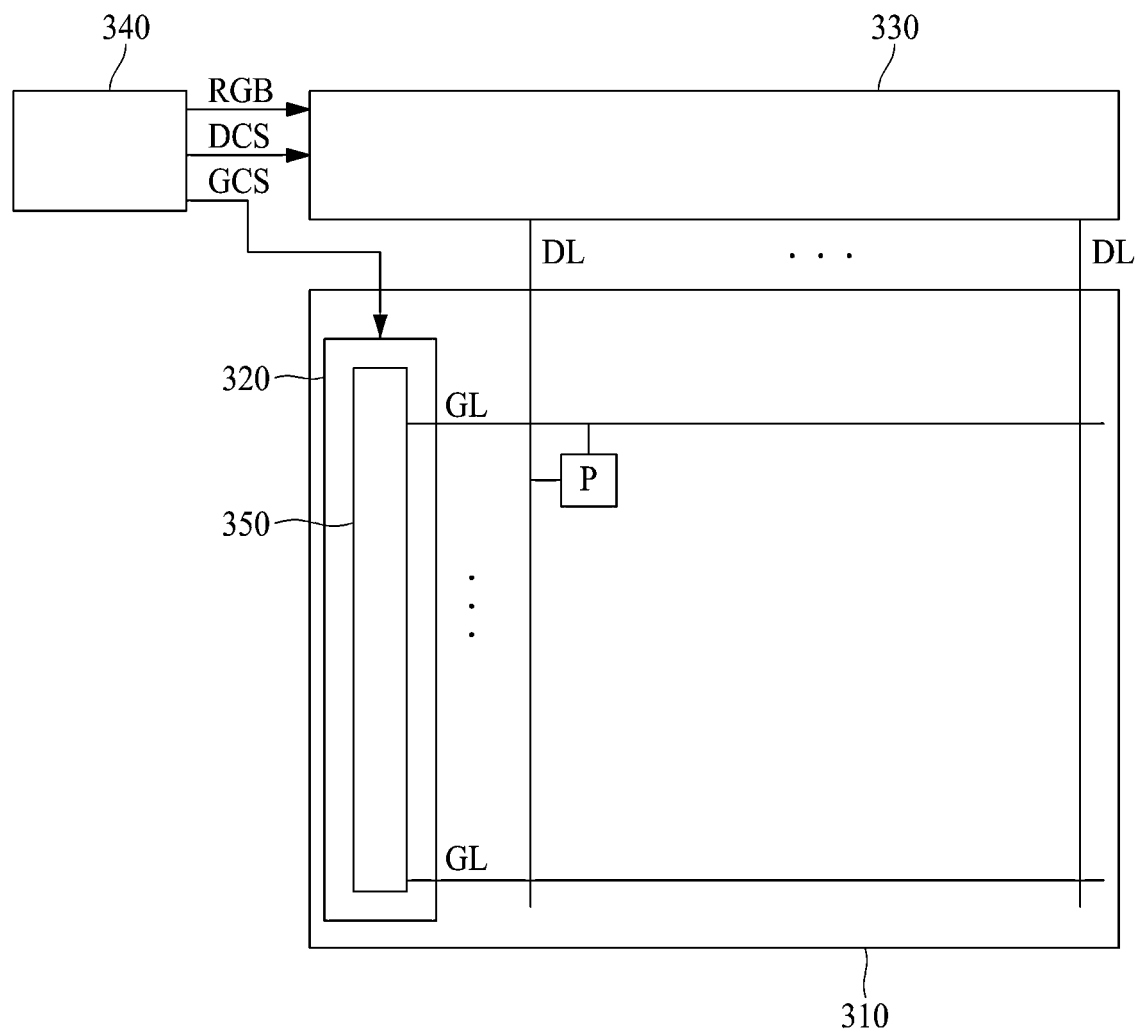
FIG. 29 is a diagram showing a display apparatus according to another embodiment of the present disclosure.

FIG. 29 is a diagram showing a display apparatus 700 according to an embodiment of the present disclosure. All the components of the display apparatus according to all embodiments of the present disclosure are operatively coupled and configured.

The display apparatus 700 according to an embodiment of the present disclosure, as illustrated in FIG. 29, can include a display panel 310, a gate driver 320, a data driver 330, and a controller 340.

The display panel 310 can include a plurality of gate lines GL, a plurality of data lines DL, and a pixel P provided in each of a plurality of pixel areas defined by intersections of the gate lines GL and the data lines DL. The pixel P can include a light emitting device 710 and a pixel driving circuit PDC for driving the light emitting device 710 (see FIG. 30). The display panel 310 can display an image on the basis of driving of the pixel P.

The controller 340 can control the gate driver 320 and the data driver 330.

The controller 340 can output a gate control signal GCS for controlling the gate driver 320 and a data control signal DCS for controlling the data driver 330, based on a synchronization signal and a clock signal supplied from an external system. Also, the controller 340 can sample input video data received from the external system and can realign sampled video data to provide digital image data RGB to the data driver 330.

The gate control signal GCS can include a gate start pulse GSP, a gate shift clock GSC, a gate output enable signal GOE, a start signal Vst, and a gate clock GCLK. Also, the gate control signal GCS can include control signals for controlling the shift register 350.

The data control signal DCS can include a source start pulse SSP, a source shift clock signal SSC, a source output enable signal SOE, and a polarity control signal POL.

The data driver 330 can supply data voltages to the data lines DL of the display panel 330. In detail, the data driver 330 can convert the image data RGB, input from the controller 340, into analog data voltages and can provide data voltages of one horizontal line to the data lines DL at every one horizontal period where a gate pulse GP is supplied to one gate line GL.

The gate driver 320 can include a shift register 350.

The shift register 350 can sequentially provide the gate pulse GP to the gate lines GL during one frame, based on the start signal Vst and the gate clock GCLK transferred from the controller 340. Here, one frame can denote a period where the display panel 310 displays one image. The gate pulse GP can have a turn-on voltage for turning on a switching element (a TFT) disposed in the pixel P.

Moreover, the shift register 350 can supply the gate line GL with a gate-off signal Goff for turning off the switching element, during the other period, where the gate pulse GP is not supplied, of one frame. Hereinafter, a generic name for the gate pulse GP and the gate-off signal Goff can be a scan signal (SS or Scan).

According to an embodiment of the present disclosure, the gate driver 320 can be mounted on the display panel 310. Such a structure, where the gate driver 320 is directly mounted on the display panel 310, can be referred to as a gate-in panel (GIP) structure. The gate driver 320 can include at least one of the TFTs 100 to 500 illustrated in FIGS. 1 to 5.

Figure 30:
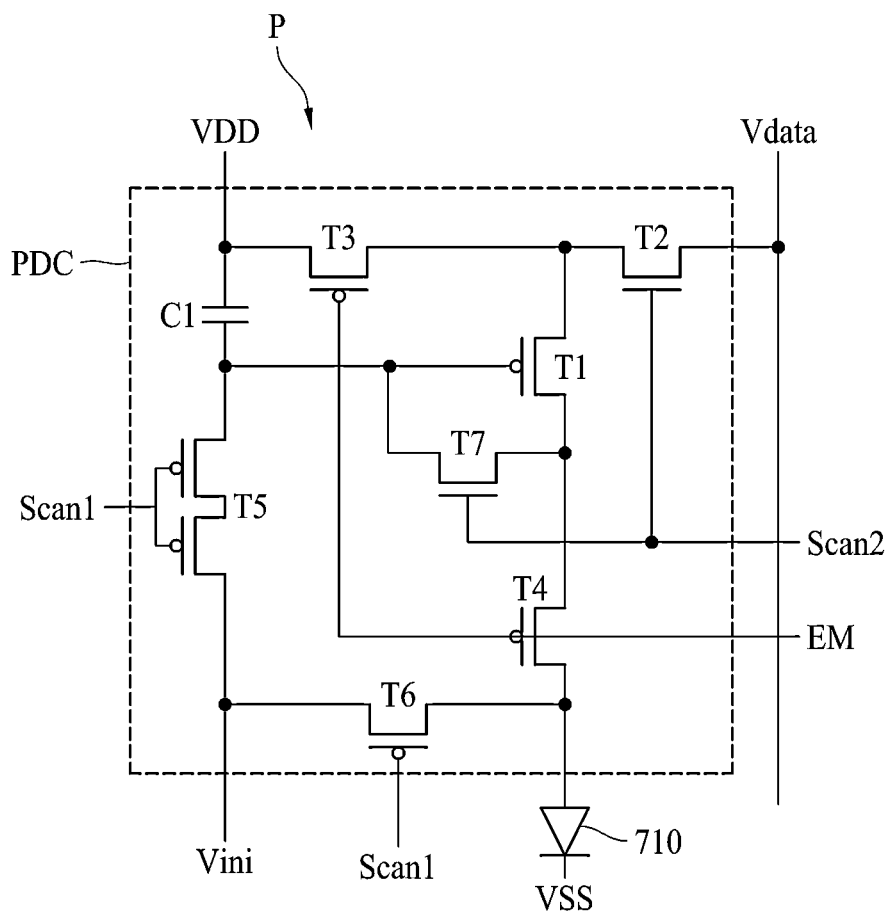
FIG. 30 is a circuit diagram of one pixel of FIG. 29.

FIG. 30 is a circuit diagram of one pixel P of FIG. 29. For example, each pixel P in the display apparatus 700 can have the configuration of the pixel shown in FIG. 30.

Referring to FIG. 30, a pixel P included in the display apparatus 700 according to another embodiment of the present disclosure can include a pixel driving circuit PDC and a light emitting device 710.

The light emitting device 710 can use an organic light emitting diode (OLED). However, an embodiment of the present disclosure is not limited thereto, and the light emitting device 710 can use a quantum dot light emitting device, an inorganic light emitting device, a micro light emitting diode, or the like. The light emitting device 710 can emit light with a data current provided from the pixel driving circuit PDC.

Referring to FIG. 30, the pixel driving circuit PDC can include first to seventh TFTs T1 to T7 (T1, T2, T3, T4, T5, T6, T7) and a first capacitor C1.

An active layer of each of the TFTs (for example, the first TFT T1, the third TFT T3, the fourth TFT T4, the fifth TFT T5, and the sixth TFT T6) of FIG. 30 can include a silicon semiconductor material and can be formed of a silicon semiconductor layer. An active layer of each of the second TFT T2 and the seventh TFT T7 can include, for example, an oxide semiconductor material and can be formed of an oxide semiconductor layer.

According to another embodiment of the present disclosure, the first TFT T1, the third TFT T3, the fourth TFT T4, the fifth TFT T5, and the sixth TFT T6 of FIG. 30 can have the same configuration as that of the first TFT TR1 of FIG. 6, and the second TFT T2 and the seventh TFT T7 can have the same configuration as that of the second TFT TR2 of FIG. 6. Also, at least one of the second TFT T2 and the seventh TFT T7 can have the same structure as that of at least one of the TFTs 100, 200, 300, 400, 500 illustrated in FIGS. 1 to 5.

According to another embodiment of the present disclosure, the first TFT T1, the third TFT T3, the fourth TFT T4, the fifth TFT T5, and the sixth TFT T6 can be disposed under the second TFT T2 and the seventh TFT T7. In detail, the active layer of each of the first TFT T1, the third TFT T3, the fourth TFT T4, the fifth TFT T5, and the sixth TFT T6 can be disposed under the active layer of each of the second TFT T2 and the seventh TFT T7.

Referring to FIG. 30, the first TFT T1 can be a driving TFT, and the second TFT T2 can be a switching TFT.

A gate electrode G2 of the second TFT T2 can be provided with a second scan signal Scan2. A drain electrode D2 of the second TFT T2 can be provided with a data voltage Vdata. A source electrode S2 of the second TFT T2 can be connected to a drain electrode D1 of the first TFT T1. The second TFT T2 can be turned on by the second scan signal Scan2 and can provide the data voltage Vdata to the drain electrode D1 of the first TFT T1.

A gate electrode G3 of the third TFT T3 can be provided with an emission control signal EM. A drain electrode D3 of the third TFT T3 can be provided with a high-level pixel driving voltage VDD. A source electrode S3 of the third TFT T3 can be connected to the drain electrode D1 of the first TFT T1. The third TFT T3 can be turned on by the emission control signal EM and can provide the high-level pixel driving voltage VDD to the drain electrode D1 of the first TFT T1.

A gate electrode G7 of the seventh TFT T7 can be provided with the second scan signal Scan2. A drain electrode D7 of the seventh TFT T7 can be connected to a gate electrode G1 of the first TFT T1. A source electrode S7 of the seventh TFT T7 can be connected to a source electrode S1 of the first TFT T1. The seventh TFT T7 can be turned on by the second scan signal Scan2 and can control a voltage difference between the gate electrode G1 and the source electrode S1 of the first TFT T1 to drive the first TFT T1.

A gate electrode G5 of the fifth TFT T5 can be provided with a first scan signal Scan1. A drain electrode D5 of the fifth TFT T5 can be provided with an initialization voltage Vini. A source electrode S5 of the fifth TFT T5 can be connected to the gate electrode G1 of the first TFT T1. The fifth TFT T5 can be turned on by the first scan signal Scan1 and can provide the initialization voltage Vini to the gate electrode G1 of the first TFT T1.

A gate electrode G4 of the fourth TFT T4 can be provided with the emission control signal EM. A drain electrode D4 of the fourth TFT T4 can be connected to the source electrode S1 of the first TFT T1. A source electrode S4 of the fourth TFT T4 can be connected to a pixel electrode 711 (see FIG. 32) of the light emitting device 710. The fourth TFT T4 can be turned on by the emission control signal EM and can provide a driving current to the pixel electrode 711 of the light emitting device 710. Here, the light emitting device 710 can be an OLED, and the pixel electrode 711 can be an anode electrode of the OLED.

A gate electrode G6 of the sixth TFT T6 can be provided with the first scan signal Scan1. A drain electrode D6 of the sixth TFT T6 can be provided with the initialization voltage Vini. A source electrode S6 of the sixth TFT T6 can be connected to the pixel electrode 711 of the light emitting device 710. The sixth TFT T6 can be turned on by the first scan signal Scan1 and can provide the initialization voltage Vini to the pixel electrode 711 of the light emitting device 710.

The gate electrode G1 of the first TFT T1 can be connected to the drain electrode D7 of the seventh TFT T7. The source electrode S1 of the first TFT T1 can be connected to the source electrode S7 of the seventh TFT T7. The first TFT T1 can be turned on by a voltage difference between the source electrode S7 and the drain electrode D7 of the seventh TFT T7 and can provide a driving current to the light emitting device 710.

One side of the first capacitor C1 can be provided with the high-level pixel driving voltage VDD. The other side of the first capacitor C2 can be connected to the gate electrode G1 of the first TFT T1. The first capacitor C1 can store a voltage at the gate electrode G1 of the first TFT T1.

The pixel electrode 711 of the light emitting device 710 can be connected to the source electrode S4 of the fourth TFT T4 and the source electrode S6 of the sixth TFT T6. A common electrode 713 (see FIG. 32) of the light emitting device 710 can be provided with a low-level driving voltage VSS. The light emitting device 710 can emit light having brightness on the basis of a driving current flowing in the first TFT T1.

Referring to FIG. 30, when turning on the fifth TFT T5 which provides the initialization voltage Vini, the pixel driving circuit PDC can turn off the fourth TFT T4 connecting the source electrode S1 of the first TFT T1 to the pixel electrode 711 of the light emitting device 710 by using the emission control signal and the scan signal to prevent a driving current of the first TFT T1 from flowing to the pixel electrode 711 of the light emitting device 710 and can configure a pixel circuit so that the pixel electrode 711 is not affected by a voltage other than a voltage for resetting the anode electrode (the pixel electrode).

The initialization voltage Vini can be supplied to the pixel electrode 711 of the light emitting device 710 in a state where the fourth TFT T4 disposed between the pixel electrode 711 of the light emitting device 710 and the first TFT T1 and controlled by the emission control signal EM is turned off. The sixth TFT T6 for providing the initialization voltage Vini can be connected to the pixel electrode 711 of the light emitting device 710.

Figure 31:
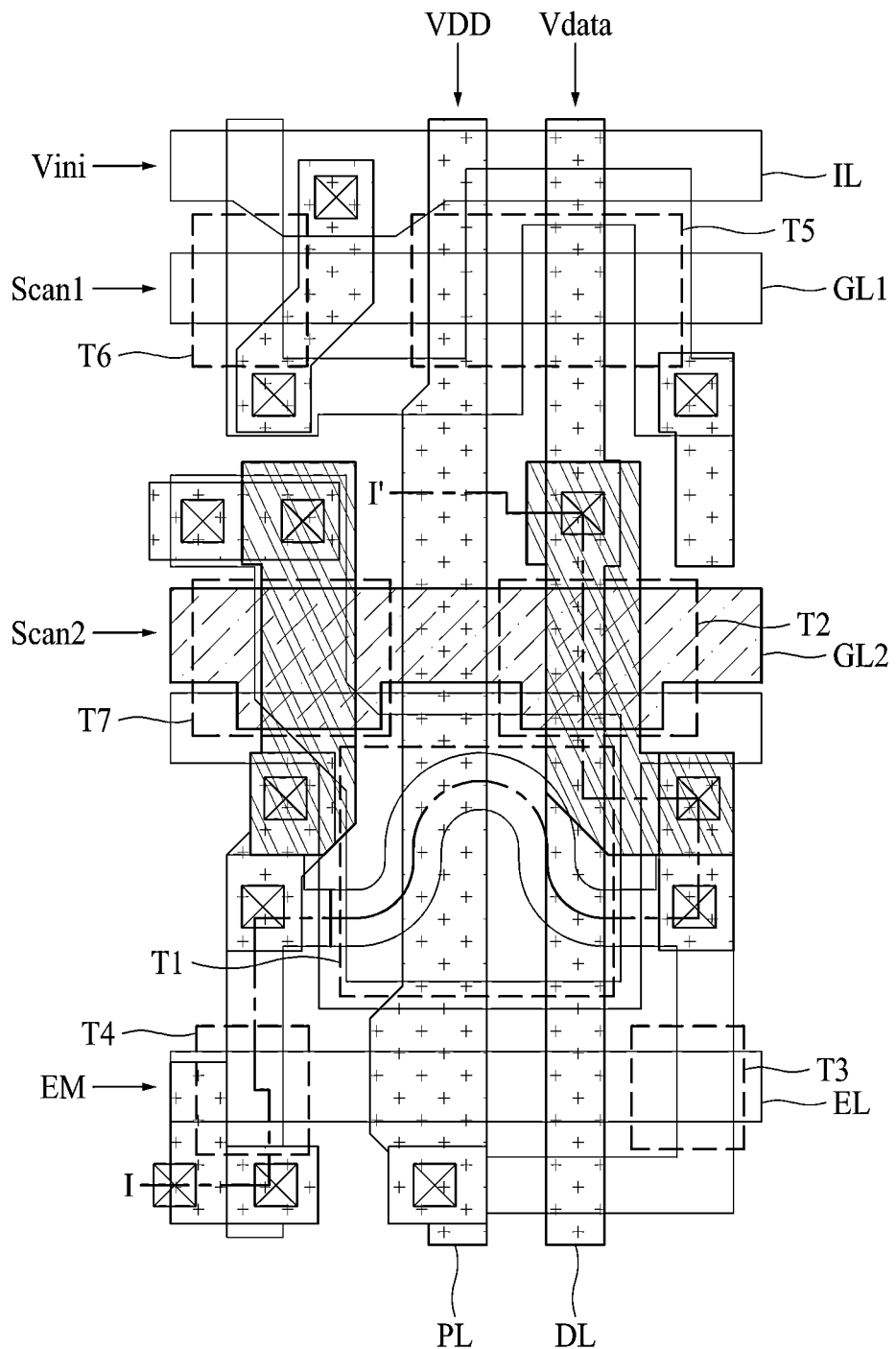
FIG. 31 is a plan view of a pixel of FIG. 30.
Figure 32:
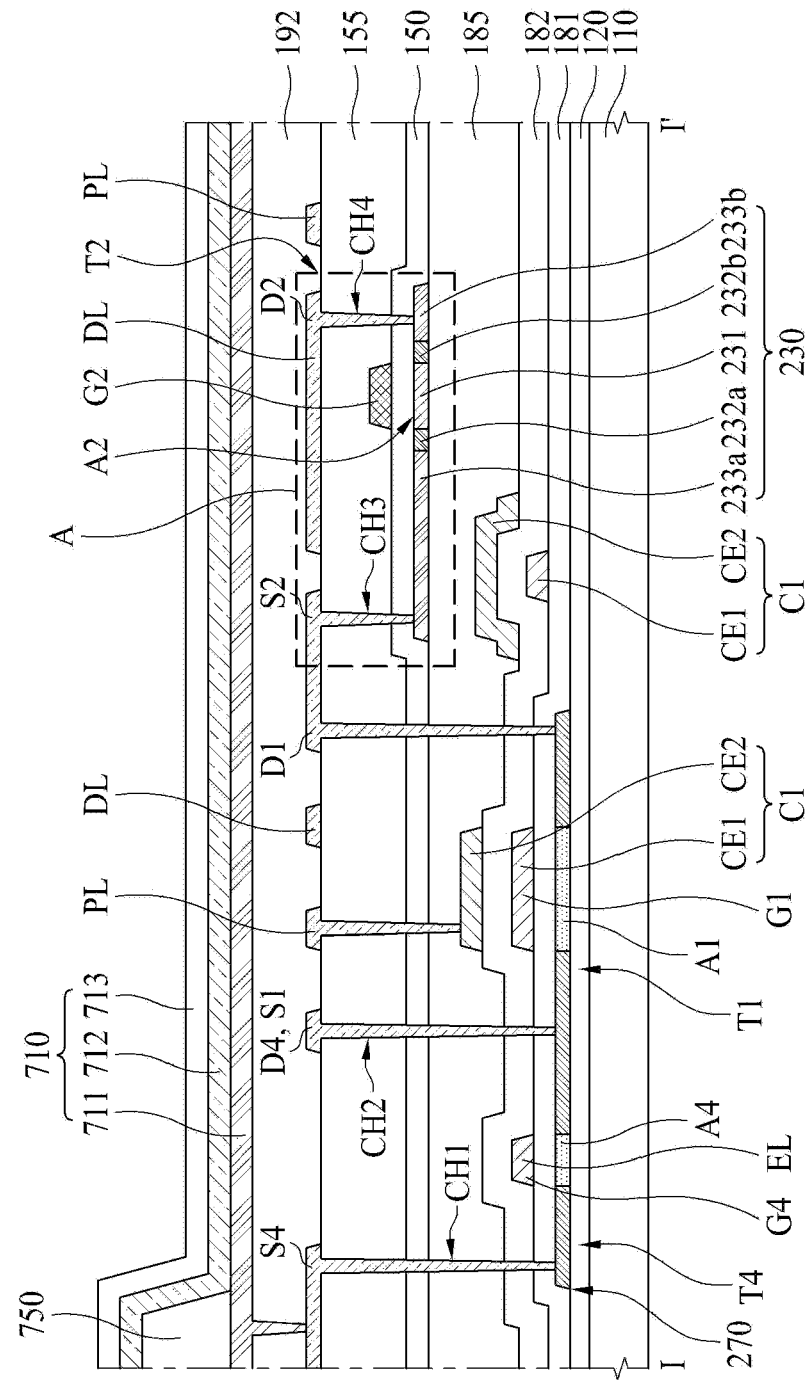
FIG. 32 is a cross-sectional view taken along line I-I' of FIG. 31.

FIG. 31 is a plan view of the pixel P of FIG. 30, and FIG. 32 is a cross-sectional view taken along line I-I' of FIG. 31.

Referring to FIGS. 30, 31, and 32, the display apparatus 700 according to another embodiment of the present disclosure can include a substrate (or base substrate) 110, a pixel driving circuit PDC on the substrate 110, and a light emitting device 710 connected to the pixel driving circuit PDC, and the pixel driving circuit PDC can include a TFT. The pixel driving circuit PDC can include at least one of the TFTs 100 to 500 illustrated in FIGS. 1 to 5.

Hereinafter, a structure of a pixel P will be described in more detail with reference to FIGS. 31 and 32.

Referring to FIG. 32, a buffer layer 120 can be disposed on a substrate 110, and a first active layer 270 can be disposed on the buffer layer 120. The first active layer 270 can include a silicon semiconductor material. For example, the first active layer 270 can be formed of a polycrystalline silicon semiconductor layer.

A portion of the first active layer 270 can include a channel part A1 of a first TFT T1 and a channel part A4 of a fourth TFT T4, and the other portion thereof can have conductivity and can act as a wiring line. The other portion of the first active layer 270 can include a channel part of each of a third TFT T3, a fifth TFT T5, and a sixth TFT T6.

A gate insulation layer 181 can be disposed on the first active layer 270.

A first gate electrode G1 of the first TFT T1 and a fourth gate electrode G4 of the fourth TFT T4 can be disposed on the gate insulation layer 181. The first gate electrode G1 can act as a first electrode CE1 of a first capacitor C1.

The gate insulation layer 181 between the first active layer 270 and the first gate electrode G1 can be referred to as a first gate insulation layer.

A passivation layer 182 can be disposed on the gate electrodes G1 and G4 and the first electrode CE1 of the first capacitor C1.

A second electrode CE2 of the first capacitor C1 can be disposed on the passivation layer 182. Accordingly, the first capacitor C1 can be completed.

A middle layer 185 can be disposed on the second electrode CE2 of the first capacitor C1. The middle layer 185 can be an organic material layer for planarizing an upper portion of the second electrode CE2 of the first capacitor C1. However, the present disclosure is not limited thereto, and the middle layer 185 can be formed of a single layer, including nitride silicon (SiNx) or oxide silicon (SiOx), or a multilayer thereof.

A second active layer 230 can be disposed on the middle layer 185 and can include an oxide semiconductor material. The second active layer 230 can be an oxide semiconductor layer.

For example, the second active layer 230 can be formed of an oxide semiconductor layer and can include a channel part 231 and a plurality of conductivity-providing parts 233a and 233b. Also, the second active layer 230 can include a plurality of offset parts 232a and 232b disposed between the channel part 231 and the conductivity-providing parts 233a and 233b.

A portion of the second active layer 230 can include a channel part A2 of a second TFT T2, and the other portion can have conductivity and can act as a wiring line. In detail, the conductivity-providing parts 233a and 233b of the second active layer 230 can each act as a wiring line.

A portion of the second active layer 230 can include a channel part of a seventh TFT T7.

According to another embodiment of the present disclosure, at least one of the TFTs 100 to 500 illustrated in FIGS. 1 to 5 can be applied to at least one of the second TFT T2 and the seventh TFT T7 of the display apparatus 700 according to another embodiment of the present disclosure.

A gate insulation layer 150 can be disposed on the second active layer 230. Referring to FIG. 32, the gate insulation layer 150 can cover a top surface of the second active layer 230. The gate insulation layer 150 can be disposed on a whole surface of the substrate 110 including the second active layer 230.

A second gate electrode G2 of the second TFT T2 can be disposed on the gate insulation layer 150. The second gate electrode G2 can overlap a channel part A2 of the second TFT T2. For example, the second gate electrode G2 can overlap a channel part 231 of the second active layer 230 and may not overlap the conductivity-providing parts 233a and 233b and the offset parts 232a and 232b.

The gate insulation layer 150 between the second active layer 230 and the second gate electrode G2 can be referred to as a second gate insulation layer.

An interlayer insulation layer 155 can be disposed on the second gate electrode G2 of the second TFT T2. The interlayer insulation layer 155 can include an insulating material.

Source electrodes and drain electrodes of the first to seventh TFTs T1 to T7 can be disposed on the interlayer insulation layer 155, and a plurality of bridges for connecting electrodes to wiring lines can be disposed on the interlayer insulation layer 155.

Moreover, a data line DL and a pixel driving voltage line PL can be disposed on the interlayer insulation layer 155. A data voltage Vdata can be supplied through the data line DL, and a high-level pixel driving voltage VDD can be supplied through the pixel driving voltage line PL.

Source electrodes S1, S2, and S4 and drain electrodes D1, D2, and D4 can be connected to the first active layer 270 or the second active layer 230 through a contact hole. For example, a fourth source electrode S4 of the fourth TFT T4 can be connected to the first active layer 270 through a first contact hole CH1. Also, a fourth drain electrode D4 of the fourth TFT T4 can be connected to the first active layer 270 through a second contact hole CH2. Also, a second source electrode S2 of the second TFT T2 can be connected to the second active layer 230 through a third contact hole CH3. Also, a second drain electrode D2 of the second TFT T2 can be connected to the second active layer 230 through a fourth contact hole CH4.

Referring to FIG. 32, the interlayer insulation layer 155 can be formed, and then, a first contact hole CH1, a second contact hole CH2, a third contact hole CH3, and a fourth contact hole CH4 each exposing the first active layer 270 and the second active layer 230 can be formed. Also, after the first contact hole CH1, the second contact hole CH2, the third contact hole CH3, and the fourth contact hole CH4 are formed, a high temperature thermal treatment process can be performed at a high temperature of 350° C. or more, for dehydrogenating the first active layer 270 including poly-Si. Due to the high temperature thermal treatment process, an oxygen vacancy can occur in the second active layer 230 including an oxide semiconductor. Also, dopants such as boron (B), phosphorous (P), fluorine (F), and hydrogen (H) can be diffused by the oxygen vacancy, and thus, a conductivity-providing region can extend to the channel part A2 of the second active layer 230. Accordingly, due to the high temperature thermal treatment process performed at a high temperature of 350° C. or more, the conductivity-providing region can extend, and the second TFT T2 can be degraded.

Therefore, in manufacturing the display apparatus 700 including the fourth TFT T4 including poly-Si and the second TFT T2 including an oxide semiconductor, an ion doping process of providing conductivity to the second active layer 230 can be performed after a process of exposing the first active layer 270 and the second active layer 230 and the high temperature thermal treatment process.

Figure 33A:
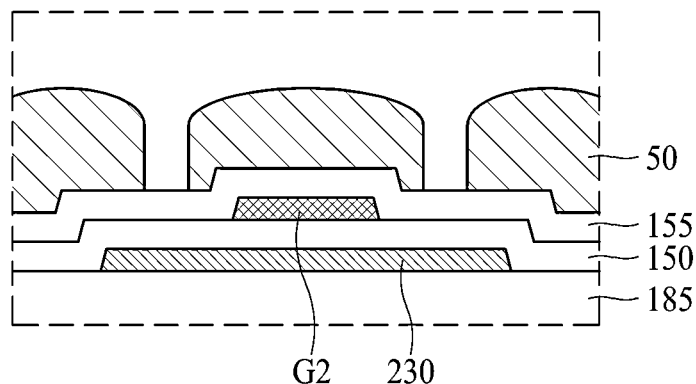
FIGS. 33A to 33C are process views of a method of manufacturing a TFT, according to another embodiment of the present disclosure.
Figure 33B:
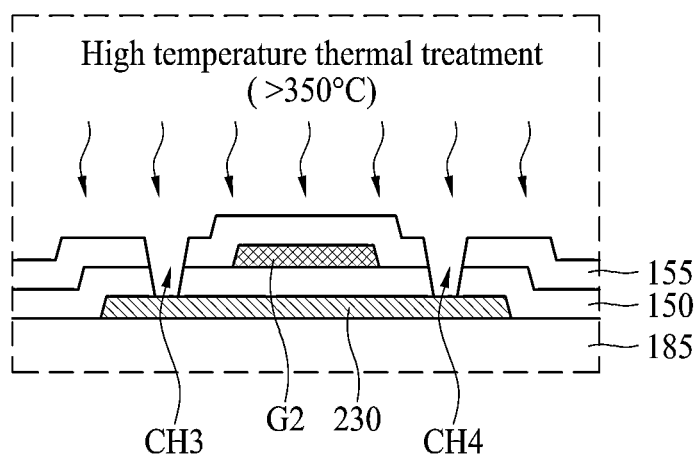
Figure 33C:
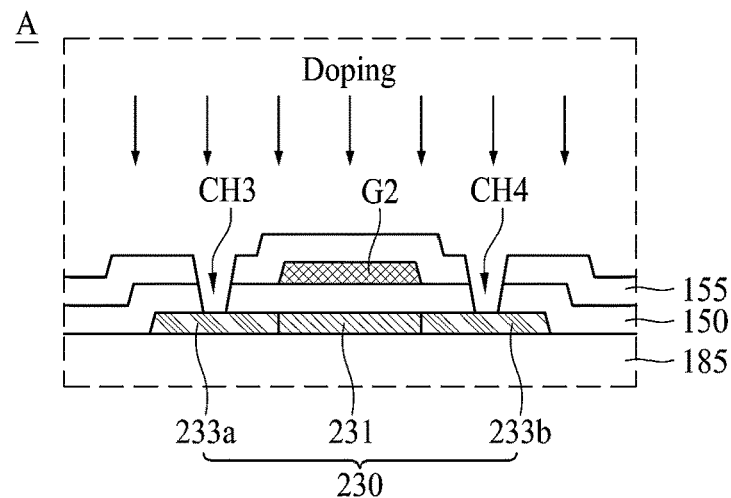

FIGS. 33A to 33C are process views illustrating some processes performed on the second TFT T2 corresponding to a region A in FIG. 32.

Referring to FIG. 33A, a second active layer 230 can be formed on a middle layer 185. Also, a gate insulation layer 150 can be formed on the second active layer 230. Also, a gate electrode G2 can be formed on the gate insulation layer 150. An interlayer insulation layer 155 can be formed on the gate electrode G2 and the gate insulation layer 150. Also, as illustrated in FIG. 33A, a photoresist pattern 50 can be formed for forming a contact hole for exposing the second active layer 230. The photoresist pattern 50 can include an opening region which exposes a top surface of the interlayer insulation layer 155, for forming a contact hole. Also, an etching process can be performed for forming a contact hole through the opening region of the photoresist pattern 50. The interlayer insulation layer 155 and the gate insulation layer 150 can be removed through the etching process.

By performing an etching process, as illustrated in FIG. 33B, a third contact hole CH3 and a fourth contact hole CH4 each exposing the second active layer 230 can be formed in the interlayer insulation layer 155 and the gate insulation layer 150. A first contact hole CH1 and a second contact hole CH2 each exposing a first active layer 270 of a fourth TFT T4 can be formed in the etching process. As described above, after the first contact hole CH1, the second contact hole CH2, the third contact hole CH3, and the fourth contact hole CH4 are formed, a high temperature thermal treatment process can be performed at a high temperature of 350° C. or more, for dehydrogenating a first active layer 270.

Subsequently, as illustrated in FIG. 33C, after the high temperature thermal treatment process is performed, an ion doping process can be performed by using the gate electrode G2 as a mask.

Moreover, a plurality of conductivity-providing parts 233a and 233b having conductivity based on the ion doping process and a channel part 231 overlapping a gate electrode G2 can be formed in the second active layer 230 through an ion doping process.

Moreover, as in FIG. 32, a source electrode S2 and a drain electrode D2 of the second TFT T2 and a source electrode S4 and a drain electrode D4 of the fourth TFT T4 can be formed. Also, the source electrode S2 and the drain electrode D2 of the second TFT T2 can be connected to the second active layer 230 through the third contact hole CH3 and the fourth contact hole CH4. Also, the source electrode S4 and the drain electrode D4 of the fourth TFT T4 can be connected to the first active layer 270 through the first contact hole CH1 and the second contact hole CH2.

The source electrodes S1 and S4 and the drain electrodes D1 and D4 each connected to the first active layer 270 and the source electrode S2 and the drain electrode D2 each connected to the second active layer 230 can be simultaneously formed through the same process.

A planarization layer 192 can be disposed on the source electrodes S1, S2, and S4, the drain electrodes D1, D2, and D4, a bridge, a data line DL, and a pixel driving voltage line PL.

A pixel electrode 711 of a light emitting device 710 can be disposed on the planarization layer 192. The pixel electrode 711 can be referred to as an anode electrode or a first electrode. The pixel electrode 711 can be connected to the first active layer 270. Referring to FIGS. 30 and 31, the pixel electrode 711 can be connected to the first active layer 270 through the fourth source electrode S4 of the fourth TFT T4.

A bank layer 750 can be disposed at an edge of the pixel electrode 711. The bank layer 750 can define an emission area of the light emitting device 710.

A light emitting layer 712 can be disposed on the pixel electrode 711, and a common electrode 713 can be disposed on the light emitting layer 712. The common electrode 713 can be referred to as a cathode electrode or a second electrode. Therefore, the light emitting device 710 can be completed. The light emitting device 710 illustrated in FIG. 32 can be an OLED, and the display apparatus 700 according to another embodiment of the present disclosure can be an organic light emitting display apparatus.

Figure 34:
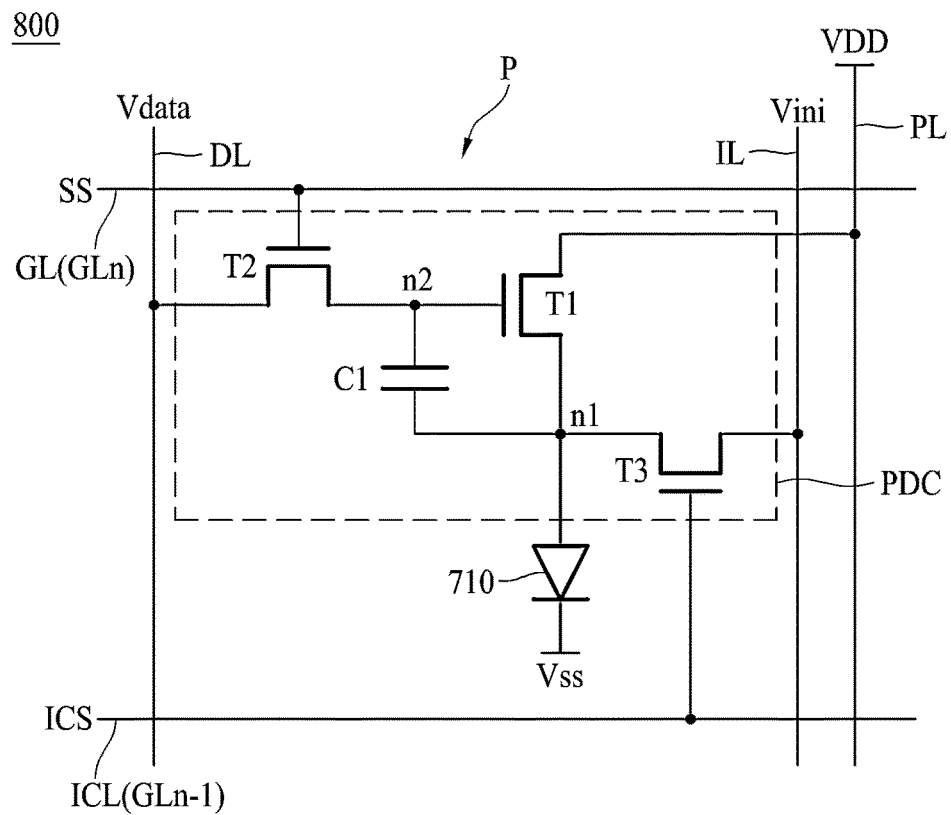
FIG. 34 is a circuit diagram of one pixel of a display apparatus according to another embodiment of the present disclosure.

FIG. 34 is a circuit diagram of a pixel P of a display apparatus 800 according to another embodiment of the present disclosure.

The pixel P of the display apparatus 800 illustrated in FIG. 34 can include an OLED which is a light emitting device 710 and a pixel driving circuit PDC for driving the light emitting device 710. The light emitting device 710 can be connected to the pixel driving circuit PDC.

The pixel driving circuit PDC can be connected to a gate line GL, an initialization control line ICL, a data line DL, a pixel driving voltage line PL, and an initialization voltage line IL and can supply a data current, corresponding to a data voltage Vdata supplied to the data line DL, to the light emitting device 710.

The data voltage Vdata can be supplied to the data line DL, a scan signal SS can be supplied to the gate line GL, a pixel driving voltage VDD can be supplied to the pixel driving voltage line PL, an initialization voltage Vini can be supplied to the initialization voltage line IL, and an initialization control signal ICS can be supplied to the initialization control line ICL.

Referring to FIG. 34, when a gate line of an $n^{th}$ pixel P is referred to by GLn, a gate line of an n-$1^{th}$ pixel P adjacent thereto can be referred to by GLn-1, and the gate line GLn-1 of the n-$1^{th}$ pixel P can act as an initialization control line ICL of the $n^{th}$ pixel P.

The pixel driving circuit PDC, for example, as illustrated in FIG. 34, can include a second TFT T2 (a switching transistor) connected to the gate line GL and the data line DL, a first TFT T1 (a driving transistor) for controlling a level of a current output to the light emitting device 710 on the basis of the data voltage Vdata transferred through the second TFT T2, and a third TFT T3 (an initialization transistor) for sensing a characteristic of the first TFT T1.

A first capacitor C1 can be disposed between the gate electrode of the first TFT T1 and the light emitting device 710. The first capacitor C1 can be referred to as a storage capacitor Cst.

The second TFT T2 can be turned on by the scan signal SS supplied through the gate line GL and can transfer the data voltage Vdata, supplied through the data line DL, to the gate electrode of the first TFT T1.

The third TFT T3 can be connected to the initialization voltage line IL and a first node n1 between the first TFT T1 and the light emitting device 710 and can be turned on or off by the initialization control signal ICS to sense a characteristic of the first TFT T1 (the driving transistor) during a sensing period.

A second node n2 connected to the gate electrode of the first TFT T1 can be connected to the second TFT T2. The first capacitor C1 can be formed between the second node n2 and the first node n1.

When the second TFT T2 is turned on, the data voltage Vdata supplied through the data line DL can be supplied to the gate electrode of the first TFT T1. The data voltage Vdata can be charged into the capacitor C1 formed between the gate electrode and a source electrode of the first TFT T1.

When the first TFT T1 is turned on, a current can be transferred through the first TFT T1 from the pixel driving voltage VDD, and thus, light can be emitted from the light emitting device 710.

Figure 35:
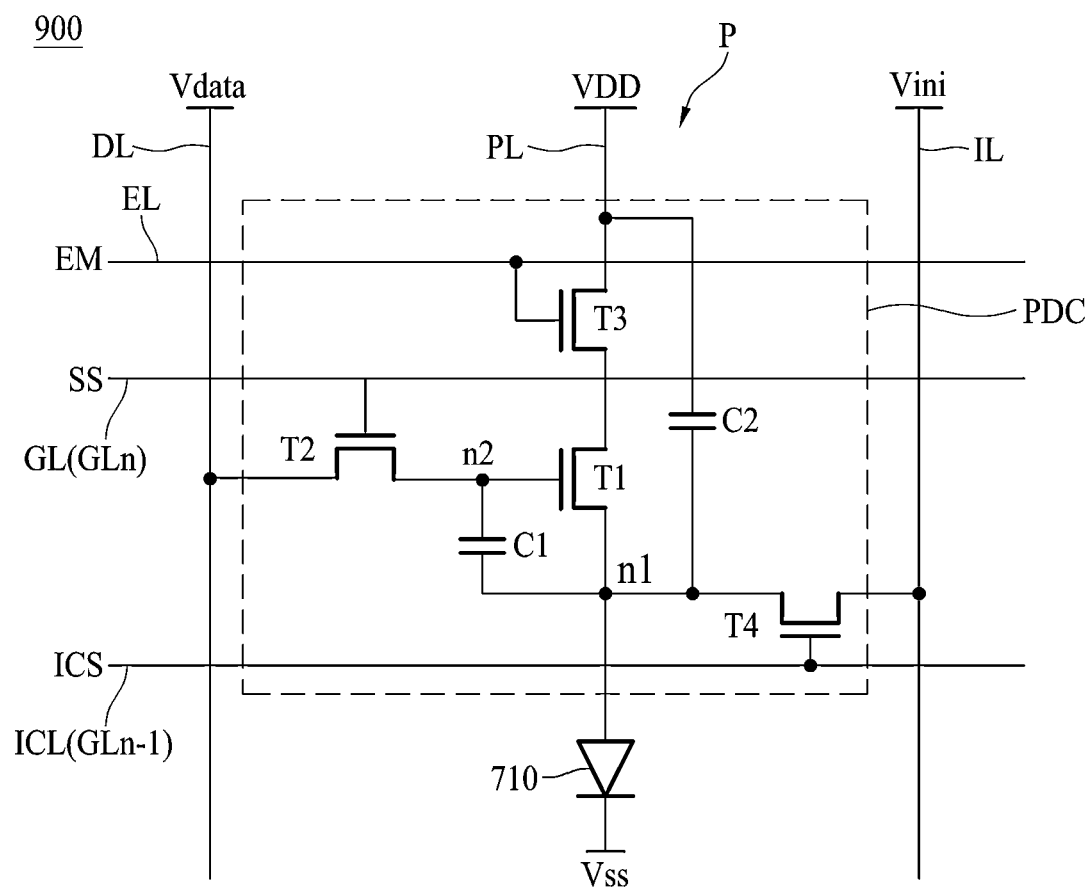
FIG. 35 is a circuit diagram of one pixel of a display apparatus according to another embodiment of the present disclosure.

FIG. 35 is a circuit diagram of a pixel P of a display apparatus 900 according to another embodiment of the present disclosure.

The pixel P of the display apparatus 900 illustrated in FIG. 35 can include an OLED which is a light emitting device 710 and a pixel driving circuit PDC for driving the light emitting device 710.

The pixel driving circuit PDC can include a plurality of TFTs (for example, first to fourth TFTs) T1 to T4.

A plurality of signal lines DL, EL, GL, PL, ICL, and IL for supplying a plurality of driving signals to the pixel driving circuit PDC can be disposed in the pixel P.

Comparing with the pixel P of FIG. 34, the pixel P of FIG. 35 can further include an emission control line EL. An emission control signal EM can be supplied to the emission control line EL. Also, comparing with the pixel driving circuit PDC of FIG. 34, the pixel driving circuit PDC of FIG. 35 can further include a third TFT T3 which is an emission control transistor for controlling an emission time of the first TFT T1.

However, another embodiment of the present disclosure is not limited thereto. The pixel driving circuit PDC can be provided in various structures which differ from an above-described structure. The pixel driving circuit PDC, for example, can include five or six TFTs.

Referring to FIG. 35, when a gate line of an nth pixel P is referred to by GLn, a gate line of an n-$1^{th}$ pixel P adjacent thereto can be referred to by GLn-1, and the gate line GLn-1 of the n-$1^{th}$ pixel P can act as an initialization control line ICL of the $n^{th}$ pixel P.

A first capacitor C1 can be disposed between a gate electrode of the first TFT T1 and one electrode of the light emitting device 710. Also, a second capacitor C2 can be disposed between the one electrode of the light emitting device 710 and a terminal supplied with a pixel driving voltage VDD among terminals of the third TFT T3.

The second TFT T2 can be turned on by a scan signal SS supplied through a gate line GL and can transfer a data voltage Vdata, supplied through a data line DL, to the gate electrode of the first TFT T1.

The fourth TFT T4 can be connected to an initialization voltage line IL and can be turned on or off by an initialization control signal ICS to sense a characteristic of the first TFT T1 (a driving transistor) during a sensing period.

The third TFT T3 can transfer the pixel driving voltage VDD to the first TFT T1 or can cut off the pixel driving voltage VDD, based on the emission control signal EM. When the third TFT T3 is turned on, a current can be supplied to the first TFT T1, and thus, light can be emitted from the light emitting device 710.

According to another embodiment of the present disclosure, the second TFT T2 and the third TFT T3 can overlap each other, and a shield electrode can be disposed between the second TFT T2 and the third TFT T3. The shield electrode can be connected to the emission control line EL. Also, the gate line GL and the emission control line EL can be disposed to overlap each other.

Figure 36:
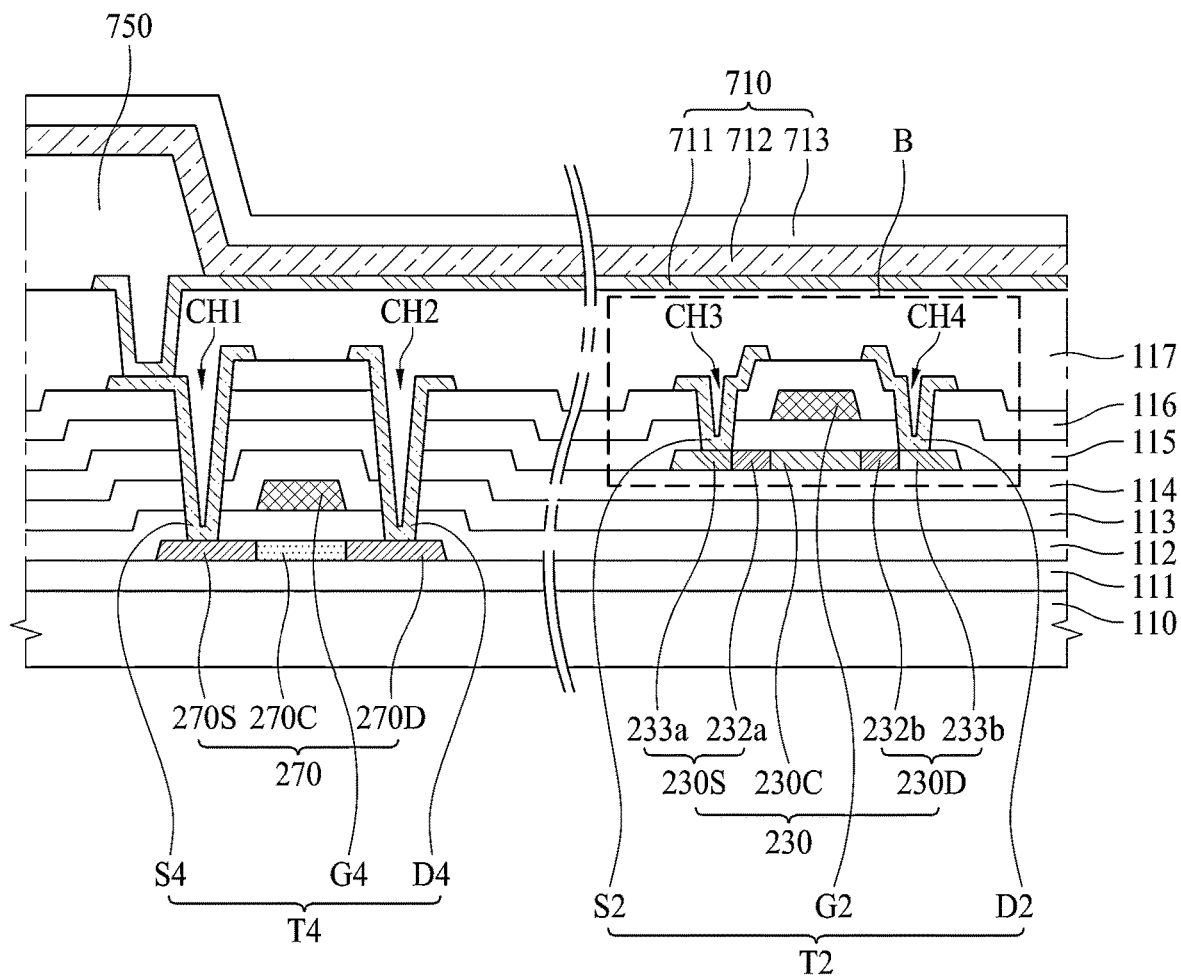
FIG. 36 is a cross-sectional view of a display apparatus according to another embodiment of the present disclosure.

FIG. 36 is a cross-sectional view illustrating another embodiment of the present disclosure.

Referring to FIG. 36, only a cross-sectional view of each of a second TFT T2 and a fourth TFT T4 according to an embodiment of the present disclosure is illustrated.

A display apparatus 10 according to an embodiment of the present disclosure can include a substrate 110, a first buffer layer 111, a first gate insulation layer 112, a first interlayer insulation layer 113, a second buffer layer 114, a second gate insulation layer 115, a second interlayer insulation layer 116, a passivation layer 117, a bank layer 750, a light emitting device 710, an encapsulation member, a second TFT T2, and a fourth TFT T4.

The substrate 110 can support various elements of the display apparatus 10. The substrate 110 can include glass or a plastic material having flexibility. In a case where the substrate 110 includes a plastic material, the substrate 110 can include, for example, polyimide (PI). In a case where the substrate 110 includes polyimide (PI), a process of manufacturing the display apparatus 10 can be performed under a condition where a supporting substrate including glass is disposed under the substrate 110, and after the process of manufacturing the display apparatus 10 is completed, the supporting substrate can be released. Also, after the supporting substrate is released, a back plate for supporting the substrate 110 can be disposed under the substrate 110.

In a case where the substrate 110 includes polyimide (PI), a water component can penetrate the substrate 110 including polyimide (PI) and can permeate up to a TFT or the light emitting device 710, causing a reduction in performance of the display apparatus 10. The display apparatus 10 according to another embodiment of the present disclosure can include double polyimide (PI), for preventing performance thereof from being reduced by water permeation. Also, an inorganic insulation layer can be formed between two polyimides, and thus, can prevent a water component from penetrating lower polyimide, thereby enhancing the reliability of a display apparatus.

Moreover, in a case where the inorganic insulation layer is formed between two polyimides, an electric charge charged into polyimide disposed at a lower portion can form a back bias to affect the second TFT T2 or the fourth TFT T4. Therefore, it can be required to form a separate metal layer, for blocking an electric charge charged into polyimide. However, in the display apparatus 10 according to another embodiment of the present disclosure, since the inorganic insulation layer is formed between two polyimides, the inorganic insulation layer can block an electric charge charged into polyimide disposed at a lower portion, thereby enhancing the reliability of a product. The inorganic insulation layer can be formed of a single layer, including nitride silicon (SiNx) or oxide silicon (SiOx), or a multilayer thereof. For example, the inorganic insulation layer can include silica or silicon dioxide ($SiO_2$). Also, a process of forming a metal layer can be omitted for blocking an electric charge charged into polyimide, thereby simplifying a process and reducing the manufacturing cost.

The first buffer layer 111 can be formed on a whole surface of the substrate 110. The first buffer layer 111 can be formed of a single layer, including nitride silicon (SiNx) or oxide silicon (SiOx), or a multilayer thereof. According to an embodiment of the present disclosure, the first buffer layer 111 can be formed of a multilayer where nitride silicon (SiNx) and oxide silicon (SiOx) are alternately formed. For example, the first buffer layer 111 can be formed n+1 number of layers. Here, n can be an even number such as 0, 2, 4, 6, and 8. Therefore, when n=0, the first buffer layer 111 can be formed of a single layer. Also, the first buffer layer 111 can include nitride silicon (SiNx) or oxide silicon (SiOx). When n=2, the first buffer layer 111 can be formed of a triple layer. In a case where the first buffer layer 111 is formed of a triple layer, an upper layer and a lower layer can include oxide silicon (SiOx), and a middle layer disposed between the upper layer and the lower layer can include nitride silicon (SiNx). When n=4, the first buffer layer 111 can be formed of a quintuple layer.

As described above, in a case where the first buffer layer 111 is formed of a multilayer where nitride silicon (SiNx) and oxide silicon (SiOx) are alternately formed, an uppermost layer and a lowermost layer of the first buffer layer 111 can include oxide silicon (SiOx). For example, the first buffer layer 111 including a plurality of layers can include an upper layer contacting a first active layer 270 of the fourth TFT T4, a lower layer contacting the substrate 110, and a middle layer disposed between the upper layer and the lower layer. Also, the upper layer and the lower layer can include oxide silicon (SiOx). Also, the upper layer of the first buffer layer 111 formed of a multilayer can be formed to be thicker than a thickness of each of the lower layer and the middle layer.

The fourth TFT T4 can be disposed on the first buffer layer 111. The fourth TFT T4 can include the first active layer 270, a fourth gate electrode G4, a fourth source electrode S4, and a fourth drain electrode D4. However, the present embodiment is not limited thereto, and the fourth source electrode S4 can be a drain electrode and the fourth drain electrode D4 can be a source electrode.

The first active layer 270 of the fourth TFT T4 can be disposed on the first buffer layer 111. The first active layer 270 can include poly-Si. For example, the first active layer 270 can include low temperature polysilicon (LTPS).

A poly-Si material can have high mobility of 100 $cm^2$/Vs or more, and thus, can have low energy power consumption and good reliability, whereby the poly-Si material can be applied to a multiplexer (MUX) and/or a gate driver for driving elements for driving TFTs for display pixels. Also, in a display apparatus according to an embodiment, the poly-Si material can be applied as a semiconductor pattern of a switching TFT, but is not limited thereto. For example, the poly-Si material can be applied as a semiconductor pattern of a driving TFT. In a display apparatus according to an embodiment of the present disclosure, the fourth TFT T4 including poly-Si can be a driving TFT which is electrically connected to a pixel electrode 711 to transfer a current to the light emitting device 710.

The first active layer 270 can include a fourth channel region 270C, where a channel is formed in driving the fourth TFT T4, and a fourth source region 270S and a fourth drain region 270D each provided at both sides of the fourth channel region 270C. The fourth source region 270S can be a portion of the first active layer 270 connected to the fourth source electrode S4, and the fourth drain region 270D can be a portion of the first active layer 270 connected to the fourth drain electrode D4.

The first gate insulation layer 112 can be disposed on the first active layer 270 of the fourth TFT T4. The first gate insulation layer 112 can be formed of a single layer, including nitride silicon (SiNx) or oxide silicon (SiOx), or a multilayer thereof.

The fourth gate electrode G4 of the fourth TFT T4 can be disposed on the first gate insulation layer 112. The fourth gate electrode G4 can be formed of a single layer or a multilayer, which includes one of molybdenum (Mo), copper (Cu), titanium (Ti), aluminum (Al), chromium (Cr), gold (Au), nickel (Ni), and neodymium (Nd) or an alloy thereof. The fourth gate electrode G4 can overlap the fourth channel region 270C of the first active layer 270 with the first gate insulation layer 112 therebetween.

The first interlayer insulation layer 113 can be disposed on the first gate insulation layer 112 and the fourth gate electrode G4. The first interlayer insulation layer 113 can be formed of a single layer, including nitride silicon (SiNx) or oxide silicon (SiOx), or a multilayer thereof.

The second buffer layer 114 can be formed on the first interlayer insulation layer 113. The second buffer layer 114 can be formed of a single layer, including nitride silicon (SiNx) or oxide silicon (SiOx), or a multilayer thereof.

The second active layer 230 of the second TFT T2 can be disposed on the second buffer layer 114. The second active layer 230 can include an oxide semiconductor pattern including an oxide semiconductor. The second TFT T2 can include the second active layer 230, a second gate electrode G2, a second source electrode S2, and a second drain electrode D2. As another example, the second source electrode S2 can be a drain electrode and the second drain electrode D2 can be a source electrode. The second active layer 230 can include a second channel region 230C, where a channel is formed in driving the second TFT T2, and a second source region 230S and a second drain region 230D each provided at both sides of the second channel region 230C. The second source region 230S can be a portion of the second active layer 230 connected to the second source electrode S2, and the second drain region 230D can be a portion of the second active layer 230 connected to the second drain electrode D2.

An oxide semiconductor material of the second active layer 230 can be a material having a band gap which is greater than that of the poly-Si material, and thus, an electron may not pass over the band gap in an off state, whereby an off-current can be low. Therefore, a TFT including an active layer including an oxide semiconductor can be suitable for a switching TFT where an on time is short and an off time is maintained to be long, but present disclosure is not limited thereto. For example, the TFT can be applied as a driving TFT. Also, an off-current can be low, and thus, a size of an auxiliary capacitor can be reduced, whereby the TFT can be suitable for a high-resolution display apparatus. Referring to FIG. 36, the second TFT T2 including the oxide semiconductor can be a switching TFT which performs a switching function such as on/off control.

The second gate insulation layer 115 can be formed on the second active layer 230 and the second buffer layer 114. The second gate insulation layer 115 can be formed of a single layer, including nitride silicon (SiNx) or oxide silicon (SiOx), or a multilayer thereof.

The second gate electrode G2 can be formed on the second gate insulation layer 115. The second gate electrode G2 can overlap the second channel region 230C of the second active layer 230 with the second gate insulation layer 115 therebetween. Also, the second gate electrode G2 can be formed of a single layer or a multilayer, which includes one of molybdenum (Mo), copper (Cu), titanium (Ti), aluminum (Al), chromium (Cr), gold (Au), nickel (Ni), and neodymium (Nd) or an alloy thereof.

The second interlayer insulation layer 116 can be formed on the second gate electrode G2 and the second gate insulation layer 115. The second interlayer insulation layer 116 can be formed of a single layer, including nitride silicon (SiNx) or oxide silicon (SiOx), or a multilayer thereof.

A contact hole for exposing the first active layer 270 of the fourth TFT T4 can be formed by etching the second interlayer insulation layer 116, the second gate insulation layer 115, the second buffer layer 114, the first interlayer insulation layer 113, and the first gate insulation layer 112. Accordingly, a plurality of contact holes (for example, first and second contact holes) CH1 and CH2 exposing the fourth source region 270S and the fourth drain region 270D of the first active layer 270 can be formed.

Moreover, a contact hole for exposing the second active layer 230 of the second TFT T2 can be formed by etching the second interlayer insulation layer 116 and the second gate insulation layer 115. Accordingly, a plurality of contact holes CH3 and CH4 (for example, third and fourth contact holes) exposing the second source region 230S and the second drain region 230D of the second active layer 230 can be formed.

Moreover, a high temperature thermal treatment process for dehydrogenating the first active layer 270 can be performed through the first contact hole CH1 and the second contact hole CH2. For example, the high temperature thermal treatment process can be performed in a chamber at a high temperature of 350° C. or more for one hour. Subsequently, an ion doping process can be performed for providing conductivity to the second source region 230S and the second drain region 230D of the second active layer 230. A dopant used for the ion doping process can include at least one of boron (B), phosphorous (P), fluorine (F), and hydrogen (H).

The second source electrode S2 and the second drain electrode D2 of the second TFT T2 and the fourth source electrode S4 and the fourth drain electrode D4 of the fourth TFT T4 can be disposed on the second interlayer insulation layer 116.

The fourth source electrode S4 and the fourth drain electrode D4 of the fourth TFT T4 can be connected to the fourth source region 270S and the fourth drain region 270D of the first active layer 270 through the first contact hole CH1 and the second contact hole CH2 each formed in the second interlayer insulation layer 116, the second gate insulation layer 115, the second buffer layer 114, the first interlayer insulation layer 113, and the first gate insulation layer 112.

The second source electrode S2 and the second drain electrode D2 of the second TFT T2 can be connected to the second source region 230S and the second drain region 230D of the second active layer 230 through the third contact hole CH3 and the fourth contact hole CH4 each formed in the second interlayer insulation layer 116 and the second gate insulation layer 115.

The second source electrode S2 and the second drain electrode D2 of the second TFT T2 and the fourth source electrode S4 and the fourth drain electrode D4 of the fourth TFT T4 can include the same material and can be disposed on the same layer. Also, the second source electrode S2 and the second drain electrode D2 of the second TFT T2 and the fourth source electrode S4 and the fourth drain electrode D4 of the fourth TFT T4 can be formed of a single layer or a multilayer, which includes one of molybdenum (Mo), copper (Cu), titanium (Ti), aluminum (Al), chromium (Cr), gold (Au), nickel (Ni), and neodymium (Nd) or an alloy thereof.

A process of forming the third contact hole CH3 and the fourth contact hole CH4 for exposing the second active layer 230, a high temperature thermal treatment process, and an ion doping process of forming the second source region 230S and the second drain region 230D of the second active layer 230 will be described below in more detail with reference to FIGS. 37A to 37E. FIGS. 37A to 37E are cross-sectional views illustrating in more detail a region B where the second TFT T2 is illustrated in FIG. 36.

Figure 37A:
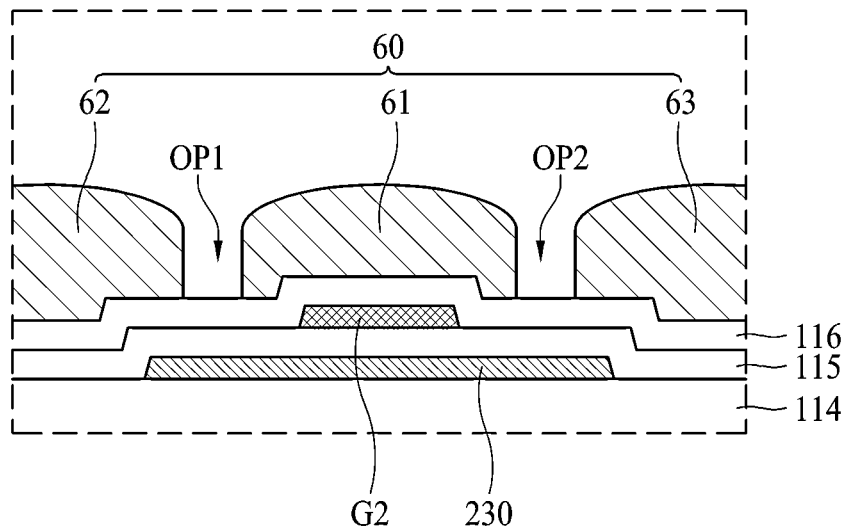
FIGS. 37A to 37E are process views of a method of manufacturing a TFT disposed in a region B of FIG. 36.

Referring to FIG. 37A, a photoresist (PR) pattern 60 can be formed on a second interlayer insulation layer 116, for an etching process. The photoresist pattern 60 can include a second photoresist pattern 62 overlapping a second gate electrode G2, a first photoresist pattern 61 disposed apart from a left surface of the second photoresist pattern 62, and a third photoresist pattern 63 disposed apart from a right surface of the second photoresist pattern 62.

One side surface of the first photoresist pattern 61 and the second photoresist pattern 62 can be disposed apart from each other and can form a first opening portion OP1 which exposes a top surface of the second interlayer insulation layer 116 corresponding to a second source region 230S of a second active layer 230. Also, the other side surface of the first photoresist pattern 61 and the third photoresist pattern 63 can be disposed apart from each other and can form a second opening portion OP2 which exposes a top surface of the second interlayer insulation layer 116 corresponding to a second drain region 230D of the second active layer 230.

Figure 37B:
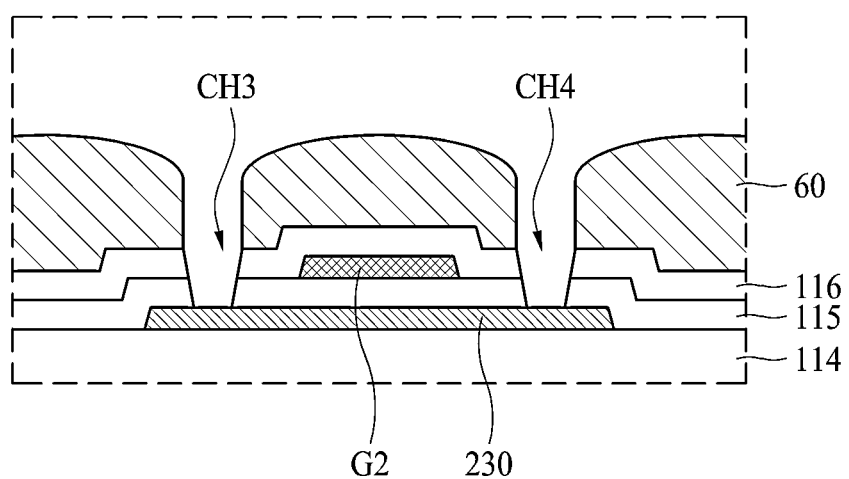

Referring to FIG. 37B, the second interlayer insulation layer 116 exposed through the first opening portion OP1 and the second opening portion OP2 can be removed through an etching process. Also, a second gate insulation layer 115 formed under the second interlayer insulation layer 116 can be removed through the etching process. As described above, an insulation layer corresponding to a region exposed at the first opening portion OP1 and the second opening portion OP2 can be removed by using the photoresist pattern 60 as a mask, and thus, a contact hole can be formed. For example, a third contact hole CH3 exposing the second active layer 230 can be formed by etching the second gate insulation layer 115 and the second interlayer insulation layer 116 corresponding to the first opening portion OP1. Also, a fourth contact hole CH4 exposing the second active layer 230 can be formed by etching the second gate insulation layer 115 and the second interlayer insulation layer 116 corresponding to the second opening portion OP2.

Figure 37C:
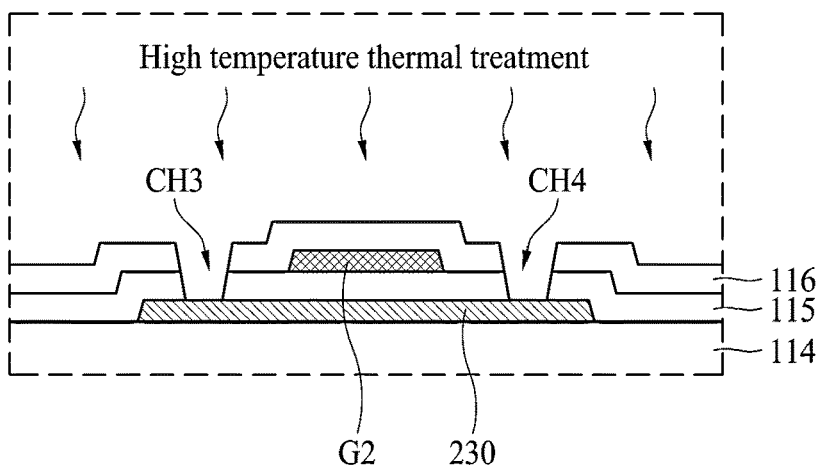

After the third contact hole CH3 and the fourth contact hole CH4 are formed, as illustrated in FIG. 37C, the photoresist pattern 60 can be removed by an ashing process. Also, a high temperature thermal treatment process can be performed at a high temperature of 350° C. or more. Referring to FIG. 36, a high temperature thermal treatment process can be performed for dehydrogenating or crystallizing a first active layer 270.

Figure 37D:
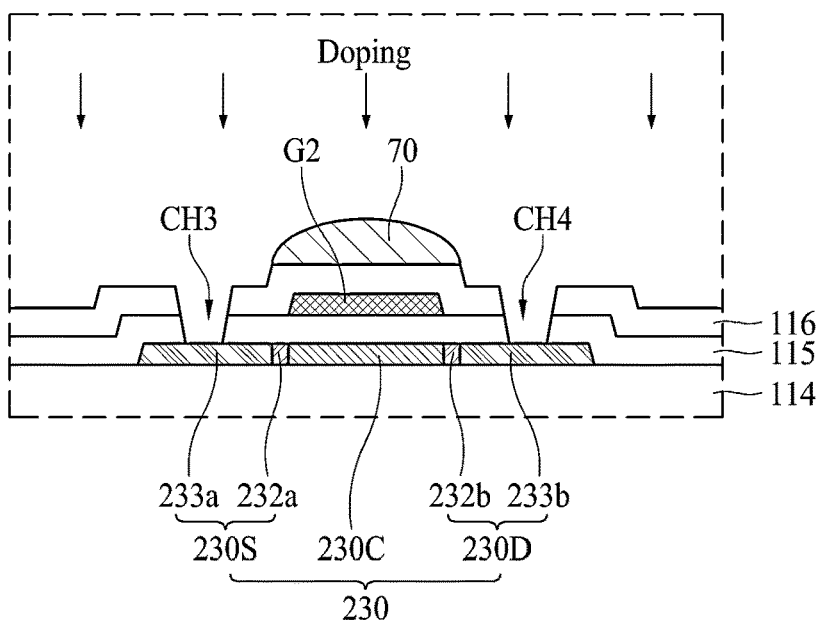

Subsequently, referring to FIG. 37D, a doping mask pattern 70 overlapping a second gate electrode G2 of a second TFT T2 can be formed. The doping mask pattern 70 can be a photoresist pattern including a photoresist. As illustrated in FIG. 37D, a doping process can be performed by using the doping mask pattern 70 as a mask. The doping process can be a doping process using a dopant, and the dopant can include at least one of boron (B), phosphorous (P), fluorine (F), and hydrogen (H). The second active layer 230, which does not overlap the doping mask pattern 70 through doping, can have conductivity. Therefore, the second active layer 230 of the second TFT T2 can include a plurality of conductivity-providing parts 233a and 233b. Also, a second channel region 230C of the second active layer 230 may not be doped. In order to prevent the second channel region 230C from being doped, the doping mask pattern 70 can prevent a dopant from being implanted into the second channel region 230C in a doping process. Accordingly, the doping mask pattern 70 can act as a mask for preventing doping of the second channel region 230C.

Referring to FIG. 37D, with respect to a cross-sectional view, the doping mask pattern 70 can have a width which is greater than that of the second gate electrode G2.

The conductivity-providing parts 233a and 233b, provided with conductivity through the doping process using the dopant, can have a dopant concentration which is higher than that of the second channel region 230C and can have resistivity which is lower than that of the second channel region 230C.

Referring to FIG. 37D, a plurality of offset parts (for example, first and second offset parts) 232a and 232b can be protected by the doping mask pattern 70. Therefore, a dopant can be prevented from being directly implanted into the offset parts 232a and 232b. However, dopants doped on the conductivity-providing parts 233a and 233b can be diffused to the offset parts 232a and 232b. Accordingly, an effect where a dopant is partially doped on the offset parts 232a and 232b can be obtained.

In FIG. 37D, when a width of the second gate electrode G2 is LG and a width of the doping mask pattern 70 protruding from the second gate electrode G2 is Loh, doping can be performed under a condition which satisfies the following Equation 2.

$$LG \times Loh \times 1/\eta 2 \geq 1 \qquad \text{[Equation 2]}$$

$$\text{where } \eta 2 = 0.5 \ \mu m^2.$$

Each of the first offset part 232a and the second offset part 232b can have a width corresponding to a protrusion width Loh. When the width LG of the second gate electrode G2 and the width Loh of the doping mask pattern 70 protruding from the second gate electrode G2 satisfies Equation 2, the offset parts 232a and 232b satisfying Equation 2 can be formed.

According to another embodiment of the present disclosure, in Equation 2, $\eta 2=1.5 \ \mu m^2$. Alternatively, $\eta 2$ can satisfy a relationship of "$0.5 \ \mu m^2 \leq \eta 2 \leq 1.5 \ \mu m^2$".

A concentration of dopants can be highest in the plurality of conductivity-providing parts 233a and 233b. The plurality of offset parts 232a and 232b can have a dopant concentration which is lower than that of each of the conductivity-providing parts 233a and 233b. There can be a possibility that a small amount of dopants are diffused to the second channel region 230C which are not directly doped with a dopant. The second channel region 230C can hardly include a dopant, or can have a very low concentration of dopants.

Therefore, as illustrated in FIG. 37D, based on a doping process using the doping mask pattern 70, the second active layer 230 of the second TFT T2 can include a second channel region 230C having a relatively low dopant concentration, the conductivity-providing parts 233a and 233b having a relatively high dopant concentration, and the offset parts 232a and 232b having a concentration which is lower than that of each of the conductivity-providing parts 233a and 233b and is higher than that of the second channel region 230C. Also, the first conductivity-providing part 233a and the first offset part 232a can be the second source region 230S. Also, the second conductivity-providing part 233b and the second offset part 232b can be the second drain region 230D.

The offset parts 232a and 232b can have a concentration gradient of dopants increasing in a direction from the second channel region 230C to the conductivity-providing parts 233a and 233b. For example, the first offset part 232a can have a concentration gradient of dopants increasing in a direction from the second channel region 230C to the first conductivity-providing part 233a, and the second offset part 232b can have a concentration gradient of dopants increasing in a direction from the second channel region 230C to the second conductivity-providing part 233b.

A resistivity of each of the offset parts 232a and 232b can be lower than that of the second channel region 230C and can be higher than that of each of the conductivity-providing parts 233a and 233b. The offset parts 232a and 232b can have a resistivity gradient decreasing in a direction from the second channel region 230C to the conductivity-providing parts 233a and 233b.

Therefore, the offset parts 232a and 232b can perform an electrical buffering function between the conductivity-providing parts 233a and 233b and the second channel region 230C which is not provided with conductivity.

In detail, since the offset parts 232a and 232b are disposed between the second channel region 230C and the conductivity-providing parts 233a and 233b, a leakage current can be prevented from flowing between the second channel region 230C and the conductivity-providing parts 233a and 233b in a turn-off (OFF) state of the second TFT T2. As described above, the offset parts 232a and 232b can prevent a leakage current from occurring in the second TFT T2 when the second TFT T2 is in a turn-off (OFF) state.

Moreover, as illustrated in FIG. 37D, the second interlayer insulation layer 116 can be formed on the second gate electrode G2, and then, a doping process of doping a dopant can be performed. Therefore, the dopant can be doped on the second interlayer insulation layer 116 and the second gate insulation layer 115. Therefore, a region of the second interlayer insulation layer 116 and the second gate insulation layer 115 overlapping the conductivity-providing parts 233a and 233b of the second active layer 230 can include the dopant. The dopant can include at least one of boron (B), phosphorous (P), fluorine (F), and hydrogen (H). Therefore, the second interlayer insulation layer 116 and the second gate insulation layer 115 can include at least one of boron (B), phosphorous (P), fluorine (F), and hydrogen (H). Also, a dopant can be doped on a region of the second interlayer insulation layer 116 overlapping the second gate electrode G2. Therefore, the region of the second interlayer insulation layer 116 overlapping the second gate electrode G2 can include at least one of boron (B), phosphorous (P), fluorine (F), and hydrogen (H). Also, the region of the second interlayer insulation layer 116 overlapping the second gate electrode G2 may not include a dopant material.

In a region overlapping the conductivity-providing parts 233a and 233b, a dopant concentration of each of the conductivity-providing parts 233a and 233b can be higher than that of the second gate insulation layer 150, that of the second interlayer insulation layer 116, and that of the second buffer layer 114. Also, in a region overlapping the conductivity-providing parts 233a and 233b, a dopant concentration of the second buffer layer 114 can be higher than that of each of the conductivity-providing parts 233a and 233b, that of the second gate insulation layer 150, and that of the second interlayer insulation layer 116.

A dopant concentration of each of the second interlayer insulation layer 116, the second gate insulation layer 115, the conductivity-providing parts 233a and 233b, and the second buffer layer 114 can be adjusted by adjusting an acceleration voltage applied to a dopant in a doping process.

When the acceleration voltage applied to the dopant increases to sufficiently dope a dopant on the conductivity-providing parts 233a and 233b, the dopant can be doped on the conductivity-providing parts 233a and 233b, and moreover, can be doped on the second buffer layer 114. When the acceleration voltage for doping increases up to an undesired level, the second active layer 230 can be damaged. Accordingly, according to an embodiment of the present disclosure, the acceleration voltage can be adjusted so that a dopant concentration in the conductivity-providing parts 233a and 233b is the maximum or a dopant concentration in an upper portion of the second buffer layer 114 is the maximum.

According to an embodiment of the present disclosure, when a dopant concentration in the conductivity-providing parts 233a and 233b is the maximum or a dopant concentration in the second buffer layer 114 is the maximum, doping can be efficiently performed on the conductivity-providing parts 233a and 233b. Also, when a dopant concentration in the conductivity-providing parts 233a and 233b is the maximum or a dopant concentration in the second buffer layer 114 is the maximum, it can be considered that the second TFT T2 operates efficiently.

According to an embodiment of the present disclosure, as a process of doping a dopant is performed after a process of forming a contact hole for exposing the first active layer 270 and the second active layer 230 and a high temperature thermal treatment process performed through the contact hole, a dopant can be doped on the second interlayer insulation layer 116 and the second gate insulation layer 115 formed on the second active layer 230. Therefore, when the dopant is detected from the second interlayer insulation layer 116 and the second gate insulation layer 115 formed on the second active layer 230, it can be seen that a process of doping the dopant has been performed after the high temperature thermal treatment process.

Figure 37E:
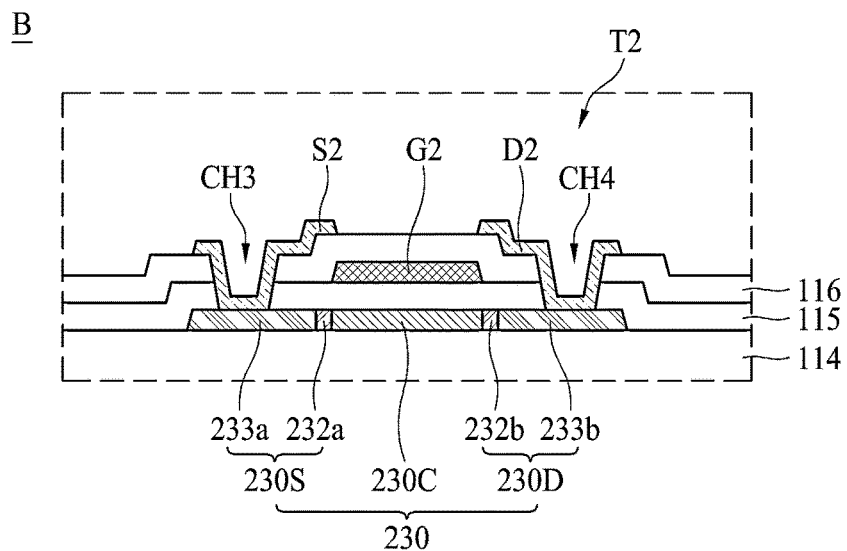

Referring to FIG. 37E, a second source electrode S2 and a second drain electrode D2 can be formed on the second interlayer insulation layer 116 and can be connected to the second active layer 230 through a plurality of contact holes CH3 and CH4 formed in the second interlayer insulation layer 116 and the second gate insulation layer 115.

Referring to FIG. 36, a passivation layer 117 can be formed on a fourth source electrode S4 and a fourth drain electrode D4 of a fourth TFT T4 and the second source electrode S2 and the second drain electrode D2 of the second TFT T2.

A contact hole for exposing the fourth source electrode S4 of the fourth TFT T4 can be formed in the passivation layer 117. However, the present embodiment is not limited thereto, and a contact hole for exposing the fourth drain electrode D4 of the fourth TFT T4 can be formed in the passivation layer 117. The passivation layer 117 can be an organic material layer. For example, a passivation layer 117 can be formed of a single layer or a double layer, which includes an organic material such as acryl resin, epoxy resin, phenolic resin, polyamide resin, or polyimide resin. As another example, the passivation layer 117 can be formed of a single layer, including an inorganic material such as nitride silicon (SiNx) or oxide silicon (SiOx), or a multilayer thereof. Alternatively, the passivation layer 117 can be formed of a multilayer including an inorganic material and an organic material.

A pixel electrode 711 of a light emitting device 710 can be disposed on the passivation layer 117. The pixel electrode 711 can be electrically connected to the fourth TFT T4 through a contact hole formed in the passivation layer 117. The fourth TFT T4 connected to the pixel electrode 711 can be a driving TFT which transfers a current to the light emitting device 710.

The pixel electrode 711 can be formed in a multi-layer structure which includes a transparent conductive layer and an opaque conductive layer having high reflection efficiency. The transparent conductive layer can include a material, having a high work function value, such as indium tin oxide (ITO) or indium zinc oxide (IZO). Also, the opaque conductive layer can be formed in a single-layer structure or a multi-layer structure, which includes aluminum (Al), silver (Ag), copper (Cu), lead (Pb), molybdenum (Mo), a titanium (Ti), or an alloy thereof. For example, the pixel electrode 711 can include a transparent conductive layer, an opaque conductive layer, and a transparent conductive layer, which are sequentially formed. However, the present embodiment is not limited thereto, and for example, the pixel electrode 711 can include a transparent conductive layer and an opaque conductive layer, which are sequentially formed.

The display apparatus according to an embodiment of the present disclosure can be a top emission display apparatus, and thus, the pixel electrode 711 can be an anode electrode. When the display apparatus is a bottom emission type, the pixel electrode 711 disposed on the passivation layer 117 can be a cathode electrode.

A bank layer 750 can be disposed on the pixel electrode 711 and the passivation layer 117. An opening portion for exposing the pixel electrode 711 can be formed in the bank layer 750. The bank layer 750 can define an emission area of the display apparatus, and thus, can be referred to as a pixel defining layer. A spacer can be further disposed on the bank layer 750. Also, a light emitting layer 712 of the light emitting device 710 can be further disposed on the pixel electrode 711.

The light emitting layer 712 can include a hole layer (HL), a light emitting material layer (EML), and an electron layer (EL), which are formed on the pixel electrode 711 in order or in reverse order.

Furthermore, the light emitting layer 712 can include a first light emitting layer and a second light emitting layer with a charge generating layer (CGL) therebetween. In this case, one light emitting material layer of the first light emitting layer and the second light emitting layer can emit blue light, and the other light emitting material layer of the first light emitting layer and the second light emitting layer can emit yellow-green light, thereby emitting white light through the first light emitting layer and the second light emitting layer. The white light emitted through the first light emitting layer and the second light emitting layer can be incident on a color filter disposed on the light emitting layer to implement a color image. As another example, without a separate color filter, each light emitting layer can emit color light corresponding to each subpixel to implement a color image. For example, a light emitting layer of a red (R) subpixel can emit red light, a light emitting layer of a green (G) subpixel can emit green light, and a light emitting layer of a blue (B) subpixel can emit blue light.

Referring to FIG. 36, a common electrode 713 of the light emitting device 710 can be further disposed on the light emitting layer 712. The common electrode 713 can overlap the pixel electrode 711 with the light emitting layer 712 therebetween. In the display apparatus according to an embodiment of the present disclosure, the common electrode 713 can be a cathode electrode.

An encapsulation member for preventing permeation of water can be further disposed on the common electrode 713. The encapsulation member can include a first encapsulation layer, a second encapsulation layer, and a third encapsulation layer. The second encapsulation layer can include a material which differs from that of each of the first encapsulation layer and the third encapsulation layer. For example, each of the first encapsulation layer and the third encapsulation layer can be an inorganic insulation layer including an inorganic insulating material, and the second encapsulation layer can be an organic insulation layer including an organic insulating material. The first encapsulation layer of the encapsulation member can be disposed on the common electrode 713. Also, the second encapsulation layer can be disposed on the first encapsulation layer. Also, the third encapsulation layer can be disposed on the second encapsulation layer.

The first encapsulation layer and the third encapsulation layer of the encapsulation member can include an inorganic material such as nitride silicon (SiNx) or oxide silicon (SiOx). The second encapsulation layer of the encapsulation member can be formed of a single layer or a double layer, which includes an organic material such as acryl resin, epoxy resin, phenolic resin, polyamide resin, or polyimide resin.

Figure 38:
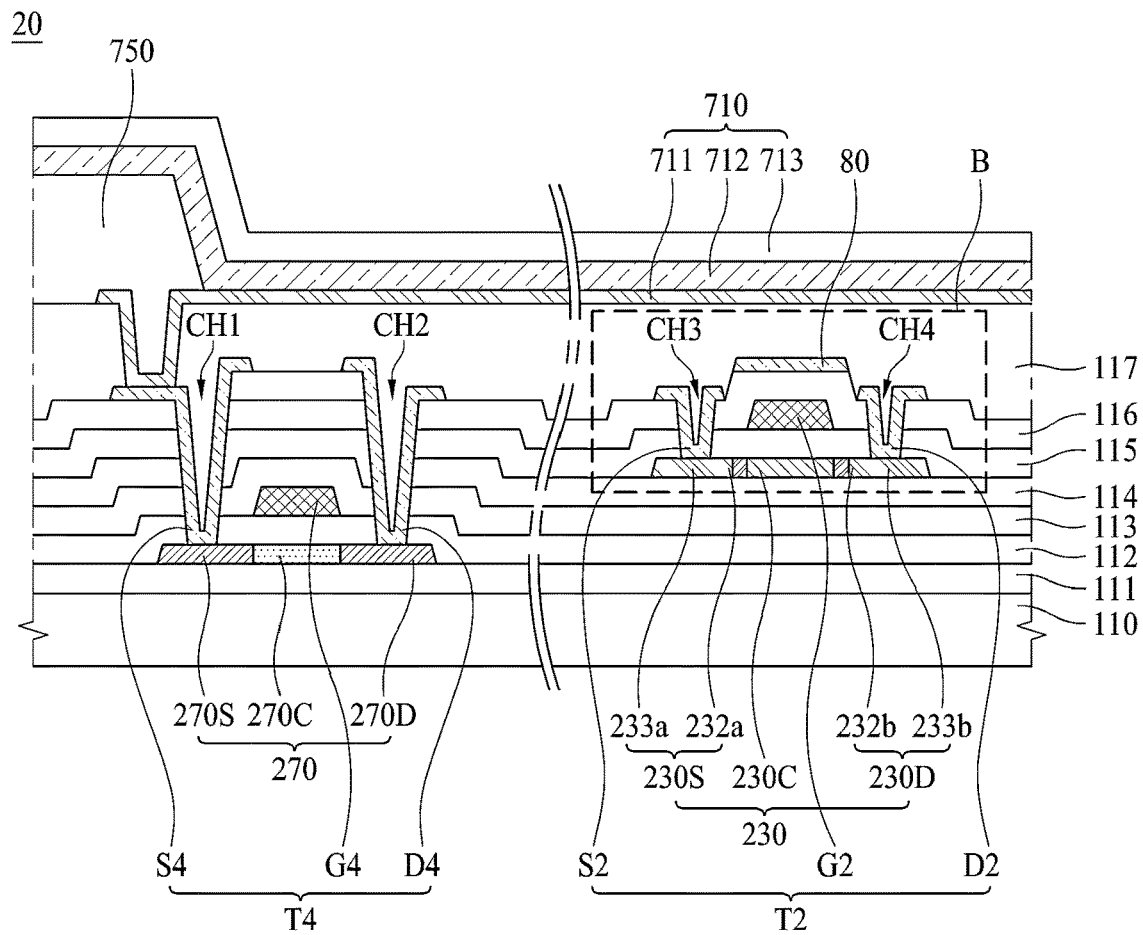
FIG. 38 is a cross-sectional view of a display apparatus according to another embodiment of the present disclosure.
Figure 39A:
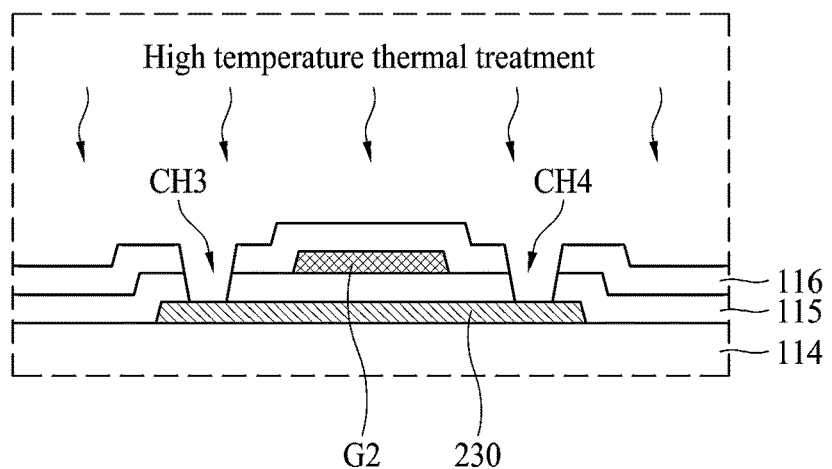
FIGS. 39A and 39B are process views of a method of manufacturing a TFT disposed in a region B of FIG. 38.
Figure 39B:
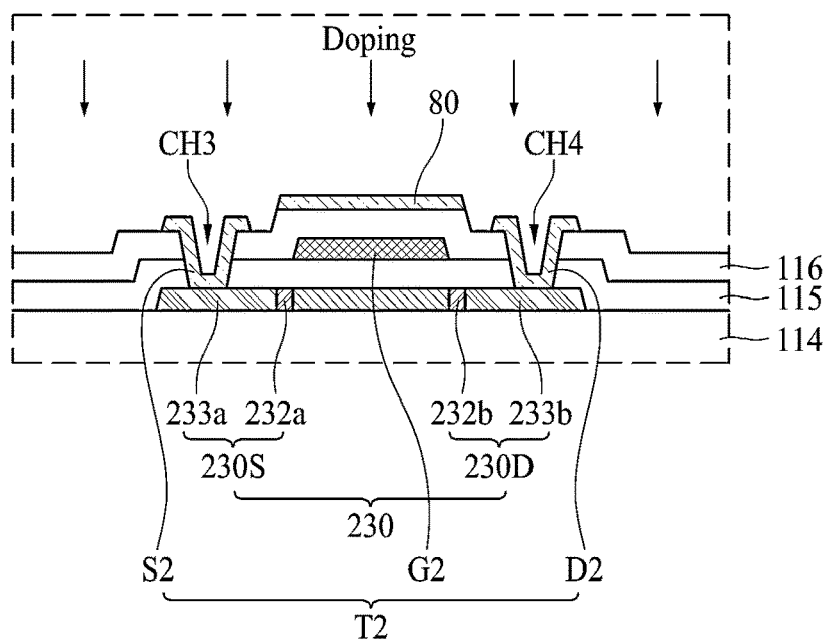

FIGS. 38, 39A, and 39B are a cross-sectional view and process views of a display apparatus according to another embodiment of the present disclosure. Hereinafter, descriptions which are the same as or similar to the descriptions given above with reference to FIGS. 36 and 37A to 37C are omitted or will be briefly given below. For example, descriptions of a substrate 110, a first buffer layer 111, a first gate insulation layer 112, a first interlayer insulation layer 113, a second buffer layer 114, a second gate insulation layer 115, a second interlayer insulation layer 116, a passivation layer 117, a bank layer 750, a light emitting device 710, an encapsulation member, and a fourth TFT T4 can be substantially the same as the above descriptions. Therefore, a repetitive description of a configuration of FIG. 38 which is substantially the same as FIG. 36 is omitted or will be briefly given below. Also, a description of a process which is substantially the same as FIGS. 37A to 37C is omitted or will be briefly given below.

Referring to FIG. 38, a display apparatus 20 according to another embodiment of the present disclosure can include a substrate 110, a first buffer layer 111, a first gate insulation layer 112, a first interlayer insulation layer 113, a second buffer layer 114, a second gate insulation layer 115, a second interlayer insulation layer 116, a passivation layer 117, a bank layer 750, a light emitting device 710, an encapsulation member, a fourth TFT T4, a second TFT T2, and a metal pattern 80.

The metal pattern 80 can be disposed on the second interlayer insulation layer 116 and can overlap a second gate electrode G2.

Referring to FIGS. 38 and 39A, a third contact hole CH3 and a fourth contact hole CH4 each exposing the second active layer 230 can be formed in the second gate insulation layer 115 and the second interlayer insulation layer 116. A dry etching process can be performed for forming the third contact hole CH3 and the fourth contact hole CH4 in the second gate insulation layer 115 and the second interlayer insulation layer 116. Also, a region of the second active layer 230 exposed by the contact holes CH3 and CH4 can have conductivity through the dry etching process of forming the third contact hole CH3 and the fourth contact hole CH4.

Moreover, as in FIG. 38, a first contact hole CH1 and a second contact hole CH2 each exposing the first active layer 270 can be formed by etching the second interlayer insulation layer 116, the second gate insulation layer 115, the second buffer layer 114, the first interlayer insulation layer 113, and the first gate insulation layer 112. Also, after the first to fourth contact holes CH1 to CH4 are formed, a high temperature thermal treatment process for dehydrogenating or crystallizing a first active layer 270 can be performed at a high temperature of 350° C. or more. Also, a conductivity-provided region of a second active layer 230 provided with conductivity through a dry etching process can be partially diffused to both sides thereof through a high temperature thermal treatment process.

After a thermal treatment process, a fourth source electrode S4, a fourth drain electrode D4, a second source electrode S2, a second drain electrode D2, and the metal pattern 80 can be formed.

Referring to FIG. 39B, the second source electrode S2 and the second drain electrode D2 can be connected to the second active layer 230 through the contact holes CH3 and CH4 formed in the second interlayer insulation layer 116 and the second gate insulation layer 115. The second source electrode S2 can be connected to a second source region 230S of the second active layer 230 through the third contact hole CH3. Also, the second drain electrode D2 can be connected to a second drain region 230D of the second active layer 230 through the fourth contact hole CH4. Also, the metal pattern 80 can be disposed on the second interlayer insulation layer 116 and can overlap the second gate electrode G2. Also, with respect to a cross-sectional view, the metal pattern 80 can have a width which is greater than that of the second gate electrode G2. With respect to a plan view, the metal pattern 80 can have an area which is greater than that of the second gate electrode G2. For example, the second gate electrode G2 can be disposed in a region defined by the metal pattern 80.

As illustrated in FIG. 39B, a doping process using a dopant can be performed. A dopant may not be doped on a second channel region 230C due to the metal pattern 80. As a result, the second channel region 230C can maintain a semiconductor characteristic.

A plurality of conductivity-providing parts 233a and 233b, provided with conductivity through a doping process using a dopant, can have a dopant concentration which is higher than that of the second channel region 230C and can have resistivity which is lower than that of the second channel region 230C.

Referring to FIG. 39B, a plurality of offset parts (for example, first and second offset parts) 232a and 232b can be protected by the metal pattern 80. Therefore, a dopant can be prevented from being directly implanted into the offset parts 232a and 232b. However, dopants doped on the conductivity-providing parts 233a and 233b can be diffused to the offset parts 232a and 232b. Accordingly, an effect where a dopant is partially doped on the offset parts 232a and 232b can be obtained.

In FIG. 39B, when a width of the second gate electrode G2 is LG and a width of the metal pattern 80 protruding from the second gate electrode G2 is Loh, doping can be performed under a condition which satisfies the following Equation 2.

$$LG \times Loh \times 1/\eta2 \geq 1 \qquad \text{[Equation 2]}$$

where $\eta2 = 0.5 \ \mu m^2$.

Each of the first offset part 232a and the second offset part 232b can have a width corresponding to a protrusion width Loh. When the width LG of the second gate electrode G2 and the protrusion width Loh satisfy Equation 2, the offset parts 232a and 232b satisfying Equation 2 can be formed.

According to another embodiment of the present disclosure, in Equation 2, $\eta2=1.5 \ \mu m^2$. Alternatively, $\eta2$ can satisfy a relationship of "$0.5 \ \mu m^2 \leq \eta2 \leq 1.5 \ \mu m^2$".

A concentration of dopants can be highest in the plurality of conductivity-providing parts 233a and 233b. The plurality of offset parts 232a and 232b can have a dopant concentration which is lower than that of each of the conductivity-providing parts 233a and 233b. There can be a possibility that a small amount of dopants are diffused to the second channel region 230C which are not directly doped with a dopant. The second channel region 230C can hardly include a dopant, or can have a very low concentration of dopants.

The offset parts 232a and 232b can have a concentration gradient of dopants increasing in a direction from the second channel region 230C to the conductivity-providing parts 233a and 233b. For example, the first offset part 232a can have a concentration gradient of dopants increasing in a direction from the second channel region 230C to the first conductivity-providing part 233a, and the second offset part 232b can have a concentration gradient of dopants increasing in a direction from the second channel region 230C to the second conductivity-providing part 233b.

Moreover, a resistivity of each of the offset parts 232a and 232b can be lower than that of the second channel region 230C and can be higher than that of each of the conductivity-providing parts 233a and 233b. The offset parts 232a and 232b can have a resistivity gradient decreasing in a direction from the second channel region 230C to the conductivity-providing parts 233a and 233b.

Therefore, the offset parts 232a and 232b can perform an electrical buffering function between the conductivity-providing parts 233a and 233b and the second channel region 230C which is not provided with conductivity.

In detail, since the offset parts 232a and 232b are disposed between the second channel region 230C and the conductivity-providing parts 233a and 233b, a leakage current can be prevented from flowing between the second channel region 230C and the conductivity-providing parts 233a and 233b in a turn-off (OFF) state of the second TFT T2. As described above, the offset parts 232a and 232b can prevent a leakage current from occurring in the second TFT T2 when the second TFT T2 is in a turn-off (OFF) state.

When the second TFT T2 is turned on based on a gate voltage applied to the second gate electrode G2, the electrical conductivity of the second channel region 230C can increase, but the electrical conductivity of each of the offset parts 232a and 232b which are not largely affected by an electric field generated in the second gate electrode G2 may not largely increase. Therefore, when the second TFT T2 is turned on, the conductivity of each of the offset parts 232a and 232b can be lower than that of the second channel region 230C and that of each of the conductivity-providing parts 233a and 233b. Accordingly, the occurrence of a shift of a threshold voltage of the second TFT T2 can be prevented by the offset parts 232a and 232b. Accordingly, the electrical stability of the second TFT T2 can be enhanced.

Moreover, as illustrated in FIG. 39B, the second interlayer insulation layer 116 can be formed on the second gate electrode G2, and then, a doping process of doping a dopant can be performed. Therefore, the dopant can be doped on the second interlayer insulation layer 116 and the second gate insulation layer 115. Therefore, a region of the second interlayer insulation layer 116 and the second gate insulation layer 115 overlapping the conductivity-providing parts 233a and 233b of the second active layer 230 can include the dopant. The dopant can include at least one of boron (B), phosphorous (P), fluorine (F), and hydrogen (H). Therefore, the second interlayer insulation layer 116 and the second gate insulation layer 115 can include at least one of boron (B), phosphorous (P), fluorine (F), and hydrogen (H). Also, a region of the second gate insulation layer 115 overlapping the second gate electrode G2 may not include a dopant material. Also, a region of the second interlayer insulation layer 116 overlapping the metal pattern 80 and the second gate electrode G2 may not include a dopant material.

According to an embodiment of the present disclosure, as a process of doping a dopant is performed after a process of forming a contact hole for exposing the first active layer 270 and the second active layer 230 and a high temperature thermal treatment process performed through the contact hole, a dopant can be doped on the second interlayer insulation layer 116 and the second gate insulation layer 115 formed on the second active layer 230. Therefore, when the dopant is detected from the second interlayer insulation layer 116 and the second gate insulation layer 115 formed on the second active layer 230, it can be seen that a process of doping the dopant has been performed after the high temperature thermal treatment process.

A thin film transistor according to an embodiment of the present disclosure includes an active layer on a substrate, a gate electrode disposed apart from the active layer to at least partially overlap the active layer, and a gate insulation layer between the active layer and the gate electrode, wherein the gate insulation layer covers a whole top surface of the active layer facing the gate electrode, the active layer includes a channel part overlapping the gate electrode, a conductivity-providing part which does not overlap the gate electrode, and an offset part between the channel part and the conductivity-providing part, the offset part does not overlap the gate electrode, and the conductivity-providing part is doped with a dopant.

According to an embodiment of the present disclosure, when a width of the channel part is L1 and a width of the offset part is L2, the thin film transistor satisfies the following Equation 1, $$L1 \times L2 \times 1/\eta 1 \geq 1 \quad \text{[Equation 1]}$$

where $\eta 1 = 0.5 \ \mu m^2$.

According to an embodiment of the present disclosure, the active layer includes an oxide semiconductor material.

According to an embodiment of the present disclosure, the dopant includes at least one of boron (B), phosphorous (P), fluorine (F), and hydrogen (H).

According to an embodiment of the present disclosure, the offset part has a concentration gradient of dopants increasing in a direction from the channel part to the conductivity-providing part.

According to an embodiment of the present disclosure, a resistivity of the offset part is lower than a resistivity of the channel part and is higher than a resistivity of the conductivity-providing part.

According to an embodiment of the present disclosure, a width of the offset part is 0.25 μm or more.

According to an embodiment of the present disclosure, a width of the channel part is 2 μm or more.

According to an embodiment of the present disclosure, the thin film transistor further includes a buffer layer disposed between the substrate and the active layer, wherein the dopant is doped on the buffer layer.

According to an embodiment of the present disclosure, in a region overlapping the conductivity-providing part, a dopant concentration of the conductivity-providing part is higher than a dopant concentration of the gate insulation layer and a dopant concentration of the buffer layer.

According to an embodiment of the present disclosure, in a region overlapping the conductivity-providing part, a dopant concentration of the buffer layer is higher than a dopant concentration of the conductivity-providing part and a dopant concentration of the gate insulation layer.

According to an embodiment of the present disclosure, the active layer includes a first oxide semiconductor layer on the substrate and a second oxide semiconductor layer on the first oxide semiconductor layer.

According to an embodiment of the present disclosure, the thin film transistor further includes a source electrode and a drain electrode disposed apart from each other and connected to the active layer.

According to an embodiment of the present disclosure, the source electrode and the drain electrode are disposed on the same layer as the gate electrode and include the same material as a material of the gate electrode.

A thin film transistor substrate according to another embodiment of the present disclosure includes a base substrate and a first thin film transistor and a second thin film transistor on the base substrate, wherein the first thin film transistor includes a first active layer on the base substrate and a first gate electrode disposed apart from the first active layer to at least partially overlap the first active layer, the second thin film transistor includes a second active layer on the base substrate, a gate electrode disposed apart from the second active layer to at least partially overlap the second active layer, and a gate insulation layer between the second active layer and the second gate electrode, wherein the gate insulation layer covers a whole top surface of the second active layer facing the second gate electrode, the second active layer includes a channel part overlapping the second gate electrode, a conductivity-providing part which does not overlap the second gate electrode, and an offset part between the channel part and the conductivity-providing part, wherein the offset part does not overlap the second gate electrode, the conductivity-providing part is doped with a dopant, and the first active layer and the second active layer are disposed on different layers.

According to another embodiment of the present disclosure, the first active layer is a silicon semiconductor layer, and the second active layer is an oxide semiconductor layer.

A method of manufacturing a thin film transistor according to another embodiment of the present disclosure includes forming an active layer on a substrate, forming a gate insulation layer on the active layer, forming a gate electrode on the gate insulation layer to at least partially overlap the active layer, and doping a dopant on the active layer, wherein the gate insulation layer covers a whole top surface of the active layer facing the gate electrode, the forming of the gate electrode includes forming a gate-electrode material layer on the gate insulation layer, forming a photoresist pattern on the gate-electrode material layer, and etching the gate-electrode material layer by using the photoresist pattern as a mask, wherein an area of the photoresist pattern is greater than an area of the gate electrode, the gate electrode is disposed in a region defined by the photoresist pattern in a plan view, and the doping of the dopant on the active layer uses the photoresist pattern as a mask.

According to another embodiment of the present disclosure, the dopant includes at least one of boron (B), phosphorous (P), fluorine (F), and hydrogen (H).

According to another embodiment of the present disclosure, when a width of the gate electrode is LG and a width of the photoresist pattern protruding from the gate electrode is Loh, the method satisfies the following Equation 2, $$LG \times Loh \times 1/\eta2 \geq 1 \quad \text{[Equation 2]}$$

where $\eta2 = 0.5 \ \mu m^2$.

A display apparatus according to another embodiment of the present disclosure includes a substrate, a pixel driving circuit on the substrate, and a light emitting device connected to the pixel driving circuit, wherein the pixel driving circuit includes a thin film transistor, the thin film transistor includes an active layer on the substrate, a gate electrode disposed apart from the active layer to at least partially overlap the active layer, and a gate insulation layer between the active layer and the gate electrode, wherein the gate insulation layer covers a whole top surface of the active layer facing the gate electrode, the active layer includes a channel part overlapping the gate electrode, a conductivity-providing part which does not overlap the gate electrode, and an offset part between the channel part and the conductivity-providing part, wherein the offset part does not overlap the gate electrode, and the conductivity-providing part is doped with a dopant.

A display apparatus according to another embodiment of the present disclosure includes a first thin film transistor including a first active layer including polycrystalline silicon, a first gate electrode overlapping the first active layer with a first gate insulation layer therebetween, and a first source electrode and a first drain electrode each connected to the first active layer, a first interlayer insulation layer disposed on the first gate electrode, a second thin film transistor including a second active layer including an oxide semiconductor, a second gate electrode overlapping the second active layer with a second gate insulation layer therebetween, and a second source electrode and a second drain electrode each connected to the second active layer, and a second interlayer insulation layer disposed on the first gate electrode, the second gate electrode, and the second gate insulation layer, wherein the second gate insulation layer and the second interlayer insulation layer include a dopant for doping the second active layer.

According to another embodiment of the present disclosure, the dopant doped on the second active layer includes at least one of boron (B), phosphorous (P), fluorine (F), and hydrogen (H).

According to another embodiment of the present disclosure, the second active layer includes a second channel region overlapping the second gate electrode, a second source region disposed at one side of the second channel region and connected to the second source electrode, and a second drain region disposed at the other side of the second channel region and connected to the second drain electrode.

According to another embodiment of the present disclosure, the second source region includes a first conductivity-providing part disposed at the one side of the second channel region and a first offset part disposed between the first conductivity-providing part and the one side of the second channel region, and the second drain region includes a second conductivity-providing part disposed at the other side of the second channel region and a second offset part disposed between the second conductivity-providing part and the other side of the second channel region.

According to another embodiment of the present disclosure, the first conductivity-providing part, the second conductivity-providing part, the first offset part, and the second offset part include the dopant.

According to another embodiment of the present disclosure, a concentration of the dopant of each of the first conductivity-providing part and the second conductivity-providing part is higher than a concentration of the dopant of each of the first offset part and the second offset part.

According to an embodiment of the present disclosure, an offset part can be formed between a conductivity-providing part and a channel part of a semiconductor layer through a doping process using a photoresist pattern as a mask without patterning a gate insulation layer, and based on the offset part, an effective channel width of a thin film transistor can be secured.

According to another embodiment of the present disclosure, since an active layer of a thin film transistor includes an offset part, the electrical stability of a channel layer and a conductivity-providing region can be secured, and an influence of an insulation layer on the active layer can be minimized, thereby securing the driving stability of the thin film transistor.

According to another embodiment of the present disclosure, an effective channel width of a thin film transistor can be easy to secure, and the thin film transistor can be manufactured to have a small size. The thin film transistor can be integrated and provided into various electronic products, and by using the thin film transistor, a high-resolution display apparatus can be manufactured.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
    a first thin film transistor including a first active layer including polycrystalline silicon, a first gate electrode overlapping the first active layer with a first gate insulation layer therebetween, and a first source electrode and a first drain electrode each connected to the first active layer;
    a first interlayer insulation layer disposed on the first gate electrode;
    a second thin film transistor including a second active layer including an oxide semiconductor, a second gate electrode overlapping the second active layer with a second gate insulation layer therebetween, and a second source electrode and a second drain electrode each connected to the second active layer; and
    a second interlayer insulation layer disposed on the first gate electrode, the second gate electrode, and the second gate insulation layer,
    wherein the second gate insulation layer and the second interlayer insulation layer comprise a dopant for doping the second active layer, wherein the second active layer comprises:
- a second channel region overlapping the second gate electrode;
- a second source region disposed at one side of the second channel region and connected to the second source electrode; and
- a second drain region disposed at another side of the second channel region and connected to the second source electrode, wherein the second source region comprises a first conductivity-providing part disposed at the one side of the second channel region and a first offset part disposed between the first conductivity-providing part and the one side of the second channel region, wherein the second drain region comprises a second conductivity-providing part disposed at the other side of the second channel region and a second offset part disposed between the second conductivity-providing part and the other side of the second channel region, wherein the first conductivity-providing part, the second conductivity-providing part, the first offset part, and the second offset part comprise the dopant, wherein the first offset part has a concentration gradient of the dopant linearly increasing in a direction from the second channel region to the first conductivity-providing part, and wherein the second offset part has a concentration gradient of the dopant linearly increasing in a direction from the second channel region to the second conductivity-providing part.

2. The display apparatus of claim 1, wherein the dopant doped on the second active layer comprises at least one of boron (B), phosphorous (P), fluorine (F), and hydrogen (H).

3. The display apparatus of claim 1, wherein a concentration of the dopant of each of the first conductivity-providing part and the second conductivity-providing part is higher than a concentration of the dopant of each of the first offset part and the second offset part.

4. The display apparatus of claim 1, wherein the first gate insulation layer covers an entire top surface of the first active layer facing the first gate electrode, and the second gate insulation layer covers an entire top surface of the second active layer facing the second gate electrode.

5. The display apparatus of claim 1, further comprising a substrate,
- wherein the first thin film transistor and the second thin film transistor is disposed on the substrate,
- the first active layer and the first gate electrode are disposed between the substrate and the first interlayer insulation layer, and
- the first interlayer insulation layer is disposed between the second active layer and the first gate electrode.

6. The display apparatus of claim 1, wherein when a width of the second channel is L1 and a width of the first offset part is L2, the second thin film transistor satisfies Equation 1 below:

$$L1 \times L2 \times 1/\eta 1 \geq 1 \qquad [\text{Equation 1}]$$

where $\eta 1$ satisfies a relationship of $0.5\ \mu m^2 \leq \eta 1 \leq 1.5\ \mu m^2$.

7. The display apparatus of claim 1, wherein a resistivity of the first offset part is lower than a resistivity of the second channel region and is higher than a resistivity of the first conductivity-providing part when the second thin film transistor is turned off, and
- a resistivity of the second offset part is lower than the resistivity of the second channel region and is higher than a resistivity of the second conductivity-providing part when the second thin film transistor is turned off.

8. The display apparatus of claim 1, wherein a resistivity of the first offset part is higher than a resistivity of the second channel region and is higher than a resistivity of the first conductivity-providing part when the second thin film transistor is turned on, and
- a resistivity of the second offset part is higher than the resistivity of the second channel region and is higher than a resistivity of the second conductivity-providing part when the second thin film transistor is turned on.

9. The display apparatus of claim 1, further comprising a second buffer layer disposed between the first interlayer insulation layer and the second active layer,
- wherein the dopant is doped on the second buffer layer.

10. The display apparatus of claim 9, wherein, in a region overlapping the first conductivity-providing part, a dopant concentration of the first conductivity-providing part is higher than a dopant concentration of the second gate insulation layer and a dopant concentration of the second buffer layer, and
- in a region overlapping the second conductivity-providing part, a dopant concentration of the second conductivity-providing part is higher than the dopant concentration of the second gate insulation layer and the dopant concentration of the second buffer layer.

11. The display apparatus of claim 9, wherein, in a region overlapping the first conductivity-providing part, a dopant concentration of the second buffer layer is higher than a dopant concentration of the first conductivity-providing part and a dopant concentration of the second gate insulation layer, and
- in a region overlapping the second conductivity-providing part, the dopant concentration of the second buffer layer is higher than a dopant concentration of the second conductivity-providing part and the dopant concentration of the second gate insulation layer.

12. The display apparatus of claim 1, wherein the second active layer further comprises:
- a first oxide semiconductor layer on the first interlayer insulation layer; and
- a second oxide semiconductor layer on the first oxide semiconductor layer.

13. The display apparatus of claim 1, wherein the first source electrode, the first drain electrode, the second source electrode and the second drain electrode are disposed on a same layer.

* * * * *